United States Patent [19]

Hazani

[11] Patent Number: 5,278,785
[45] Date of Patent: Jan. 11, 1994

[54] NON-VOLATILE MEMORY CIRCUITS AND ARCHITECTURE

[76] Inventor: Emanuel Hazani, 1210 Sesame Dr., Sunnyvale, Calif. 94087

[21] Appl. No.: 713,995

[22] Filed: Jun. 12, 1991

Related U.S. Application Data

[63] Continuation-in-part of Ser. No. 377,311, Jul. 10, 1989, Pat. No. 5,099,297, which is a continuation-in-part of Ser. No. 152,702, Feb. 5, 1988, Pat. No. 4,845,538.

[51] Int. Cl.⁵ .................... G11C 11/34; G11C 8/00
[52] U.S. Cl. .................... 365/182; 365/185; 365/189.01; 365/189.03; 365/230.04
[58] Field of Search ........... 365/45, 185, 182, 189.01, 365/189.02, 189.05, 230.01, 230.06, 230.08, 230.02, 230.04

[56] References Cited

U.S. PATENT DOCUMENTS

| | | | |
|---|---|---|---|
| 3,934,233 | 1/1976 | Fisher et al. | 340/173 |
| 4,156,286 | 5/1979 | Connors et al. | 365/45 |
| 4,247,920 | 1/1981 | Springer et al. | 365/230.04 |
| 4,314,362 | 2/1982 | Klaas et al. | 365/227 |
| 4,368,988 | 11/1983 | Tahara et al. | 365/45 |
| 4,571,708 | 2/1986 | Davis | 365/203 |
| 4,627,027 | 12/1986 | Rai et al. | 365/45 |
| 4,651,305 | 3/1987 | Davis | 365/205 |
| 4,811,301 | 3/1989 | Houston | 365/203 |
| 4,845,538 | 7/1989 | Hazani | 365/185 |
| 4,849,937 | 7/1989 | Yoshimoto | 365/230.04 |
| 4,890,259 | 12/1989 | Simko | 365/45 |
| 5,016,216 | 5/1991 | Ali | 365/185 |

FOREIGN PATENT DOCUMENTS

| | | | |
|---|---|---|---|
| 57-55597 | 4/1982 | Japan | 365/45 |
| 57-92494 | 6/1982 | Japan | 365/45 |
| 2-238322 | 9/1990 | Japan | 365/45 |
| 2-238500 | 9/1990 | Japan | 365/45 |

OTHER PUBLICATIONS

"A 20nS 1Mb CMOS Burst Mode EPROM", by B. Ashmore, et al., Digest of ISSCC 1989, Feb. 15, pp. 40-41.

"The EEPROM as an Analog Memory Device", by T. C. Ong, et al., IEEE Trans. on Electron Devices, vol. 36, No. 9, Sep. 1989.

"An 8-Bit Two-Step Flash A/D Converter for Video Applications", by A. Cremonesi, et al., IEEE Digest of CICC-1989, pp. 63.1-63.4.

"A Complete Single Supply CMOS 12 Bit DAC", by S. Hisano et al, IEEE Digest of ICCC-1989, pp. 6.6.6-6.6.4.

*Primary Examiner*—Rolf Hille
*Assistant Examiner*—Steven Loke

[57] ABSTRACT

The invention enables random read and write operations into cells in an array that contains staggered source or drain connections from the memory cells in a given column. It includes a decoding scheme wherein the memory chip has a row address bit which is used for the row decoding also participating in the bit line decoding process. The invention comprises only one row decoder providing the required voltages to the read word lines during reading, programming and page and flash erase operations. The invention expands the feature of the reduction in programming time of non-volatile memories from a single cell to the entire row of cells that program using hot electrons. The invention reduces the diffusion isolation spacing between bit-lines by using shield transistors. A current mirror with multiple branches is used as part of a power switch to control the supply of 5 or 12 volts to various circuit block of the EEPROM chip. According to another aspect of the invention the asymmetry in programming of split gate EEPROM is used to reverse bias the cell so that a plurality of digital bits that were programmed in the cell by an integrated D/A converter according to a curve, are read out by an A/D converter with large voltage difference between logical states.

27 Claims, 36 Drawing Sheets

| ROW ADDRESS | | | CONTROL INPUTS OF CROSS-POINT SWITCH. | |
|---|---|---|---|---|
| MSB | | LSB | | |
| QX1 | QX2 | QX3 | QXLSB | QXLSBb |
| 0 | 0 | 0 | 1 | |
| 0 | 0 | 1 | | 1 |
| 0 | 1 | 0 | 1 | |
| 0 | 1 | 1 | | 1 |
| 1 | 0 | 0 | 1 | |
| 1 | 0 | 1 | | 1 |
| 1 | 1 | 0 | 1 | |
| 1 | 1 | 1 | | 1 |

QXLSB = QX3b
QXLSBb = QX3

| SHARED PREDRCODER INPUT ROW ADDRESS | | SHARED PREDRCODER'S OUTPUT. (LIKE BUS-58 OF FIGURE-1) | | | |
|---|---|---|---|---|---|
| MSB | LSB | | | | |
| XA7 | XA12 | R1 | R2 | R3 | R4 |
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |
FIGURE 18
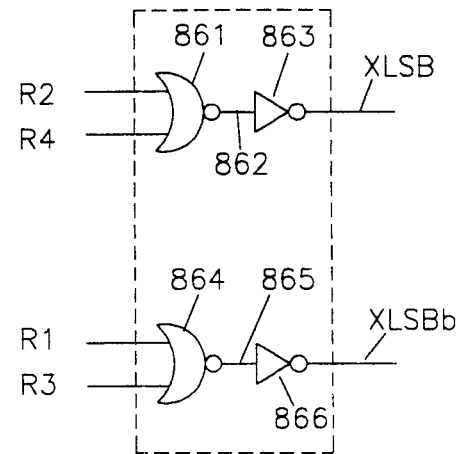
FIGURE 19
| SHARED PREDRCODER INPUT ROW ADDRESS | | | SHARED PREDECODER'S OUTPUT. | | | | | | | |
|---|---|---|---|---|---|---|---|---|---|---|
| MSB | | LSB | | | | | | | | |
| KX1 | KX2 | KX3 | KR0 | KR1 | KR2 | KR3 | KR4 | KR5 | KR6 | KR7 |
| 0 | 0 | 0 | 1 | | | | | | | |
| 0 | 0 | 1 | | 1 | | | | | | |
| 0 | 1 | 0 | | | 1 | | | | | |
| 0 | 1 | 1 | | | | 1 | | | | |
| 1 | 0 | 0 | | | | | 1 | | | |
| 1 | 0 | 1 | | | | | | 1 | | |
| 1 | 1 | 0 | | | | | | | 1 | |
| 1 | 1 | 1 | | | | | | | | 1 |
FIGURE 20
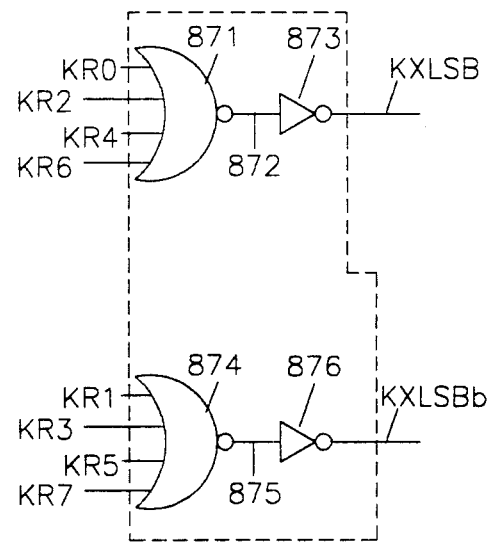
FIGURE 21

| CEb | OEb | PGMb | MODE |
|---|---|---|---|
| L | L | H | READ |
| L | H | L | PROGRAM (WRITE) |
| H | H | ONE PULSE | PAGE ERASE |
| H | H | TWO PULSES | FLASH ERASE |

NON-VOLATILE MEMORY CIRCUITS AND ARCHITECTURE

This is a continuation-in-part of U.S. patent application Ser. No. 07/377,311, filed Jul. 10, 1989 now U.S. Pat. No. 5,099,297 which is a continuation-in-part of U.S. patent application Ser. No. 07/152,702, filed Feb. 5, 1988, now U.S. Pat. No. 4,845,538.

BACKGROUND OF THE INVENTION

The present invention relates generally to nonvolatile semiconductor read/write memory and, more particularly, relates to improved electrically erasable programmable read only memory (EEPROM) architecture, logic and circuits operable for storing and reading digital and analog information.

DESCRIPTION OF THE RELEVANT ART

The invention of U.S. Pat. No. 4,845,538 issued to Emanuel Hazani (the '538 patent) the same applicant of the present invention, describes a memory that uses bidirectional electron tunneling between two polysilicon layers to perform programming and erasure. U.S. Pat. No. 4,763,299 also issued to E. Hazani (the '299 patent) describes an invention that uses hot electron from the substrate to program and polysilicon to polysilicon electron tunneling to erase.

Although the EEPROM cell and process described in the invention of the '299 patent programs by using hot electrons from the substrate, it has a very high programming efficiency due to the use of two control gates that couple the programming voltage to the floating gate. Programming time of a cell of this embodiment—in the range of one micro second (1 uS) per memory cell—is much shorter than that of a electron tunneling-program mechanism based memory cells. This programming efficiency also reduces the programming drain-source current to about one microampere (1 uA) per memory cell, which is much lower in comparison to other UVEPROM and EEPROM cells that program by using hot electrons from the substrate.

A description of an implementation of an embodiment of the '299 patent was disclosed in an article by R. Kazerounian et al. entitled "A 5 volt High Density Poly-Poly Erase Flash EPROM Cell", published in International Electron Device Meeting's Technical Digest, Dec. 11-14, 1988.

The short programming time of the cell of '299 patent together with the low programming current becomes extremely advantageous in applications such as IC-Card Camera in which the digitally processed image is rapidly stored in a semiconductor memory. It is estimated that the IC-Card Camera will take over the multibillion dollars photographic market place in the near future. In this camera the EEPROM chip or Static RAM chips act as the equivalent of the chemical film of the dark chamber camera. However SRAM chips, using at least four transistors in each memory cell, are much more expensive to make then an EEPROM chip using the one transistor cell of the '299 patent. On the other hand existing EEPROM chips are too slow to program or require too much power to program, which loads the battery operated camera, or have very large memory cell size, which makes them too expensive for use in this application.

In prior EEPROM art the programming speed of plurality of cells was reduced to the programming time of one cell by means of column-latch flip-flop circuit, which was assigned to each column and in return to every cell along a word-line. Once the data in the column-latches was true, it was programmed into the plurality of cells along a selected word-line. This task was simple due to several reasons. First, the memory cell was large enough to allow layout of the column-latch in the geometrical pitch of the memory cell. The second reason was the fact that the memory array architecture was simple, such that the whole array had a fixed ground line or at most the ground line of several regions of the array were switched for power saving reasons. Since these bit-lines were not associated with each other, a designer of this prior art architecture had to deal with the simple task of controlling the one bit-line per cell for writing into its column-latch or reading from it into the EEPROM cell. By reading data simultaneously from plurality of column latches into their corresponding EEPROM cells it is possible to program these plurality of EEPROM cells in a time period that take to program only one cell.

Another prior art architecture for decoding column addresses called virtual-ground is described in U.S. Pat. Nos. 3,934,233, 4,314,362, 4,571,708 and 4,811,301. In this architecture the memory cells along a given column are connected between two bit lines. The first bit-line connects all the source terminals of the cells along the given column to a ground potential when the given column is selected and to another potential when the given column is non-selected, hence the name virtual ground. This first virtual ground bit-line is shared with an adjacent column to the left of the given column which also has the source terminals of all its cells connected to the first bit-line. The given column also has a second bit-line to its right which is connected to the input of a sense amplifier when selected and to a second potential when non-selected, thus the name sense bit-line. The sense bit line is connected to all the drain terminals of the cells along the given column. The sense bit line is shared with an adjacent column to the right of the given column which also has the source terminals of all its cells connected to the second bit-line.

The virtual ground architecture can not be used with an array such as the one disclosed in U.S. Pat. No. 4,763,299, because in the '299 patent a given column has some cells connected with their drain terminal to the first bit-line and other cells on the same given column have their source terminal connected to the same first bit-line.

This method for reading and programming requires improvements due to the fact that the new inventions of the '299 patent, the '538 patent and its continuations-in-part reduce the memory cell size for the same photolithography and physical geometries used by prior art in production. The new small memory cell size does not allow physical layout of one column latch per one cell pitch, so an improved technique is needed. Also the small cell sizes of the '299 patent was achieved partly due to the use of a multi purpose shared bit-line (below referred to as MUPS-BL) array architecture, which does not allow control of one bit-line without taking an adjacent bit-line to ground thereby requiring a novel technique to bring the programming speed of plurality of memory cells close to that of one memory cell.

It is an object of the invention to develop an architecture and circuitry that enables random read and write operations into cells in an array that contains staggered source or drain connections from the cells in a given column to the bit-lines such as the architecture of FIG. 2 of U.S. Pat. No. 4,763,299 that takes advantage of the asymmetry characteristics of the split-gate memory cell that includes a floating-gate (referred to below as split-gate memory cell or transistor), such as asymmetry in physical geometry, asymmetry between drain-source and source-drain current values for the same voltage biasing and asymmetry to electric field orientation in the programming preference of the cell.

U.S. Pat. Nos. 4,763,299 and 4,845,538 issued to E. Hazani also describe the voltage bias requirements of the array word-lines of the corresponding memory cell arrays. The voltage bias of a selected word line during programming is of the first polarity and is different from the voltage bias of all non-selected word lines of the same array who have voltage bias of a second polarity. This bias condition reverses during erasure where in the same array the selected word line is biased with the second polarity voltage and the non-selected word lines are biased with the first polarity voltage.

It is another object of the present invention to have only one row decoder providing the required voltages to the word lines during reading, erasure and programming. Having one row decoder reduces the number of transistors on a chip and thus further reduces the cost of the chip.

It is another object of this invention to expand the feature of the reduction in programming time of non-volatile memories using multi-purpose shared bit-line (MUPS-BL) architectures from the single memory cell to the entire row of cells, thus to the entire memory array.

Another prior art problem that is related to memory arrays in general and to ROM, EPROM and EEPROM arrays in particular is the large geometrical spacing between diffusion bit-lines that is required in order to prevent current leakage between bit-line. The size of this spacing is particularly critical around regions along the bit-lines where a metal to diffusion contact is made and thereby widening the bit-line diffusion to the point where the size of the metal contact together with its diffusion overlap area and the isolation spacing to the diffusion region of an adjacent bit-line dictates the geometrical pitch of a column of the memory array. Because the column pitch is dictated by the diffusion contact and its isolation region, any improvement toward reduction of memory cell size below the column pitch is not going to produce smaller array size in the direction of the above mentioned critical pitch.

It is therefore another object of this invention to reduce the diffusion isolation spacing between bit-lines of memory arrays in general and in ROM, EPROM and EEPROM arrays in particular in order to increase bit density per chip area.

Because the memory cell of the '299 patent has no disturb modes when the inter-polysilicon oxides have thickness of less than 400 Angstroms and the operating voltages are under 12 volts, it is desired to develop circuits and architecture that will enable to store more than one digital bit in a physical space of one memory cell. Doing so will reduce the cost of semiconductor read/write memories and bring it to be below the cost of magnetic memories and even magneto-optical memories, while at the same time providing faster read and write cycle times and improve reliability because no moving mechanical part are used.

Therefor it is an object of the invention to make non-volatile semiconductor memory operable to store more than one digital bit per memory cell.

These objects and other object features, aspects and advantages of the present invention will become more apparent from the following detailed description of the present invention when taken in conjunction with the accompanying drawings.

SUMMARY OF THE INVENTION

One aspect of this invention comprises an architecture and circuitry that enables random read and write operations into cells in an array that contains staggered source or drain connections from the memory cells in a given column to the bit-lines such as the architecture of FIG. 2 of U.S. Pat. No. 4,763,299 issued to the applicant of the present invention. The architecture includes a decoding scheme wherein the EEPROM chip has a row address bit which is used for the row decoding also participating in the column decoding process. This is accomplished by having the row address bit controlling a cross-point-switch that is inserted into the data path from the selected column to the sense amplifier and to ground. During some period of the programming cycle the cross-point-switch routes data from the data pad to the column latch through the selected column.

Another aspect of present invention comprises only one row decoder providing the required voltages to the read word lines during reading and programming as well as during the operation of page erase in which data along only one memory row are erased and during the operation of flash erase in which data along plurality of memory rows are erased. Having only one row decoder reduces the number of transistors on the chip and thus further reduces the cost of the manufacturing the chip.

Another aspect of this invention expands the feature of the reduction in programming time of non-volatile memories from a single memory cell to the entire row of cells, despite the fact that the physical space that is required for the layout of one column latch is wider than the width of one column. This is accomplished by the assignment of one column latch circuit to a plurality of columns. In one embodiment the column latch circuit is assigned to two columns and it is connected to an even or to an odd column by control of the least-significant-bit of the column address on one side of the array and in coordination with the outputs of the column address decoder on the opposite side of the array. In order to avoid excessive power consumption by the numerous column latch circuits that may occur by use of NMOS depletion load transistors in an attempt to reduce layout area and on the other hand in order to avoid the use of complex fabrication processes such as thin film PMOS transistors such as those used in advanced Static RAMs and yet to be able to benefit from the low power consumption of a full CMOS circuit a new fully static D-flipflop latch circuit is introduced which uses very small layout area.

Another aspect of this invention reduces the diffusion isolation spacing between bit-lines of memory arrays in general and in ROM, EPROM and EEPROM arrays in particular in order to increase bit density per chip area. This is accomplished by forming a shield transistor in locations along the columns where the isolation spacing is most dominant in determining the width of the column and connecting the gate of the shield transistor to a voltage lower that the voltage of the bit lines so that shield transistor is always turned off thereby avoiding current leakage between adjacent bit lines.

According to another aspect of the invention a current mirror is used as part of a power switch to control the supply of 5 volts during read operations and 12 volts during programming or erase operations to various circuit block of the EEPROM chip. The current mirror is designed to have plurality of branches that supply power to separate circuit blocks. One reason for using the new circuit is in order to prevent disabling of most of the decoding circuits of the EEPROM chip during testing if a short circuit or other ohmic shorts bring the voltage of power supply lines to ground. In one embodiment the power supply to the column latch circuits which indirectly supply high voltage to the bit-lines of the array of memory cells is connected to a separate branch of the current mirror so as to prevents any ohmic shorts within the array from lowering the power supply voltage and causing malfunction of the periphery circuits of the EEPROM chip. As known in the art redundancy techniques may be used to open the particular ohmic short and enable the use of the remainder of the memory array.

According to another aspect of the invention the assymetry in programming of split gate EEPROM is used to bias the memory cell during the read operation so that the drain is grounded and the source of the memory cell is connected to the sensed bit line, thereby a plurality of digital bits that were stored during programming are read out by an Analog-to-Digital converter with larger voltage difference between logical states than possible if the source is connected to ground and the drain is connected to the sensed bit line.

BRIEF DESCRIPTION OF THE DRAWINGS

FIG. 18 is a truth table for generating the control signals of the cross-point switch of FIG. 1 from the predecoded signals at the output of the shared row predecoder of FIG. 12.

FIG. 19 is the circuit for producing the control signals for the cross-point switch of FIG. 1 from the output of the shared predecoder.

FIG. 20 is a truth table for generating the control signals of a cross-point switch from the predecoded signals at the output of a three-to-eight shared row predecoder.

FIG. 21 is the circuit for producing the control signals for a cross-point switch from a predecoded signals at the output of a three-to-eight shared row predecoder.

DETAILED DESCRIPTION OF THE INVENTION

The present invention will be described in great detail, with reference to particular preferred embodiments. However, it will be recognized by those skilled in the art that the present invention provides a fundamental innovation in the art of non-volatile memories, and its scope is therefore to be construed broadly. The present invention can be modified and varied in a tremendous variety of ways, and its scope is expressly not limited except as specified by the claims. The various embodiments discussed are merely illustrative and not limiting.

Figure 1:
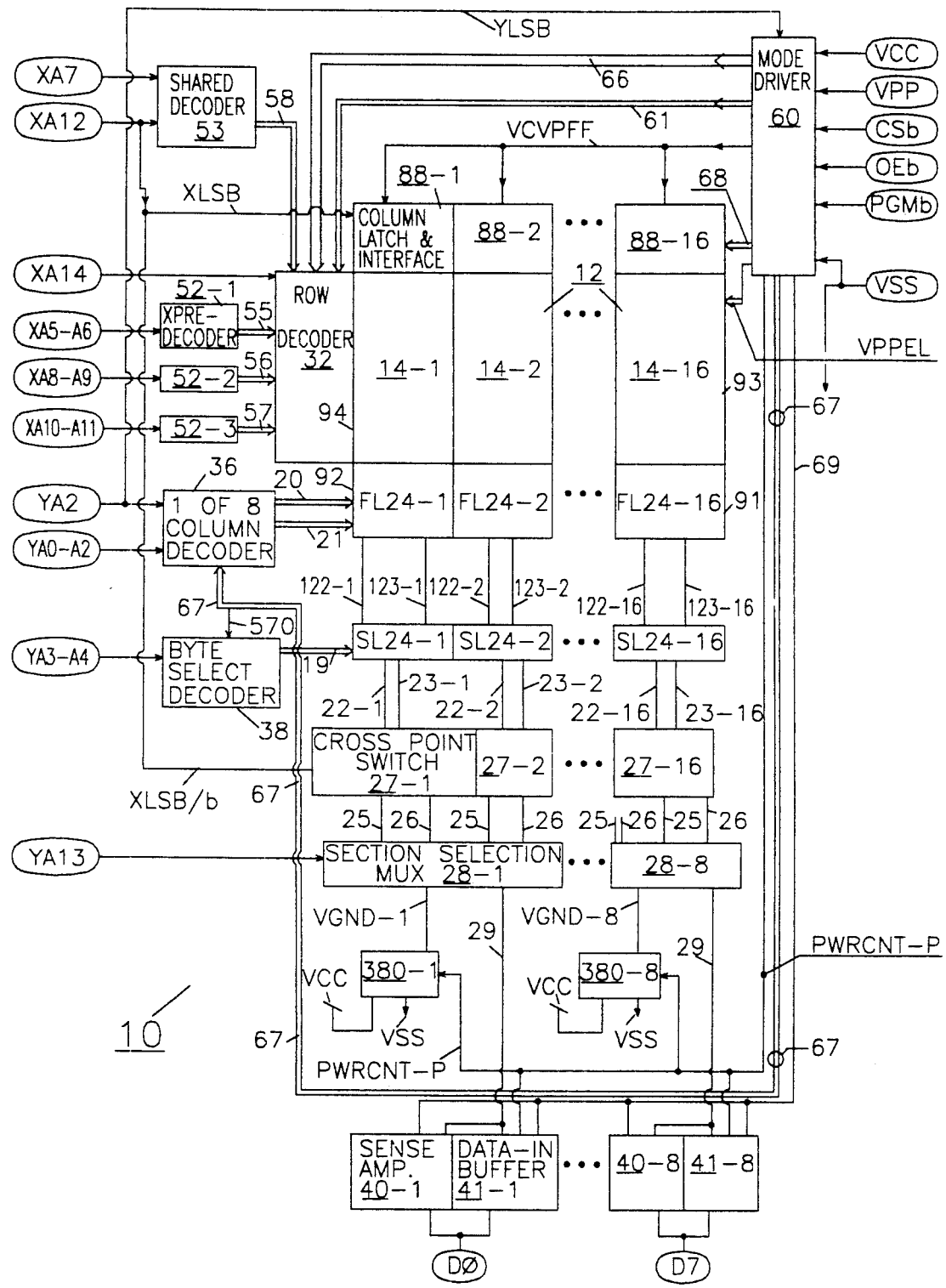
FIG. 1 is a block diagram of the EEPROM memory chip of the present invention.

FIG. 1 depicts the overall functional block diagram of one embodiment of the EEPROM chip according to present invention.

Referring now to FIG. 1, the EEPROM chip is indicated generally at 10. The EEPROM chip 10 comprises an array of memory cells indicated generally at 12. EEPROM chip 10 of this embodiment stores 262,144 bits, which are organized as 32,768 words of 8 bits each. Array 12 is divided into a plurality of array sections 14. Array section 14 is a matrix of rows and columns of memory cells as will be detailed in reference to FIG. 2. In this embodiment array 12 comprises 512 rows of 64 interleaved words of 8 bits each, and 512 columns and is divided into sixteen array sections 14. Each array section 14 contains 512 rows and 32 columns.

Figure 2:
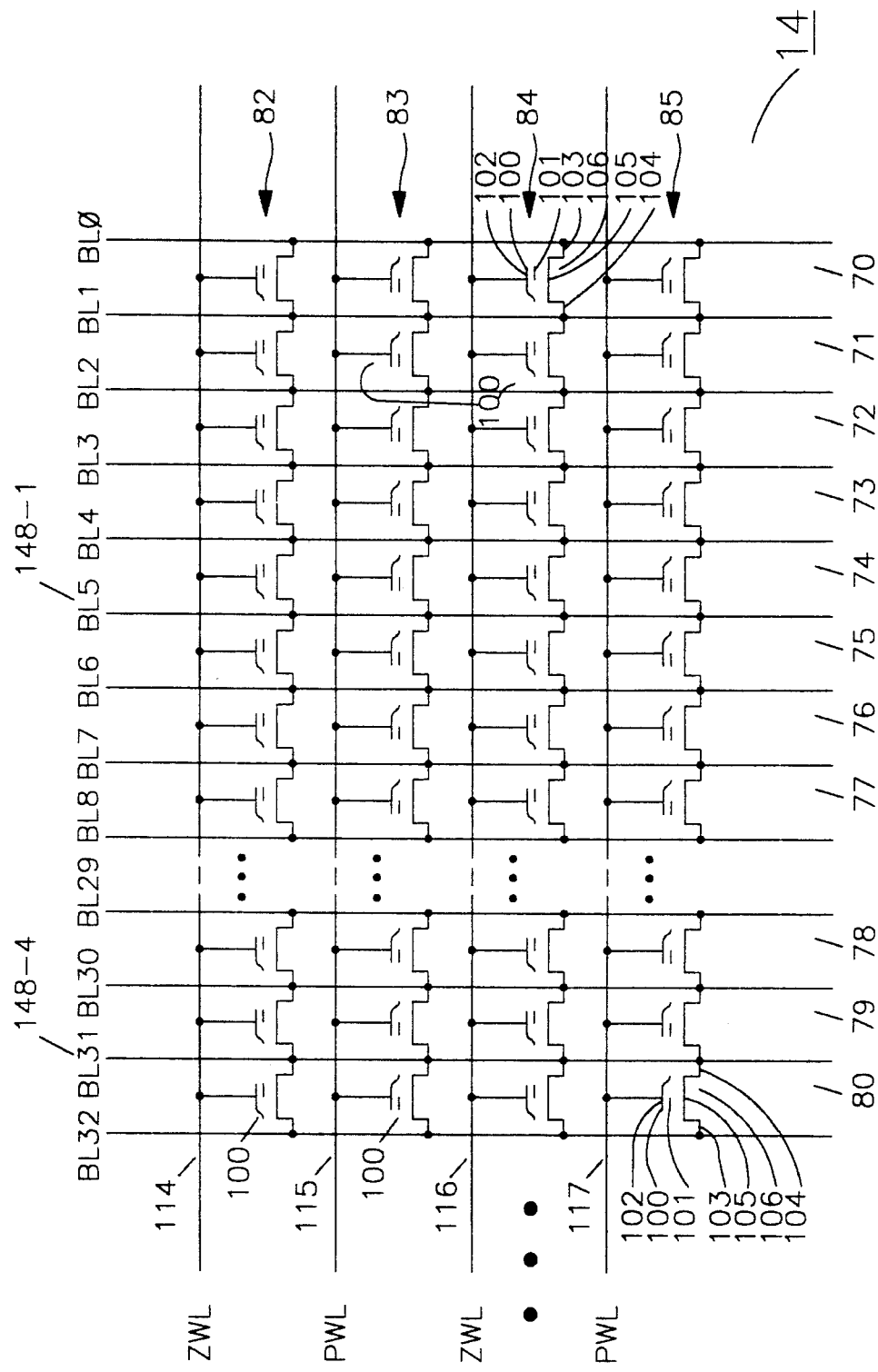
FIG. 2 is a circuit diagram of a section of an EPROM array with staggered floating gate along the bit-lines.

Each array section 14 is divided into four array section segments 148 of eight columns each, as will be shown in FIG. 2. Each column comprises memory cells whose drain connects to a bit-line, which is shared with a first adjacent column and whose source connects to another bit-line, which is shared with a second adjacent column. Furthermore, as will be shown below and as was disclosed in the '299 patent, a given bit-line may be a drain for a memory cell of an even numbered word-line, but the same bit-line will be a source for another memory cell of the same column, but of an odd numbered word-line.

A novel bit decoding scheme connects the drain of a selected memory cell to a sense amplifier to read the data, when the same decoding scheme simultaneously connects the source of the selected cell to ground or other reference voltage. This can be done to any memory cell in the memory array regardless of its orientation. The bit decoding scheme consists of bit-line select multiplexers (muxes) 24, a cross-point switch 27 and an array section select mux 28. Bit-line select mux 24, as will be detailed below, consist of two levels of multiplexing (muxing). The first muxing level FL24, actually consists of two interleaved muxes, one for even numbered bit-lines and another for odd numbered bit-lines. The control of first level muxing FL24 in bit-line mux 24 comes from one-of-eight column decoder 36, which outputs signals on two separate busses, bus 20 and bus 21. Bus 20 drives the gates of the transistors of first level muxing FL24 in mux 24 that decode the even numbered bit-lines and bus 21 drives transistors of first level muxing FL24 in mux 24 that decode the odd numbered bit-lines. The one-of-eight column decoder 36 receives three column address inputs A0, A1 and A2 of the EEPROM chip 10. One-of-four byte-select decoder 38 receives two column address inputs A3 and A4, and outputs the control signal on bus 19 to the input of second level muxing in mux SL24. Each of the second level muxing SL24 in mux 24 consists of two interleaved four-to-one muxes, as will be detailed below.

After the second level of multiplexing SL24, the signal of a selected even numbered bit-line will pass by line 22 to cross-point-switch 27, and the signal of a selected odd numbered bit-line will pass to the same cross-point switch 27 by line 23.

Cross-point switch 27 is a two-by-two cross-point-switch and is controlled by the least significant row address A12. This scheme of decoding a memory cell's column location by a row address is meant to coordinate the location of a drain of a memory transistor cell with a given word-line, and will be detailed below. Also cross-point-switch 27 has an important roll in the method of reducing the programming time of plurality of cells along a word-line to that of one memory cell with this shared bit-line architecture. Cross-point-switch 27 routes either line 22 or line 23 to a sense line 26 or to a ground line 25 or vice versa.

Section selection mux 28 consists of two two-to-one multiplexers and each is controlled by column address line A13. Section selection mux 28 routes the sense line 26 of one-of-two array sections 14 to a sense amp 40, and at the same time routes ground line 25 of one-of-two array sections 14 to the low-voltage ground line VGND that connects to a Low Voltage mux 380 (LV mux 380).

LV mux 380 routes line VGND to the VSS line during read and erase operation and during the beginning of the programming cycle. But, LV mux 380 routes line VGND to the VCC line during the end of the programming cycle when the actual writing of the memory cells occurs.

Each column-latches block 88 contains sixteen latches 830 (shown later in FIG. 22) per section 14, which is half the number of columns per section 14. This allows the physical layout of a column latch 28 of a very stable circuit in the limited geometrical pitch of two memory cell columns. Each column latch 830 serves two columns in the programming operation as will be explained below. The column-latch block 88 also include sixteen latch-to-row-coordinator (LTRC) circuits 831 that are shown later in FIG. 24 and which are the latch output to the drain of the memory cell in the array according to its orientation relative to the selected word line.

Mode driver 60 outputs on bus 68 a signal that represents the least-significant-bit of the column address YA2 to all column latches block 88, such that during programming column latches 830 are connected to an even numbered or to an odd numbered bit-line corresponding to a drain of a selected memory cell which is to be programmed. Mode driver 60 also outputs bus 67 to column decoder 36, through which it controls bus 20 and bus 21. During simultaneous programming of plurality of bytes into memory cells whose drains connect to an even numbered bit-lines, all lines of eight bit bus 21 go to a high voltage, which forces a low level voltage on the odd numbered bit-lines through a multiplexer in mux block 24. Eight bit bus 20 will respond to column decoder 36 normally.

However, during simultaneous programming of plurality of bytes into memory cells whose drains connect to an odd numbered bit-lines, all lines of eight bit bus 20 go to a high voltage, which forces a low level voltage on the even numbered bit-lines through another mux in mux 24. Eight bit bus 21 will respond to column decoder 36 normally, as will be detailed below.

The bus 67 also controls the byte select decoder 38, such that during programming bus 19 forces several multiplexers in second level mux SL24 to simultaneously select more than one bit line to ground potential, as will be detailed below.

Mode driver 60 receives its inputs from the PGMb, CSb, OEb, VPP, VCC, VSS pads and from the least-significant-bit of the column address from pad A2 of the EEPROM chip 10

The row decoding is accomplished by predecoding some of the row addresses before connecting them to the inputs of the logic gate of the row decoders 32 by a mask-programmable fashion, while other row addresses are predecoded by a row share-decoder 53 whose outputs connect to all the row decoders' 32 outputs in the same way without mask programmability. In this embodiment the logic inputs of row decoders 32-1 also receive a row address input A14 directly without predecoding.

Row predecoder 52-1 is a two-to-four decoder. It receives row address inputs A5 and A6 and output a four-bit-bus 55 that is mask-programmed to the inputs of the logic gates in row decoder 32.

Row predecoder 52-2 is a two-to-four decoder. It receives row address inputs A8 and A9 and output a four-bit-bus 56 that mask-programmed to the inputs of the logic gates in row decoder 32.

Row predecoder 52-3 is a two-to-four decoder. It receives row address inputs A10 and A11 and output a four-bit-bus 57 that mask-programmed to the inputs of the logic gates in row decoder 32, as will be detailed below.

Row share-decoder 53 is a two-to-four decoder. It receives row address input A7 and the least significant row address A12 and it outputs a four-bit-bus 58 that connects in the same fashion to every one of row decoder 32's circuits' transfer gates to the word lines, as will be detailed below.

There are eight sense amplifiers blocks 40 are numbered 40-1 to 40-8 and eight data-in blocks 41 are numbered 41-1 to 41-8, one for each bit of the word. During read operation a selected bit-line is routed to line 29, which connects to the input of the sense amp block 40.

Sense amplifier block 40 may be any circuit used in the art and it amplifies the logical state that is stored in the memory cell 100 status to a full binary digital level "high" or "low" and outputs it to a corresponding D-i pads of the chip. It other embodiments of the present invention, the memory cell 100 may store more than two logical states, where every logical state is represented by a quantified value of charge on the floating gate. When those other embodiments are used the block 40 may be an analog to digital converter circuit or some other signal processing means that is able to translate the multi-level charge on the floating gate of a selected cell to a binary digital information.

The data-in block 41 is disconnected from the signal path of the selected bit-line during the read mode. In this embodiment the routing of data-in block 41 or sense amp 40 to line 29 is controlled by line 69 which is controlled by the mode driver block 60.

During programming mode line 69 routes line 29 to the data-in block 41, such that data presented to the input of the chip on pads D0-D7 are transferred to the selected bit-lines with appropriate polarity.

Busses 61 and 66 are used by the mode driver 60 to control the row decoder 32 during programming and erase operation as will be detailed below.

In the explanation that follows there will be an "X" or an "Y" added as a prefix to the name of an address pad name whenever it seems to simplify and shorten the description. The "X" denotes that this is a row address bit and it is not decoded by a column decoder. On the other hand the "Y" denotes that this is a column address bit and it is not decoded by a row decoder. As will be seen below one or more row address bit may be used to route the bit line of a decoded column to a voltage source or to data input/output pad of the EEPROM chip 10.

Referring to FIG. 2, an electrical schematic of a portion of array section 14 is illustrated. An array section 14 has a plurality of memory cell transistors 100, that are organized in plurality of columns 70–80 and plurality of rows 82–85. In this embodiment each section 14 has 32 columns, which are divided into four segments 148 of eight columns each. In FIG. 2 eight columns of the first segment 148-1 are shown together with only three columns of the forth segment 148-4 of one array segment 14. Segments 148-2 and 148-3 and the five other columns of segment 148-4 are not shown in order to simplify the explanation, however they are placed between and are contiguous to column 77 and column 78. Each column shares a first bit-line with an adjacent column to its one side and also shares a second bit-line with another column on its other side. For example column 71 shares bit-line BL1 with column 70 and bit-line BL2 with column 72.

Each of the transistors 100 that form the array 14 has a control gate 102 and a floating gate 101, which is capacitively coupled to the control gate 102. As is known in the art a floating gate 101 is dielectrically isolated from the control gate 102 and from device's substrate 105. Memory transistor 100 has a drain 103 and a source 104. A memory transistor 100 is said to be conducting current if current flows between its drain 103 and its source 104 through current path 106, which in this embodiment is also the substrate 105. Current may flow from drain 103 to source 104 or from source 104 to drain 103. In this embodiment the floating gate 101 is positioned closer to the drain 103 and spaced away from the source 104. Current flowing from the drain 103 to source 104 through current path 106 during read operation of the memory will be considered read-current.

Each of the memory transistor 100 stores one of two states, low Vt and high Vt. This embodiment describes an operation of an N-channel MOS transistors' array, so that the value of Threshold voltage low Vt is 0.8 volts and that of a high Vt is 6 volts. A high Vt state is also called a programmed state, in which excess electrons exist on the floating gate, which cut off the flow of current through the current path 106. A low Vt state is also called an erased state and read-current flows through current path 106 in a selected cell.

A programmed state may be induced by several means, such as by hot electrons programming from the substrate 105 to the floating gate 101. Hot electron programming take place for example, as disclosed in U.S. Pat. No. 4,763,299 but for an embodiment that employs thinner silicon-oxide dielectrics, under a voltage bias conditions that force 12 volts on the control gate 102, 9 volts on the drain 103 and 0 volt on the source 104. Other means of programming are for example by electron tunneling from the control gate 102 to the floating gate 101, as disclosed in U.S. Pat. No. 4,845,538 or by electron tunneling from the drain diffusion 103 to the floating gate 101, as is well known in the art. A low Vt state exist before programming or after erasure of the cell in preparation of reprogramming. Erasure occurs by one of following means; exposure of the device to ultra-violet light for a period of time, or by tunneling electrons from the floating gate 101 to the control gate 102 of the same transistor 100, or by tunneling electrons from the floating gate 101 to the drain 103 in the same transistor 100, or by tunneling electrons from the floating gate 101 to a second control gate as disclosed in the '299 patent and as will be explained below in reference to FIG. 3.

Also in FIG. 2 each control gate 102 in row 82 is connected to word-line 114 of the row. Control gates in rows 83, 84 and 85 are connected to word lines 115, 116 and 117 respectively. Memory transistors 100 along each of the columns 70-80 have their drain 103 connected to one bit-line and their source 104 connected to another bit-line.

Figure 9:
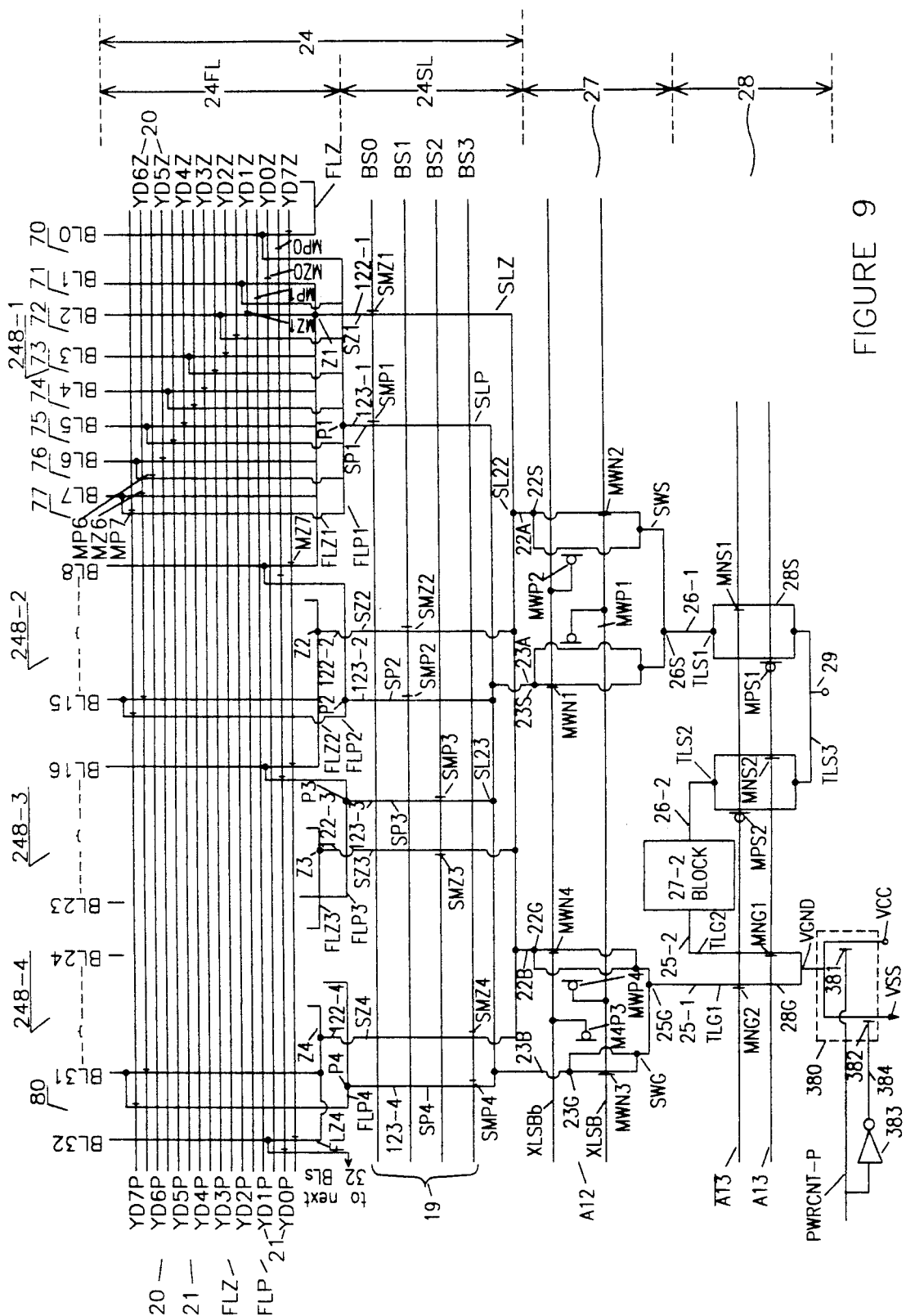
FIG. 9 is a circuit diagram of the bit-line select multiplexer and cross-point-switch of one memory array section, and the circuit diagram of the section select multiplexer for two memory array sections.

The organization of the memory transistors 100 along a given column will be described in reference to column 71. The memory transistors 100 along the column 71 that have their control gate 102 connected to an even numbered word-line, for example 116, have their drain 103 connected to a first bit-line BL1 and their source 104 connected to a second bit-line BL2. On the other hand memory transistor 100 that have their control gate 102 connected to an odd numbered word-line, for example 117, have their drain 103 connected to a second bit-line BL2 and their source 104 connected to a first bit-line BL1. In this embodiment memory transistors 100 along a given row, for example 84, always have their drain 103 connected to the source 104 of the memory transistor 100 of the adjacent column. Since the floating gates 101 are close to the drain 103 in each cell, the resultant placement of the floating gates 101 is that they are staggered along a given column's axis, as are the drains 103. This staggered pattern of drains 103 along a given column requires a new column decoding scheme that coordinates the location of the drain 103 of the memory transistor 100 along a given column with the number of the row. For example in column 71 memory transistor 100 that of even numbered row 84 and of even numbered word-line 116 has its drain 103 connected to an odd numbered bit-line BL1, which needs to be routed to the sense amplifier 40 in order to sense one of two logical states, and the source 104 is connected to an even numbered bit-line BL2, which needs to be routed to ground to enable current to flow through the current path 106. On the other hand in the same column 71 memory transistor 100 that of odd numbered row 83 and of odd numbered word-line 115 has its drain 103 connected to an even numbered bit-line BL2, which needs to be routed to the sense amplifier 40 in order to sense one of two logical states, and the source 104 is connected to an odd numbered bit-line BL1, which needs to be routed to ground to enable current to flow through the current path 106. A scheme that enable such a coordination of bit-lines and word-lines, and routing of the bit-lines according to the present invention is shown in FIG. 9 below and will be called multi purpose shared bit-line (MUPS-BL) decoding scheme.

Figure 3:
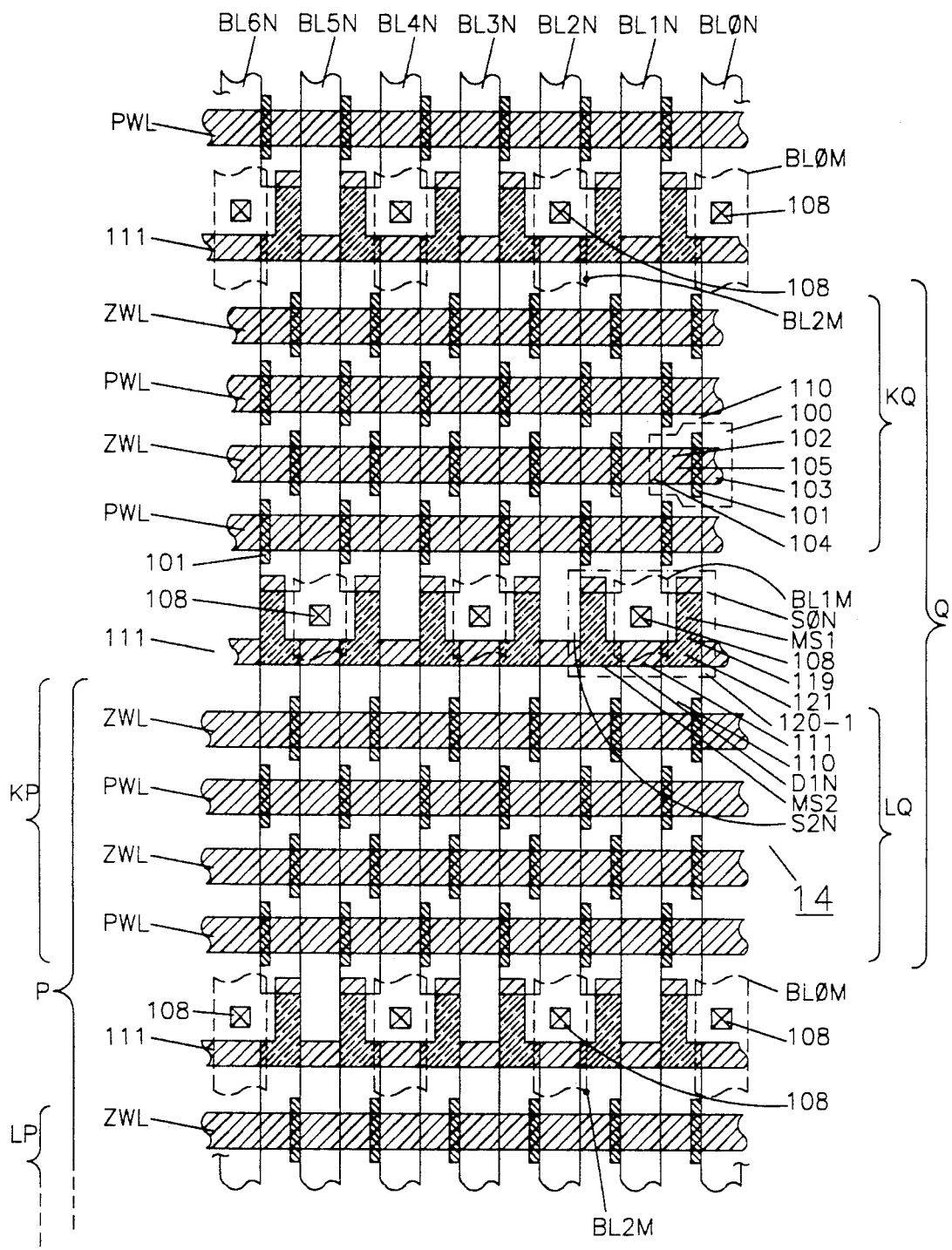
FIG. 3 is a top view of the physical layout of a section of an EPROM array with staggered floating gate along the bit-lines, and it also shows shield-isolation-gate contact regions that reduce diffusion to diffusion spacing.
Figure 4:
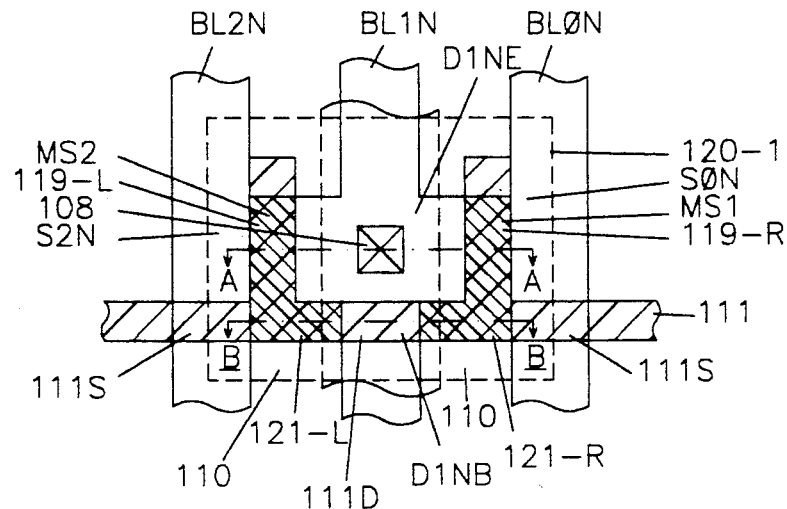
FIG. 4 shows a top view of an individual shield-isolation-gate contact region that reduces diffusion to diffusion spacing.
Figure 5:
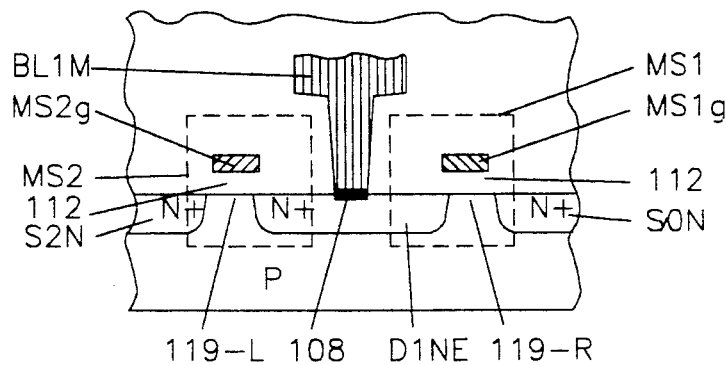
FIG. 5 shows a cross section view along line A—A' of the shield-isolation-gate contact region.
Figure 6:
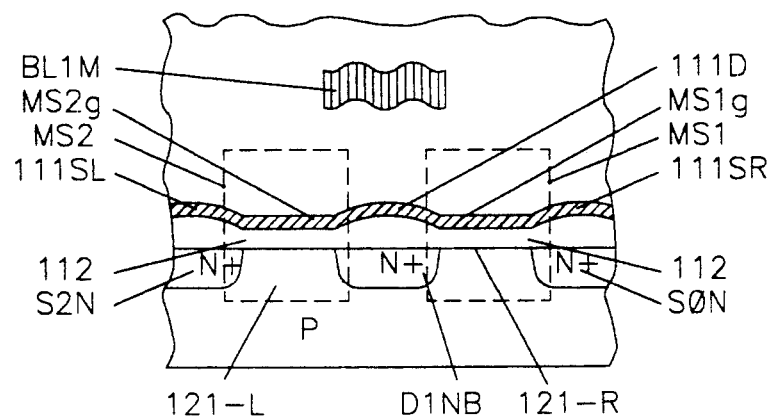
FIG. 6 shows a cross section view along line B—B' of the shield-isolation-gate contact region.

FIG. 3 also shows an improvement that will be referred to below as the shield-isolation-gate (SIG) contact region 120. The SIG-contact region 120 will be described for example in reference to one SIG-contact region 120-1 of the odd number bit line BL1. FIG. 4 is an enlarged drawing of the SIG-contact region 120-1 with more detailed markings. FIG. 5 is a section cut along line A—A' of FIG. 4, and FIG. 6 is a section cut along line B—B' of FIG. 4.

In reference to FIGS. 3, 4, 5 and 6, the SIG contact region 120-1 includes a metal to diffusion bit line contact 108, a first shield NMOS transistor MS1 and a second NMOS shield transistor MS2. The gate MS1g of transistor MS1 and gate MS2g of transistor MS2 are connected to a shield control line 111 that connects all the gates within each SIG-contact region 120 and between the gates of adjacent SIG-contact regions 120 along the same row of contacts 108, which is in parallel to the read word lines PWL and ZWL. Transistors MS1 and MS2 share a common drain D1N, which is part of the diffusion conductor BL1N of the bit line BL1. Drain D1N has two segments D1NE and D1NB, where segment D1NE connect through contact 108 to the metal conductor BL1M of bit line BL1, and segment D1NB is buried under and insulated from shield control line segment 111D. Shield transistor MS1 has a source S0N as part of the diffusion portion BL0N of bit line BL0 and shield transistor MS1 has a source S2N as part of the diffusion portion BL2N of bit line BL2. Portion of source S0N is buried under shield control line segment 111SR and portion of source S2N is buried under shield control line segment 111SL.

Each shield transistor MSi has a variable channel length. For example transistor MS1 has a long channel region 121-R and a short channel region 119-R to the right of contact 108, and transistor MS2 has a long channel region 121-L and a short channel region 119-L to the left of contact 108. However long channel regions 121-R and 121-L may be eliminated by extending the isolation region 110 under gate shield control line 111, thereby causing the shield transistors MSi to have a fixed (only one value) channel length.

The fabrication process of the transistors MS1 and MS2 will now be described in reference to FIGS. 4, 5 and 6. After mask definition and implantation of the bit line diffusions BL0N, BL1N and BL2N, gate oxide 112 is grown and polysilicon is deposited as is known in the art to form shield control line 111 and gates MS1g and MS2g. Shield control line 111 may be deposited in the same processing step that is used to deposit word lines ZWL and PWL. Another fabrication process may be one in which the polysilicon gates MS1g and MS2g are deposited over a gate oxide 112 first, this can be done in the same processing step that is used to deposit the polysilicon of the floating gates 101 (FIG. 3). Thereafter the bit line diffusion is implanted and formed and an second layer of oxide or a multi layer dielectric is grown or deposited over the gates MS1g and MS2g and the floating gates 101. Thereafter the second oxide is etched selectively to expose poly gates MS1g and MS2g only, and then a second polysilicon layer is deposited such and etched to form the word lines ZWL and PWL, which insulatively overlap the floating gates 101, and also form shield control line 111 which makes an ohmic contact to the gates MS1g and MS2g.

This SIG-contact region 120 reduces the spacing between the diffusion bit lines in order to reduce the physical size of the memory array. As is well known in the art a very narrow spacing between two adjacent diffusion bit lines which are biased to different voltages may cause an undesired parasitic current leakage from one bit line to the other, for example due to punch through, thus causing malfunctioning of the chip. This problem is particularly prominent in electrically programmable chips where during programming or erasure about 9 volts are applied to the drain bit line of a programmable transistor and 0 volts are applied to the source bit line of the same programmable transistor, while the normal reading voltage of the chip is about 5 volts. Therefor the practice in the art has been to study and characterize this diffusion to diffusion spacing extensively and to arrive at a value for that spacing which is wider than is possible to achieve by the manufacturing equipment such as resist exposure machine and silicon etching machines. As a result the wider spacing dictates a larger size of every memory cell than necessary which add up to a larger memory array size, thereby increasing production cost.

The SIG-contact region 120 (FIG. 3) of the present invention reduces this bit line to bit line spacing by creating an NMOS shield transistor MSi between the n+ diffusion bit lines (or a PMOS transistor in the case of p+ diffusion bit lines) in the narrowest location, which in this embodiment is the spacing created when a metal contact 108 is made to the bit line diffusion BLiN.

As can be seen in FIG. 3 the metal contact 108 to each diffusion bit line is formed every Q memory cell rows in such a way that the metal contacts 108 to an even numbered bit lines form a first contact row which is parallel to the Q memory cell rows. In the same way the metal contacts 108 to an odd numbered bit lines form a second contact row every P memory cell rows (not all shown). A second contact row is parallel to the P and the Q memory cell rows, but separated from a first contact row by KQ or LQ memory cell rows. Also a first contact row is separated from a second contact row by KP or LP memory cell rows. In the example of FIG. 3, Q=P=8 and KQ=LQ=KP=LP=4, but any number may be used for Q and P, so as to take advantage of the space savings in the horizontal direction gained by the use of the SIG transistors MSi associated with the bit line contacts 108. A better case is Q=P=32 and KQ=LQ=KP=LP=16 since it implies that the space taken by the polysilicon line 111 is effectively divided among 16 rows of memory cells.

As shown in FIG. 3 these SIG-contact regions 120 form a staggered pattern along a given column. The gates of the SIG transistors MSi in every row are connected together by the shield control line 111 that is connected to VSS voltage of 0 volts in the typical embodiment. This creates a gated diode structure between the MSi gate and the diffusion bit line, which allows the increase of voltage on the bit line if needed, by simply applying that much higher voltage to the shield control line 111, provided that the junction breakdown voltage specification of the bit line itself is high enough to withstand that voltage in regions where the SIG transistors are not disposed. For example if the gated diode breakdown voltage of the junction is 9 volts with the gates of MSi at 0 volts, but 12 volts is required for programming the memory cell (writing new data) then the gated diode breakdown can be increased to 12 volts by applying 3 volts to the gates of MSi during programming. This must be done, while ensuring that the SIG transistors never conduct current, by ensuring that the voltage on the gates of SIG transistors MSi is always below the voltage on the diffusion bit lines.

Figure 7:
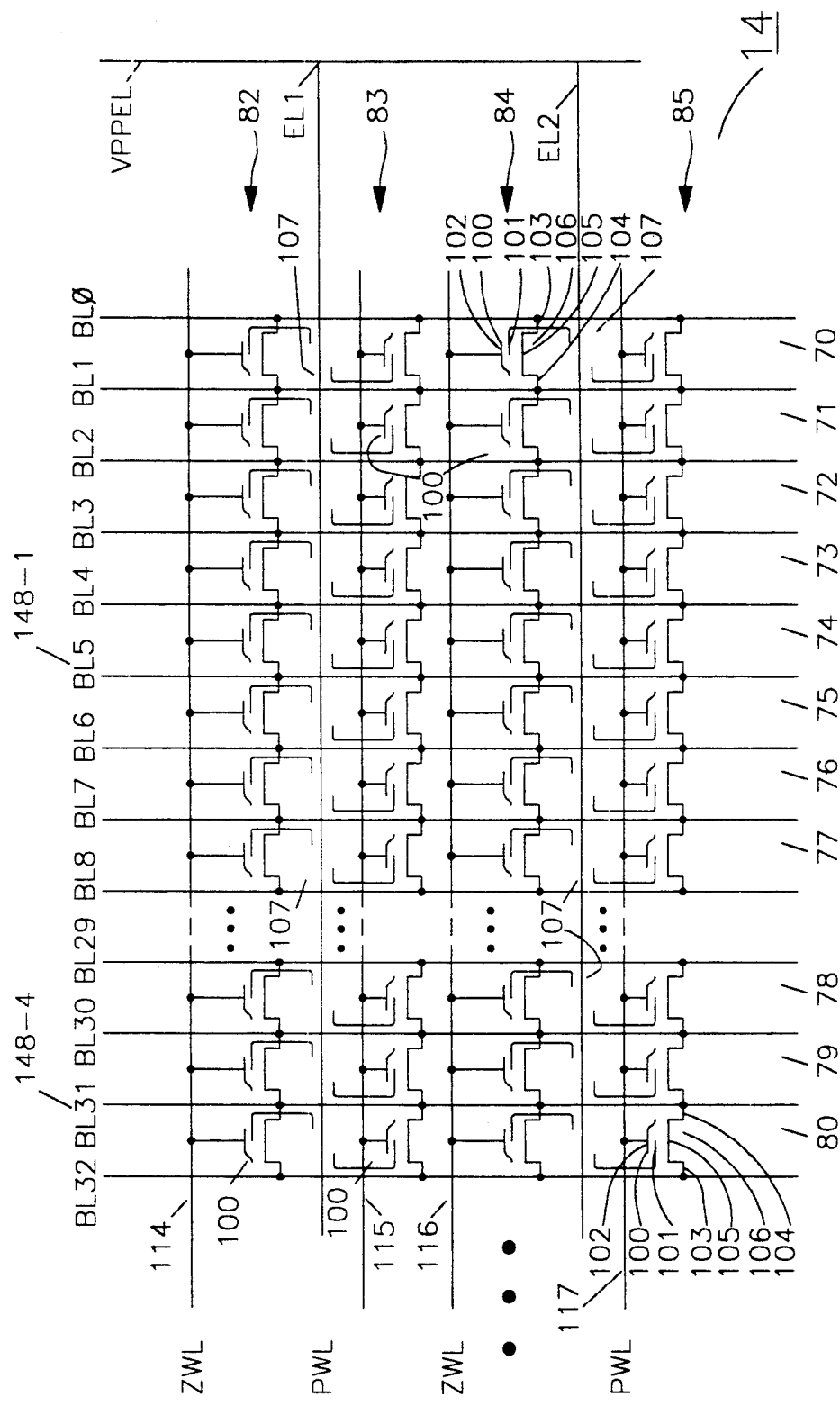
FIG. 7 is a circuit diagram of a section of an EEPROM array with staggered floating gate along the bit-lines and with erase lines that are in parallel to the read word lines.
Figure 8:
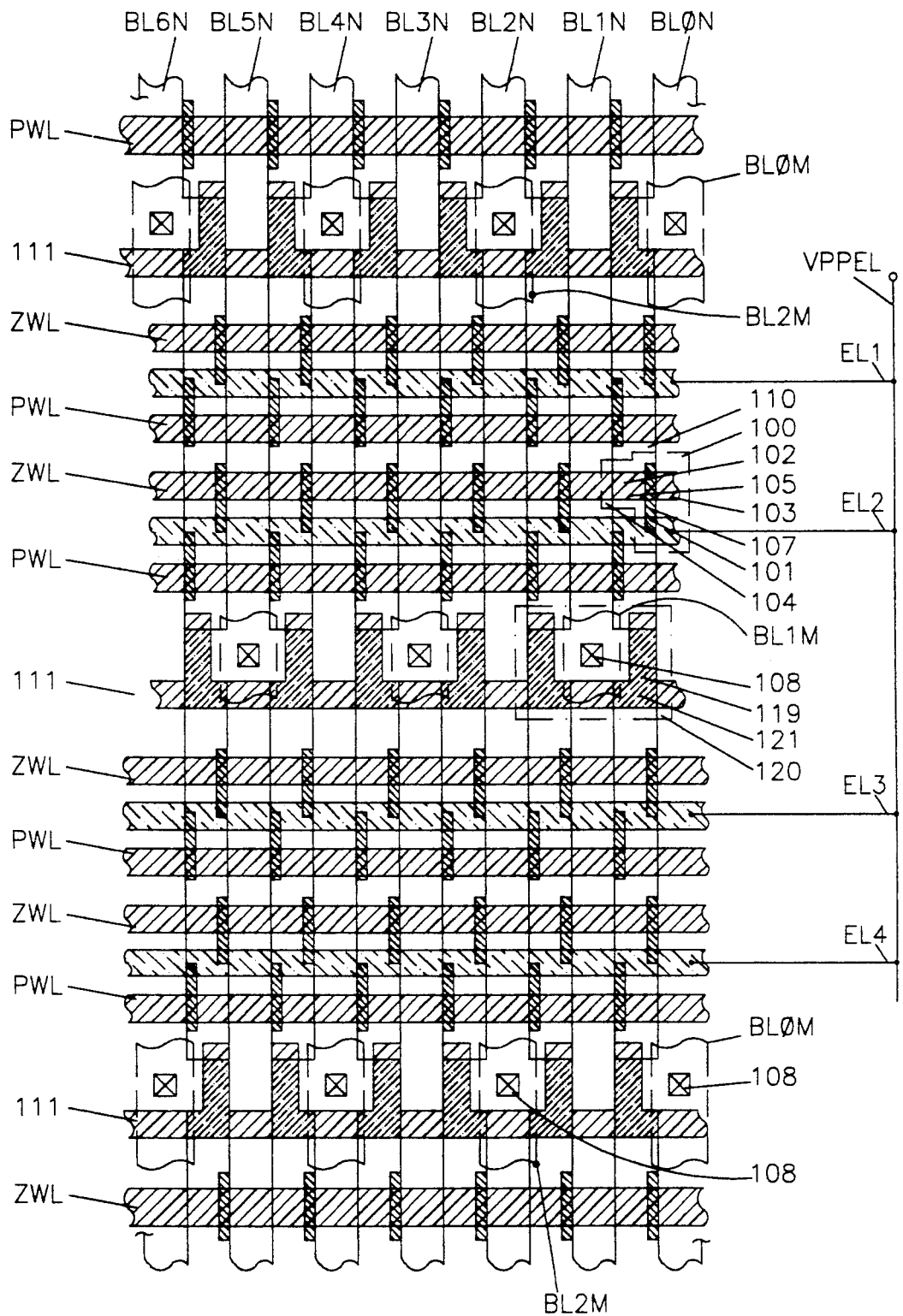
FIG. 8 is a top view of the physical layout of a section of an EEPROM array with staggered floating gate along the bit-lines and with erase lines that are in parallel to the read word lines, and it also shows shield-isolation-gate contact regions.

Referring to FIG. 7, erase word-line EL1 was added in parallel to and between the read word lines 114 and 115. Also erase word-line EL2 was added in parallel to and between the read word lines 116 and 117. These erase lines are placed in the array in such a way that they overlap a portion of each floating gate 101, thus acting as a second control gate 107, also called erase gate 107. As was disclosed in U.S. Patent application Ser. No. 07/377,311, now U.S. Pat. No. 5,099,297 filed on Jul. 10, 1989 each erase line ELi connects to the erase gates 107 that insulatively disposed over portion of the floating gate 101 of memory cells 100 along only one even numbered row and together with those of only one odd numbered row. This architecture is shown here again in FIG. 8, where the erase lines are made of polysilicon. In this embodiment all the erase lines ELi connect to a common erase line VPPEL that comes from the mode driver 60 and which supplies the erase voltage of 12 volts when needed, as will be detailed below. The common erase line VPPEL that connects all the erase lines ELi may be made of deposited metal or polysilicon.

Referring to FIG. 9, a detailed description of the column decoding blocks that were briefly described in reference to FIG. 1, bit-line select multiplexers (muxes) 24, a cross-point switch 27 and an array section select mux 28 will now follow. Bit-line select mux 24, consists of two levels of multiplexing (muxing), the first level is 24FL and the second level is 24SL, which connect through bus 122 and 123. The first multiplexing level 24FL, consists of two sets of interleaved muxes, one mux-set FLZ for even numbered bit-lines and another mux-set FLP for odd numbered bit-lines. Mux-set FLZ consists of four eight-to-one independent muxes FLZ1, FLZ2, FLZ3 and FLZ4, and mux-set FLP consists of four eight-to-one independent muxes FLP1, FLP2, FLP3 and FLP4. Independent-mux FLZ1 is interleaved with independent-mux FLP1 to form independent-mux-unit 248-1, and FLZ2 is interleaved with FLP2, and FLZ3 is interleaved with FLP3, and FLZ4 is interleaved with FLP4 to form independent-mux-units 248-2, 248-3 and 248-4 respectively.

Each independent-mux-unit 248 has nine input-output terminals that correspond to nine bit-lines, which in return correspond to eight adjacent columns in array section segment 148 (FIG. 2) of array section 14. An independent-mux-unit 248 shares its first bit-line with an independent-mux-unit 248 juxtapositioned to one side and its last bit-line is shared with another independent-mux-unit 248 juxtapositioned to the opposite side. The exceptions to this independent-mux-units 248 placements are the independent-mux-unit 248 on edge 92 of bit-line select mux 24-1, and the independent- mux-unit 248 on edge 91 of bit-line select mux 24-16, shown in FIG. 1, for which an independent-mux-unit 248 is juxtapositioned only to one side, as will be detailed below.

In FIG. 9 for example, the first independent-mux-unit 248-1, which is formed by interleaving independent-mux FLZ1 with independent-mux FLP1, has nine bit-lines input-output terminals BL0-BL8, of which seven terminals BL1-BL7 are common to independent-mux FLZ1 and to independent-mux FLP1. Also in independent-mux-unit 248-1, BL0 is connected to independent-mux FLP1 only and BL8 is connected to independent-mux FLZ1 only. BL8 is also shared with independent-mux FLP2 in independent-mux- unit 248-2, and BL0 is shared with an independent-mux FLZ of an independent-mux-unit 248 in a juxtapositioned bit-line select mux 24. Similarly, the second independent-mux-unit 248-2, has nine bit-lines input-output terminals BL8-BL16, of which seven terminals BL9-BL15 (not all shown) are common to independent-mux FLZ2 and to independent-mux FLP2. In independent-mux-unit 248-2, BL8 is connected to independent-mux FLP2 only and BL16 is connected to independent-mux FLZ2 only. BL16 is also shared with independent-mux FLP3 in independent-mux-unit 248-3, and BL8 is shared with an independent-mux FLZ1 of an independent-mux-unit 248-1. The third independent-mux-unit 248-3, has nine bit-lines input-output terminals BL16-BL24, of which seven terminals BL17-BL23 (not shown) are common to independent-mux FLZ3 and to independent-mux FLP3. In independent-mux-unit 248-3, BL16 is connected to independent-mux FLP3 only and BL24 is connected to independent-mux FLZ3 only. BL24 is also shared with independent- mux FLP4 in independent-mux-unit 248-4, and BL16 is shared with an independent-mux FLZ2 of an independent-mux-unit 248-2. The forth independent-mux-unit 248-4, has nine bit-lines input-output terminals BL24-BL32, of which seven terminals BL25-BL31 (not all shown) are common to independent-mux FLZ4 and to independent-mux FLP4. In independent-mux-unit 248-4, BL24 is connected to independent-mux FLP4 only and BL32 is connected to independent- mux FLZ4 only. BL32 is also shared with an independent-mux FLP in a juxtapositioned independent-mux-unit 248 of a juxtapositioned bit-line select mux 24, and BL24 is shared with an independent-mux FLZ3 of an independent-mux-unit 248-3.

The exceptions to this independent-mux-units 248 placements are the interface circuit to independent-mux-unit 248 on edge 92 of bit-line select mux 24-1 and the interface circuit to independent-mux-unit 248 on edge 91 shown in FIG. 1 of bit-line select mux 24-16, for which an independent-mux-unit 248 is juxtapositioned only to the one side which is spaced away from the edges 91 and 92. The interface circuit on side 91 includes a floating source diffusion region of the NMOS transistor whose gate is connected to line YD7Z of bus 20. The drain of that last transistor will be connected to BL0 of bit-line select mux 24-16. The interface circuit on side 92 includes a floating source diffusion region of the NMOS transistor whose gate is connected to line YD0P of bus 21. The drain of that last transistor will be connected to BL32 of bit-line select mux 24-1.

Each independent-multiplexer FLZi has a separate input-output terminal Zi and each independent-multiplexer FLPi also has a separate input-output terminal Pi. For example independent-mux FLZ1 has terminal Z1 and independent-mux FLP1 has terminal P1, and so independent-mux FLZ2 has terminal Z2 and independent-mux FLP2 has terminal P2 and so on. These separate input-output terminals Zi and Pi connect between the first multiplexing level 24FL and the second multiplexing level 24SL of the bit-line select multiplexing block 24.

The control of first level muxing 24FL in bit-line mux 24 comes from one-of-eight column decoder 36, which delivers outputs signals on two separate busses, bus 20 and bus 21 that are interleaved in FIG. 9. Bus 20 drives the gates of the transistors MZi (which in this embodiment are N-Channel MOS FETs) in independent-mux FLZi that control the signal paths between terminals BLj and terminals Zi. Bus 21 drives the gates of the transistors MPi (which in this embodiment are N-Channel MOS FETs) in independent-mux FLPi that control the signal paths between terminals BLj and terminal Pi. For example, in reference to independent-mux-unit 248-1, transistors MP0-MP7 belong to independent-mux FLP1. The control gates of transistors MP0-MP7 are controlled by lines YD0P-YD7P of bus 21, such that line YD0P connects to the gate of transistor MP0 only, and line YD1P connects to the gate of transistor MP1 only and lines YD2P, YD3P, YD4P, YD5P, YD6P and YD7P connect only to the gates of transistors MP2, MP3, MP4, MP5, MP6 and MP7 respectively. Also in independent-mux FLZ1 the control gates of transistors MZ0-MZ7 are controlled by lines YD0Z-YD7Z of bus 21, such that line YD0Z connects to the gate of transistor M0Z only, and line YD1Z connects to the gate of transistor M1Z only and lines YD2Z, YD3Z, YD4Z, YD5Z, YD6Z and YD7Z connect only to the gates of transistors MZ2, MZ3, MZ4, MZ5, MZ6 and MZ7 respectively. The lines of busses 20 and 21 connect to every independent-mux-unit 248 in every block of bit-line selection mux 24, that is 24-1 through 24-16, in the manner explained above.

Still referring to FIG. 9, terminals Pi and Zi of the first level mux 24FL connect to second level mux 24SL's terminals SPi and SZi through busses 123-i and 122-i respectively. For example terminal P1 connects to terminal SP1 of second level mux 24SL via line 123-1 of bus 123 (FIG. 1) and terminal Z1 connects to terminal SZ1 of second level mux 24SL via line 122-1 of bus 122 (FIG. 1). In the same manner terminals P2, P3 and P4 of the first level mux 24FL connect to terminals SP2, SP3 and SP4 of the second level mux SL24 via lines 123-2, 123-3 and 123-4 of bus 123 respectively. Also In the same manner terminals Z2, Z3 and Z4 of the first level mux 24FL connect to terminals SZ2, SZ3 and SZ4 of the second level mux SL24 via lines 122-2, 122-3 and 122-4 of bus 122 respectively.

The control of second level muxing 24SL in bit-line mux 24 comes from two-to-four byte-select decoder 38 (FIG. 1), which delivers its outputs signals on bus 19. Bus 19 drives the gates of transistors SMZi (which in this embodiment are n-Channel MOS FETs) in mux SLZ that control the signal paths between terminals Zi and terminal SL22. Bus 19 also drives the gates of the transistors SMPi (which in this embodiment are N-Channel MOSFETs) in mux SLP that control the signal paths between terminals Pi and terminal SL23. For example, transistors SMP1-SMP4 belong to mux SLP.

The control gates of transistors SMP1-SMP4 are controlled by lines BS0-BS3 of bus 19, such that line BS0 connects to the gate of transistor SMP1 only, and line BS1 connects to the gate of transistor SMP2 only and lines BS2 and BS3 connect only to the gates of transistors SMP3 and SMP4 respectively. In mux SLZ the control gates of transistors SMZ1-MZ4 are controlled by lines BS0-BS3 of the same bus 19, such that line BS0 connects to the gate of transistor SMZ1 only, and line BS1 connects to the gate of transistor SMZ2 only and lines BS2 and BS3 connect only to the gates of transistors SMZ3 and SMZ4 respectively. The lines of bus 19 connect to every second level mux 24SL in every block of bit-line selection mux 24i, from 24-1 through 24-16, in the manner explained above. Terminal SL22 of the second level mux 24SL connects to cross-point-switch 27's terminals 22S and 22G through bus 22. Terminal SL23 of the second level mux 24SL connects to cross-point-switch 27's terminals 23S and 23G through bus 23 (FIG. 1).

Cross-point-switch 27 contains two channels. A first sense-channel SWS consists of transistors MWN1, MWP1 and transistors MWN2, MWP2. A second ground-channel SWG consists of transistors MWN3, MWP3 and transistors MWN4, MWP4.

The connection from terminal SL22 to terminal 22S of the sense-channel SWS is made via line 22A of bus 22 and the connection from the same terminal SL22 to terminal 22G of ground-channel SWG is made via line 22B of bus 22. The connection from terminal SL23 to terminal 23S of the sense-channel SWS is made via line 23A of bus 23 and the connection from the same terminal SL23 to terminal 23G of ground-channel SWG is made via line 23B of bus 23.

The control of the two-by-two cross-point switch 27 comes from the least significant row address A12. Lines XLSB and XLSBb, which are the true and complement signals of address A12, drive the gates of the transistors MWN2, MWP1 and MWN1, MWP2 respectively in sense-channel SWS that control the signal paths between terminal 22S or terminal 23S and terminal 26S. Lines XLSB and XLSBb, also drive the gates of the transistors MWN3, MWP4 and MWN4, MWP3 in ground-channel SWG that control the signal paths between terminal 23G or terminal 23G and terminal 25G.

The reason for choosing LSB row address A12 to control cross-point switch 27 for coordinating the location of the drain of a selected memory cell along a given column will be detailed below after the description of the row address decoding circuitry.

Section selection mux 28 consists of two two-to-one multiplexers 28S and 28G and each is controlled by column address line A13. The first two-to-one mux 28S consists of terminals TLS1, TLS2 and TLS3 and transistors MNS1, MPS1, MNS2 and MPS2. The other two-to-one mux 28G consists of terminals TLG1, TLG2 and VGND and transistors MNG1 and MNG2.

The true signal of address pad A13 connects to transistors MPS1 and MNS2 of mux 28S and to transistor MNG1 of mux 28G. The complement signal of the same address, A13b connects to transistors MPS2 and MNS1 of mux 28S and to transistor MNG2 of mux 28G. Transistors MNS1 and MPS1 control the path between terminals TLS1 and TLS3 and transistors MNS2 and MPS2 control the path between terminals TLS2 and TLS3 of mux 28S. Transistor MNG1 controls the path between terminals TLG2 and VGND and transistor MNG2 controls the path between terminals TLG1 and VGND of mux 28G.

Terminals TLS2 and TLG2 connect to an adjacent cross-point-switch 27 that routes signals for an adjacent array-section 14. Terminal TLS3 is connected to a sense amplifier block 40 and data-in block 41 through one line of bus 29, as is also shown in FIG. 1.

In some embodiments of the present invention where programming speed of the array is not important terminal VGND is also the common ground line VSS of the chip. This results in the typical drain to source programming current of about 500 microampere per one memory cell when VPP high voltage of 12 volts is applied to the word line, about 9 volts to the drain bit line and the source bit line is routed to the VSS line whose voltage is 0 volts. However in the preferred embodiment it is desired to reduce the programming drain to source current of the memory cell transistor to about 1 microampere in which case it is possible to program plurality of memory cells simultaneously because the current drive requirement from the power supply rails are low enough to make it practical. For example to program 256 cell simultaneously in the preferred embodiment will require only 256 microamperes while in the embodiment where the source of the memory transistor is routed to VSS line voltage of 0 volts the programming current requirement will be 128 milliampere from the high voltage supply source VPP. This high current drive is especially difficult to produce in embodiments where a charge pump or a voltage doubler is designed into the EEPROM chip 10 on a single substrate to produce the VPP voltage from the VCC voltage of 5 volts. The situation gets more difficult if the EEPROM chip 10 is designed to store more memory cells so that for example 4096 cell along a word line are programmed simultaneously.

In the preferred embodiment as shown in FIG. 9, the VGND terminal is routed by low-voltage multiplexer (LV mux) 380 to the VSS line with the voltage of 0 volts during the read and erase cycles of operations and also during a portion of the programming cycle, described below in reference to FIG. 32 as time period LLT, where data is loaded from the data-in buffers 41-i into the column latches 830-i. The LV mux 380 routes terminal VGND to the VCC line with the voltage of 5 volts when the actual programming occurs in the memory cell 100 and a new data is written into the memory cell 100 by hot electrons injection from the substrate 105 to the floating gate 101 that are shown in FIG. 7 for example. This period of time is referred to below in reference to FIG. 32 as the Tpg period. During the Tpg period source of the transistor in the selected cell 100 connects to a bit line which is routed to the VGND terminal and will receive a voltage value of VCC - Vtn, which is one threshold voltage of an NMOS transistor below the VCC line voltage. When the Tpg period is over terminal VGND is routed again to the Vss line. In the embodiment described here and shown in FIG. 1, the memory cells 100 of each two adjacent array sections 14 are routed to a dedicated LV mux 380, so that there are eight LV mux 380 circuit blocks. However the VGND lines from all the pairs of array sections 14 may be shorted together and connected to only one LV mux 380.

The two-to-one LV mux 380 consists of NMOS transistor 381 which has its source connected to the VCC line and its drain connected to the VGND line thereby controlling the path between them. The gate of transistor 381 is connected to the PWRCNT-P line that comes from the mode driver block 60 and whose function will be detailed below in reference to FIGS. 29 and 32. The second path of LV mux 380 is controlled by NMOS transistor 382 which has its drain connected to the VGND terminal, its source connected to the VSS line and its gate connected to line 304 which the complement signal of the PWRCNT-P signal. The complement signal of the PWRCNT-P signal is generated here by the CMOS inverter 383 whose input is connected to line PWRCNT-P and whose output is connected to line 384.

The reason that the VGND terminal is biased at VCC-Vtn volts during the Tpg period is to reduce the drain 103 to source 104 programming current of the transistor in each of the selected memory cells 100 to about one microampere, while keeping the voltage between the control gate 102 and the substrate 105 at 12 volts in order to keep the voltage coupling to the floating gate 101 high enough to collect the hot electrons from the substrate. By holding the voltage of the source 103 at VCC-Vtn volts and the voltage of substrate 105 at 0 volts, the back bias voltage Vsb of the transistor 100 is about 4V=VCC-Vtn, which is significantly higher than the Vsb of 0 volts in the high current drive embodiment that results in about 500 microampere drain to source current Isd. As is know in the art, when this high Vsb of 4 volts is multiplied by the GAMMA of the MOS transistor 100, its effective threshold voltage increases and its Isd current is reduced. Another reason that the Isd current is reduced when the source voltage is held at VCC-Vtn is that the drain to source voltage Vds is reduced to 5 volts which is the drain voltage of 9 volts minus the source voltage of 4 volts. This Vds voltage of 5 volts during the programming period Tpg is much lower that the Vds voltage of 9 volts in the embodiment that results in high programming Ids current, thereby the smaller Vds of 5 volts results in a significantly smaller Ids current while still maintaining the electric field that causes electron current in the channel region, the current path 106, of the transistor 100. Another reason the Ids programming current is reduced is that the Vgs voltage is abuts 8 volts which is 4 volts lower that in a situation where the source is at 0 volts and Vgs is 12 volts. It is preferred that the spacing between the drain 104 and the source 103 will be under 3 micrometers long to achieve the short programming time with low programming current. As will be detailed below in reference to the column latch circuit 830, if a memory cell transistor 100 is not to be programmed during the Tpg period the corresponding column latch 830 will deliver VCC-Vtn voltage to the drain 103 of the selected cell 100 thereby forcing a Vds of 0 volts on the cell which causes a corresponding Ids current of 0 microamperes which in return will not produce hot electrons injection to the floating gate 101 and the voltage threshold of the cell 100 will not be altered.

The reason that LV mux 380 routes the VGND terminal to the VCC power supply line and not to some other voltage reference such as a resistors voltage divider, which is limited by its current sinking capabilities is because the number of cells 100 to be actually programmed during the Tpg period varies according to some random pattern that is specific to the application. Therefor, transistor 381 in LV mux 380 is designed to be large enough so that current value fluctuations from a value of one microampere that represents one cell 100 to 256 microamperes that represents 256 cells 100 will cause small Vds voltage drop across transistor 381.

Although it is possible to connect the source of transistor 381 to a resistors voltage divider, so that two resistors that are connected in series between the VCVP line and the VSS line produce 5 volts at the node that connects between them, when the source of transistor 381 connects to that node the node voltage will vary according to the number of cells 100 to be programmed, which will affect the programming period Tpg to be longer than expected. In embodiments of the EEPROM chip 10 where a higher density memory is designed there are 4096 cells 100 along a selected row to be programmed simultaneously. In this case the voltage on the source of transistor 381 will fluctuate so much that some cells 100 will not program during the desired Tpg period.

Figure 10:
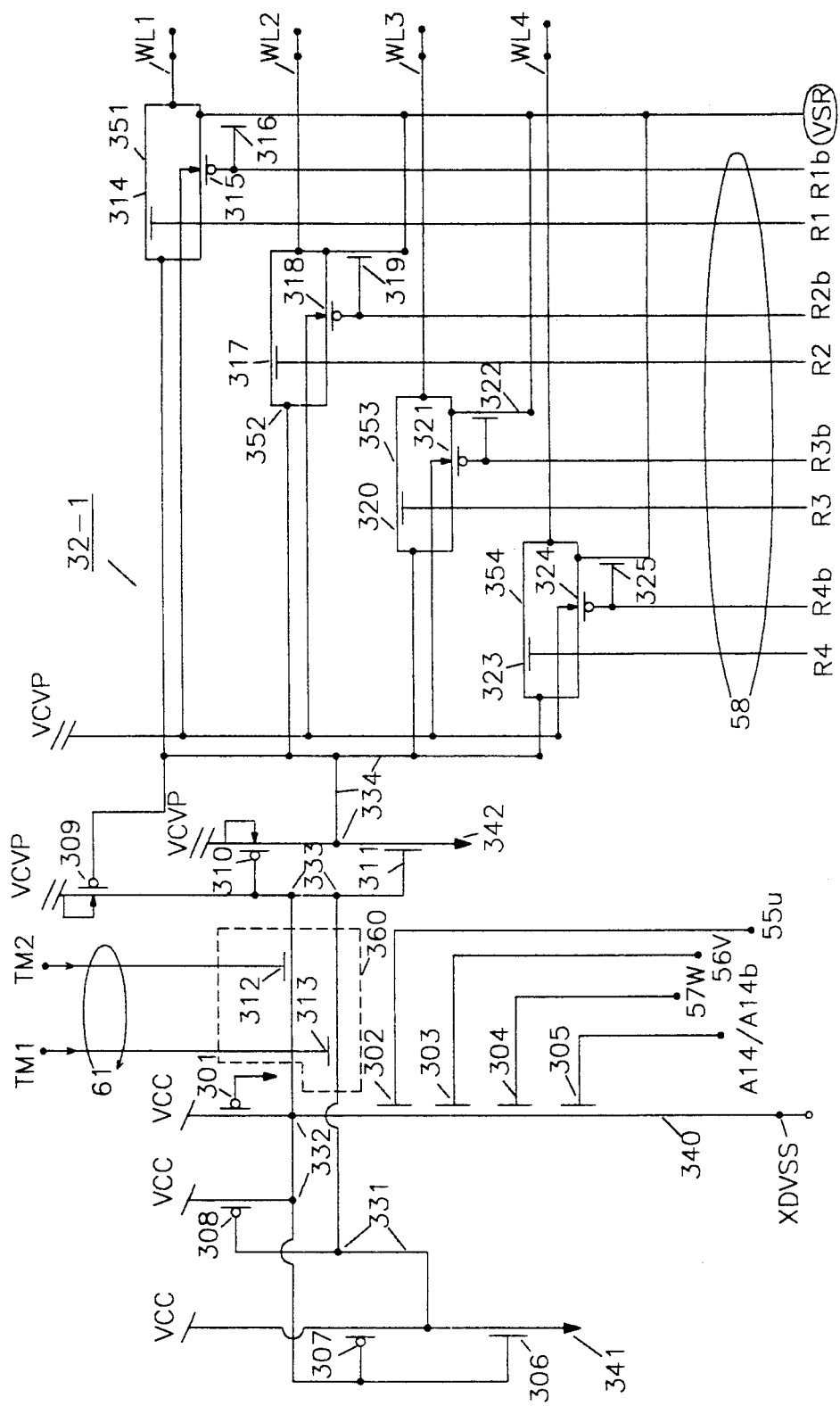
FIG. 10 is a circuit diagram of a row decoder circuit.

Referring now to FIG. 10, a row-decoder circuit 32-1, one of plurality of similar row-decoder circuits used in row-decoder block 32 is illustrated. In this embodiment each row-decoder circuit 32-1 controls four word-lines, such that there are 64 row-decoders 32-1 controlling a total of 512 word lines.

In FIG. 10 row-decoder-circuit 32-1 is comprised of decoder select logic gate 340, phase-feedback inverter 341, row driver 342, transmission gates 351, 352, 353 and 354 and operating mode multiplexer 360. Logic gate 340 is a NAND gate with PMOS transistor 301 serving as a pull-up resistor to VCC line. The gate of transistor 301 is connected to VSS line at ground voltage of 0 volts, and its source is connected to VCC line voltage of 5 volts. The drain of transistor 301 is connected to the output of NAND gate 340 at line 332. The pull-downs of NAND gate 340 are the four NMOS transistors 302, 303, 304 and 305, which are connected in series from line 332 to the XDVSS terminal which provides ground potential during the read and the programming operations, but it provides Vcc voltage or "high" logical state during some of the erase operations. These voltages are supplies to the XDVSS terminal by the mode driver 60, as will be detailed below. The gates of the four NMOS pull-down transistors 302, 303, 304 and 305 are connected to input terminals 55U, 56V, 57W and A14/A14b respectively.

Phase-feedback inverter 341 comprised of inverter transistors 307 and 306 and a feedback PMOS transistor 308. The input of phase-feedback inverter 341 comes from the output line 332 of logic gate 340. The output of phase feedback inverter 341 connects to line 331. Feedback transistor 308's control gate connects to the output of inverter 341, the drain of transistor 308 connects to the input of inverter 341 and the source of transistor 308 connects to the VCC line.

Operating mode mux 360 is connected between the output lines 332 and 331 of logic gate 340 and of phase feedback inverter 341 respectively and the input line 333 of driver 342. Operating mode mux 360 is a two-to-one mux, where its two inputs are lines 331 and 332 and its output is line 333. NMOS transistor 313 controls of the path from line 331 to line 333 and NMOS 312 controls the path from line 332 to line 333. The gate of transistor 312 is connected to input terminal TM2 and the gate of transistor 313 is connected to input terminal TM1. Mux 360 is controlled by mode driver 60 through bus 61 (FIG. 1) that controls terminals TM1 and TM2.

Row driver 342 includes PMOS pull-up transistor 310, NMOS pull-down transistor 311 and an PMOS feedback transistor 309. Transistors 310 and 311 form an inverter whose input is line 333 and whose output is line 334. The power line of pull-up transistor 310 is power terminal VCVP, which connects to its source and bulk. Feedback transistor 309's source and bulk also connect to power line VCVP. The gate of transistor 309 connects to the output line 334 of inverter 342 and the drain of feedback transistor 309 connects to the input of inverter 342.

Transmission gates 351, 352, 353 and 354 control the signal paths between the row driver's output line 334 and the row decoder circuit 32-1's output terminals WL1, WL2, WL3 and WL4. Output terminals WL1-WL4 connect to the word lines of memory array 12. The numbers WL1-WL4 were chosen here in order to simplify the explanation regarding the row decoder 32 and it operation with the share predecoder 53. However, it is to be understood that terminals WL1 and WL3 connect to even numbered word lines in array 12 and terminals WL2 and WL4 connect to odd numbered word lines in array 12.

Transmission gates 351, 352, 353 and 354 also control the signal paths from input-output terminal VSR and output terminals WL1-WL4. Each of transmission gates 351, 352, 353 and 354 is comprised of a CMOS transistor pair that controls the path from line 334 to one of output terminals WL1-WL4, and an NMOS transistor that controls the path between input-output terminal VSR and one of output terminals WL1-WL4. As will be detailed below, transmission gates 351, 352, 353 and 354 are controlled by the shared predecoder 53, shown in FIG. 1, through bus 58 and terminals R1-R4 and R1b-R4b. Transmission gate 351 contains NMOS transistor 314 whose gate is connected to terminal R1 and PMOS transistor 315 whose gate is connected to terminal R1b. Also included in transmission gate 351 is NMOS transistor 316 whose gate connects to terminal R1b. The CMOS transistor pair 314, 315 control the path between row-driver 342's output line 334 and output terminal WL1. NMOS transistor 316 controls the path between input-output terminal VSR and output terminal WL1. Transmission gate 352 contains NMOS transistor 317 whose gate is connected to terminal R2 and PMOS transistor 318 whose gate is connected to terminal R2b. Also included in transmission gate 352 is NMOS transistor 319 whose gate connects to terminal R2b. The CMOS transistor pair 317, 318 control the path between row-driver 342's output line 334 and output terminal WL2. NMOS transistor 319 controls the path between input-output terminal VSR and output terminal WL2.

Transmission gate 353 contains NMOS transistor 320 whose gate is connected to terminal R3 and PMOS transistor 321 whose gate is connected to terminal R3b. Included in transmission gate 353 is NMOS transistor 322 whose gate connects to terminal R3b. The CMOS transistor pair 320, 321 control the path between row-driver 342's output line 334 and output terminal WL3. NMOS transistor 322 controls the path between input-output terminal VSR and output terminal WL3. Transmission gate 354 contains NMOS transistor 323 whose gate is connected to terminal R4 and PMOS transistor 324 whose gate is connected to terminal R4b. Included in transmission gate 354 is NMOS transistor 325 whose gate connects to terminal R4b. The CMOS transistor pair 323, 324 control the path between row-driver 342's output line 334 and output terminal WL4. NMOS transistor 325 controls the path between input-output terminal VSR and output terminal WL4.

The bulk terminals of PMOS transistors 309, 310, 315, 318, 321 and 324 connect to power terminal VCVP, which as will be detailed below provides 5 volts or 12 volts to the row decoder circuit 32-1 depending on the EEPROM chip 10's mode of operation. As a rule for the present embodiment of the EEPROM chip 10, unless it is indicated otherwise in a reference to a specific circuit block, all the bulk terminals of NMOS transistors connect to ground potential of 0 volts through the VSS line of the EEPROM chip 10, and all bulk terminals of the PMOS transistors connect to 5 volts through the VCC power line of the EEPROM chip 10.

Still referring to FIG. 10 and where indicated to FIG. 1, the control of the row decoder circuit 32-1's input terminal 55U comes from row address predecoder 52-1 through four-bit bus 55 (FIG. 1). The control of the row decoder circuit 32-1's input terminal 56V comes from row address predecoder 52-2 through four-bit bus 56 (FIG. 1), and the control of the row decoder circuit 32-1's input terminal 57W comes from row address predecoder 52-3 through four-bit bus 57 (FIG. 1). Terminals 55U, 56V and 57W of each row-decoder circuit 32-1 connects to busses 55, 56 and 57 in a unique logical combination, which is not common to any other row-decoder circuit 32-1. This unique logical combination is mask programmed during the manufacturing of the device, as is well known in the art. The A14/A14b input terminal is controlled by A14 row address input. Such that half of decoder circuits 32-1 connect to A14 and the other half of circuits 32-1 in decoder block 32 connect to A14b, as is well known in the art. Input terminals R1, R2, R3, R4 and R1b, R2b, r3b, R4b are controlled by share-decoder 53 through bus 58 (FIG. 1). All row decoder circuits 32-1 connect to bus 58 with the identical combination and identical physical order, such that the order of even numbered and odd numbered WL is kept and the WL terminals remain interleaved. Terminal VSR is connected by bus 66 to mode driver 60, which connects terminal VSR to either VSS voltage of 0 volts during read operation or to high voltage VPP of 12 volts during some erase operations, as will be detailed below. Input terminals TM1 and TM2 are controlled by two-bit bus 61 that comes from the mode driver 60. Through mux 360 bus 61 controls the feedback phase of phase-feedback inverter 341's output, which drives the row driver 342. The signal of bus 61 determines the logic level of the output line 334 of the selected row decoder circuit 32-1 to be in a first logical state, and the logic level of the outputs 334 of the non-selected row decoders circuits 32-1 to be in a second logical state. For example during read operation the output line 334 of the selected row decoder 32-1 is at "1" logical state or 5 volts and at the same time the output line 334 of the non-selected row decoders circuit 32-1 are at "0" logical state or 0 volt. On the other hand, as will be detailed below, during some erase operations the output line 334 of the selected row decoder circuit 32-1 is at "0" state or 0 volts, and at the same time the output lines 334 of the non-selected row decoders 32-1 are at "1" state that increases in voltage from 5 volts to 12 volts.

Figure 11:
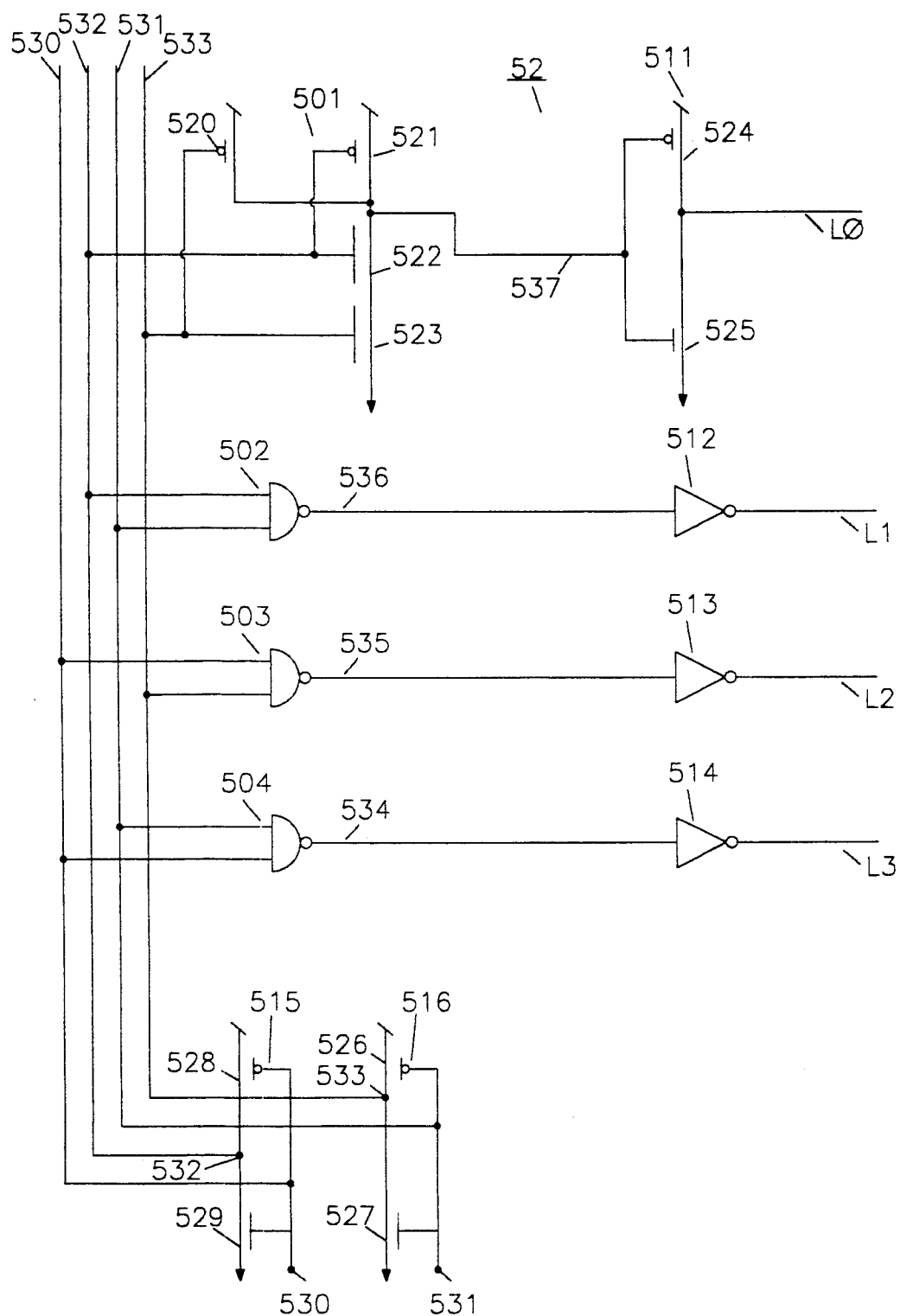
FIG. 11 is a circuit diagram of a two-to-four row predecoder circuit.

Referring to FIG. 11, a two-to-four decoder 52, which is commonly used in the art is illustrated. This decoder decodes as do the row-predecoder circuits numbered 52-1, 52-2 and 52-3 of FIG. 1. The row predecoder 52 has two input terminals 530 and 531, which accept two row address inputs and generates four outputs at terminals L0, L1, L2 and L3, which drive the inputs of the row decoder block 32. Inverter 515 generates at line 532 a complimentary address level to the address input at terminal 530, and inverter 516 generates at line 533 a complimentary address level to the address input at terminal 531. Inverter 515 consists of PMOS pullup transistor 528 and NMOS pulldown transistor 529, and inverter 516 consists of PMOS pullup transistor 526 and NMOS pulldown transistor 527. Each of the four NAND gates 501, 502, 503 and 504 decodes one of the four logic combinations presented at lines 530, 531, 532, and 533 by the two addresses at the input terminals. Each of the NAND gates 501-504 has two inputs and one output. For example NAND gate 501 consists of two PMOS parallel pullup transistors 520 and 521 and two NMOS series pulldown transistors 522 and 523 in a manner well known in the art. The inputs of NAND gate 501 are lines 532 and 533 and the output is at line 537. In the same manner the inputs to NAND gate 502 are lines 530 and 533 and its output is at line 536, and the inputs to NAND gate 503 are lines 531 and 532 and its output is at line 535, and the inputs to NAND gate 504 are lines 530 and 531 and its output is at line 534. Inverters 511, 512, 513 and 514 invert the output of the NAND gates 501-504 to the output terminals L0, L1, L2 and L3. For example the logical state of output line 537 of NAND gate 501 is inverted by inverter 511, which consists of PMOS pullup transistor 524 and NMOS pulldown transistor 525 and is presented at output terminal L0.

The output of only one NAND gate will go to logical "0" state when both its input lines are at logic "1" state simultaneously, and so the outputs of the remaining NAND gates will be at logical "1" state. For example when input terminals 530 and 531 are both at logical "0" state, the input of NAND gate 501 will both be at logic "1" state and line 537 will be at logical "0" state, which will be inverted to logic "1" state by inverter 511 at output terminal L0. At the same time output terminals L1, L2 and L3 will be at logical "0" state. At row predecoder 52-1 the input terminals 530 and 531 are controlled by address inputs A5 and A6 respectively and the output terminals L0-L3 drive bus 55 to the row decoder block 32. At row predecoder 52-2 the input terminals 530 and 531 are controlled by address inputs A8 and A9 respectively and the output terminals L0-L3 drive bus 56 to the row decoder block 32, and at row predecoder 52-3 the input terminals 530 and 531 are controlled by address inputs A10 and A11 respectively and the output terminals L0-L3 drive bus 57 to the row decoder block 32.

Figure 12:
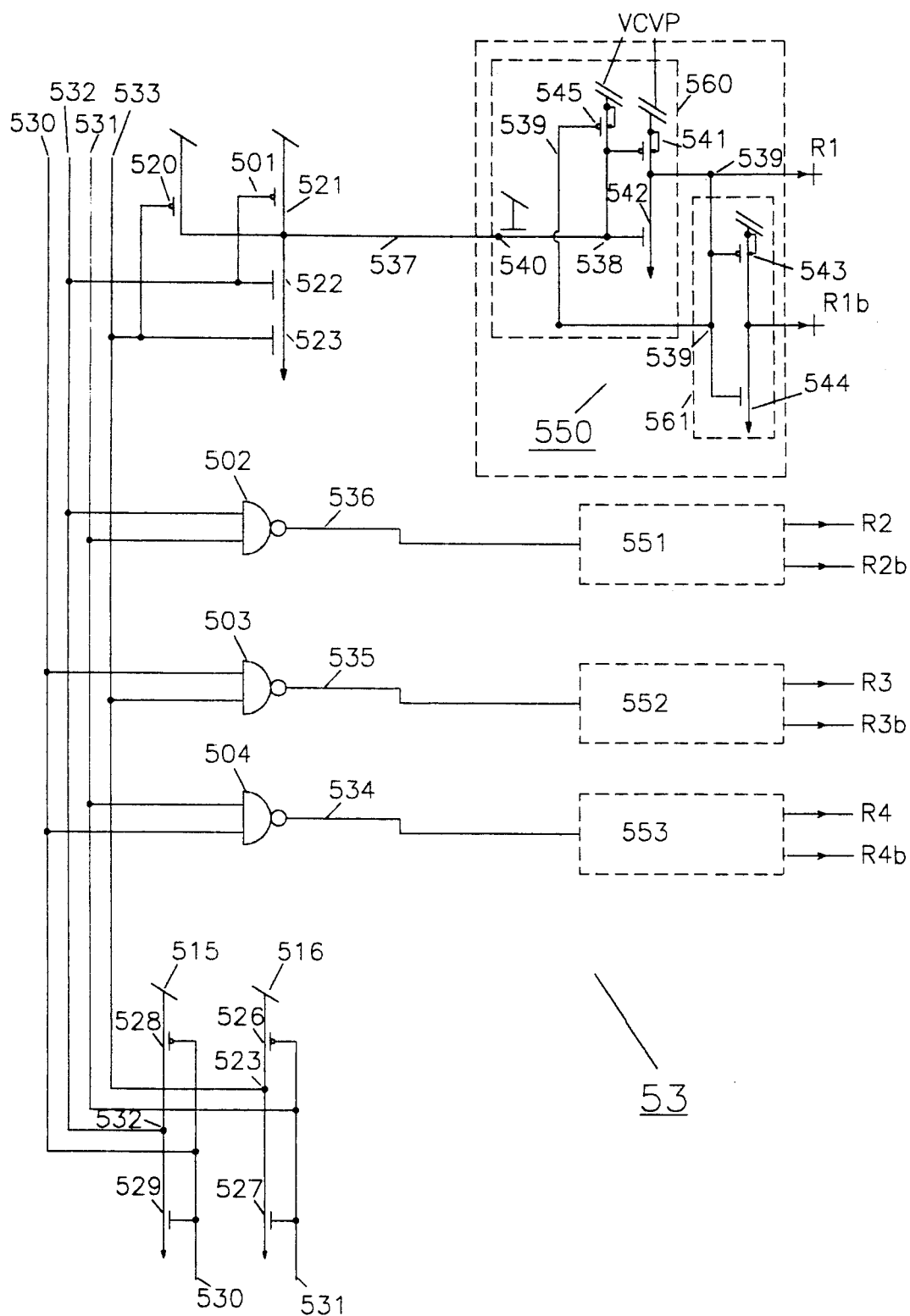
FIG. 12 is a circuit diagram of a two-to-four shared row predecoder circuit.

Referring to FIG. 12 the shared row-predecoder 53 is illustrated. As in the row predecoders 52, here too the two-to-four decoding is accomplished using NAND gates, however the output terminals are driven by more than a simple inverter 511 of FIG. 5. The inverters 511, 512, 513 and 514 of FIG. 5 are replaced by bus 58 drivers 550, 551, 552 and 553 respectively. The input terminals 530 and 531 of shared row predecoder 53 are controlled by address inputs A7 and A12 respectively and the output terminals R1, R2, R3, R4 and R1b, R2b, R3b, R4b drive bus 58 to the row decoder block 32.

As will be detailed below, the requirements from bus 58 are such that during read operation its voltage swings between VSS of 0 volts and VCC of 5 volts, but during some programming and erase operations the voltage will reach 12 volts. In order for output terminals R1-R4 and R1b-R4b to be able to drive this bus 58, drivers 550-553 where introduced. Since bus drivers 550-553 all have identical circuits, driver 550 will be explained for example. In driver 550 NMOS transistor 540 isolates the low voltage section, which includes the NAND gate 501 that operates between 0 and 5 volts from the high voltage section, which include inverter 560 that operates between 0 and 12 volts. Inverters 560's and 561's power lines are VSS of 0 volts and VCVP that vary its voltage between 5 volts at read operation to 12 volts at some programming and erase operations. Inverter 560 consists of PMOS pullup transistor 541, NMOS pulldown transistor 542 and PMOS feedback transistor 545. Inverter 560's output line 539 drives output terminal R1, the input of inverter 561 and the gate of feedback transistor 545. Inverter 561 generates a complement signal R1b to R1 and it consists of pullup transistor 543 and NMOS pulldown transistor 544. Feedback transistor 545's roll is to pull line 538 to 12 volts when line 537 is at 5 volts, thus electrically separating the drain voltage and source voltages of NMOS transistor 540 whose gate is at VCC of 5 volts.

The read operation mode of row decoder circuit 32-1 as applied to use with the memory array of U.S. Pat. No. 4,763,299 will now be described. The power lines VCC and VCVP are held at 5 volts and VSS is held at 0 volts. Also power line VSR, which is common to all decoder circuits 32-1 in decoder block 32, is held at "low" of 0 volt by the mode driver 60 through bus 66, as will be detailed below. At the same time mode driver 60 supplies through control bus 61 logic "1" of 5 volts to terminal TM2 of mux 360, and logic "0" of 0 volts to terminal TM1. This bias turns NMOS transistor 313 "off" and NMOS transistor 312 "on".

Upon selection of a row address at the inputs of the predecoders 52-i, a unique logic combination will appear on four-bit busses 55, 56 and 57, and as is detailed in reference to the row predecoders 52-i, in each of these busses one of the four bits is held "high" and three bits are held "low". These logic combinations appear at the inputs 55U, 56V and 57W of logic gate 340 through busses 55, 56 and 57 respectively. Also row address A14 appears at input A14/A14b of logic gate 340. Only one of the 64 row decoders 32-1 in row decoder block 32 can be selected for read operation, and this happens when all inputs of logic NAND gate 340 are held "high" at the same time. Once a decoder circuit 32-1 is selected the output line 332 of logic gate 340 is pulled down to "low" logic of 0 volts. The load of NAND gate 340 is comprised of a static element PMOS transistor 301 and a dynamic element PMOS transistor 308. The drive current of PMOS 301 is designed to be one tenth of the drive current of the series pull-down NMOS transistors 302-305. This is done in order to reduce the power consumption of the chip and at the same time eliminating the need for the predecoder circuits 52 to drive high capacitive load of a full-CMOS NAND gate, or having to pulse the gate of PMOS transistor 301, which complicates the circuit design and slows the address selection process. However by making PMOS 301 small the rise time of line 332 is slowed down, so PMOS transistor 308 was added with dynamic configuration. PMOS transistor 308 whose gate is controlled at line 331 by the output of phase-feedback inverter 341, is designed to have a drive current four time larger than the drive of PMOS 301 in order to speed-up the rise time of line 332.

Before NAND gate 340 is selected line 332 is at 5 volts and line 331 at 0 volts and pulldown NMOS transistors 302-305 see the maximum load of PMOS 301 and PMOS 308. After selection of a particular row decoder 32-1, line 332 is pulled down slowly until inverter 341 starts inverting the phase of line 332 and so quickly turn off the larger load transistor PMOS 308, so that only small transistor PMOS 301 remains as a load and the fall-time of line 332 is short. When NAND gate 340 is non-selected, that is, one of NAND transistor 302-305 is "off", the voltage of line 332 rises slowly initially due to the small pullup transistor PMOS 301, but once line 332 reached the trip point of phase-feedback inverter 341, line 331 fall to 0 volts quickly and turns strong PMOS transistor 308 "on" to speed-up the rise time of the output line 332 of NAND gate 340. The voltage of line 332 is transferred to word-line driver 342 through NMOS transistor 312 of mux 360. Word-line driver 342 inverts the selected decoder's "low" at line 332 to a "high" at line 334. This "high" state of 5 volts transfers to one word line of array 12 through one of the four transmission gates 351, 352, 353 or 354.

Only one of transmission gates 351, 352, 353 or 354, is selected by the control bus 58, which is the output of shared-predecoder 53 in response to the row address at the inputs of shared-predecoder 53. For example if line R1 of bus 58 is "high" and its complement line R1b is "low", than transmission gate 351 will be conducting since transistor NMOS 314 is "on" and transistors PMOS 315 and NMOS 316 are "off". Transmission gate 351 will transfer the "high" level of line 334 to word line terminal WL1, and so to the cells of array 12 and read operation will take place. At the same time bus 58's lines R2, R3 and R4 are at "low" and their complement lines R2b, R3b and R4b are at "high", so that transmission gates 352, 353 and 354 are not conducting. For example when line R2 of bus 58 is "low" and its complement line R2b is "high", than transmission gate 352 will not be conducting since transistors NMOS 317 and PMOS 318 are "off" and transistor NMOS 319 is "on". Transmission gate 351 will not transfer the "high" level of line 334 to word line terminal WL2, and transistor NMOS 319 will pull the voltage of terminal WL2 to "low" of 0 volts, which is the potential of terminal VSR during read operation. Since the voltage bias of transmission gates 353 and 354 is identical to that of transmission gate 352 they respond in the same way.

The program operation mode (program mode) of row decoder circuit 32-1 as applied to use with the memory array of U.S. Pat. No. 4,763,299 will now be described. The selection of one word-line for programming and the biasing of terminals TM1 and TM2 are done using bus 61 as in the read-mode, while VCVP and VCC are at 5 volts and VSS and VSR are at 0 volts. Once a particular word-line is selected to be programmed, the VCVP line is raised to a higher voltage VPP=12V, which is sufficient to perform programming along the word-line. The non-selected rows will not be programmed since they are grounded at VSS voltage by terminals WL1-WL4 of the unselected row decoders 32-1.

The operation of row decoder circuit 32-1 during chip erase operation, as applied to use with the memory array of U.S. Pat. No. 4,763,299 will now be described in reference to FIGS. 1, 8 and 31. The erase operation has two modes, the "page erase mode" and the "flash erase mode". In the page-erase mode memory cells along only one selected row are erased while memory cells along non-selected rows are not erased at the same time. In the flash-erase mode memory cells along all rows of the array are erased simultaneously.

During the page-erase mode, once the selection of the row decoder circuit 32-1 is completed, the mode driver 60, using bus 66, switches The VSR line from VSS of 0 volts to VPP of 12 volts as will be detailed below. At the same time mode driver 60 supplies through control bus 61 logic "1" of 5 volts to mux 360 terminal TM1, and logic "0" of 0 volts to terminal TM2. This biasing of TM1 and TM2 turns NMOS transistor 312 "off" and NMOS transistor 313 "on" in mux 360. Since the output 332 of the NAND gate 340 is inverted by phase-feedback inverter 341 whose output line 331 is "low" for the 63 unselected row decoders 32-1, this forces the output line 334 of word-line driver 342 to be "high". This "high" logic level, which is 5 volts during the row address selection process when VCVP=VCC, is delivered to one of the four word-lines selected by share-predecoder 53 through bus 58 in every one of the 63 unselected decoder 32-1.

Once the selection of a row-decoder 32-1 is complete, the VCVP line's voltage is increased to VPP of 12 volts by the mode driver 60. This causes the output lines 334 of word-line drivers 342 in all 63 unselected row-decoders 32-1 to be at VPP, so that one of four word-line selected by share-predecoder 53 will go to VPP voltage. For example if R1 bit is selected, transmission gate 351 is "on" and WL1 will go to VPP. The remaining three word-lines, which are not selected by share-predecoder 53 in each unselected row-decoder 32-1, will receive VPP-Vtn volts from the VSR line via NMOS transistors 319, 322 and 325.

The VCVP line in share-predecoder 53 is also taken to VPP voltage during erase mode, so as to turn "off" the PMOS transistors in the unselected transmission gates at the output of every row-decoder 32-1. This high voltage which turns the PMOS transistors "off", turns the NMOS transistors 319, 322 and 325 "on" during erase operation, so that the word lines which were not selected by bus 58's control of the transmission gates 351-354, will receive VPP-Vtn voltage from the VSR line.

In the selected decoder 32-1 the output 334 of word-driver 342 is at "low" voltage of 0 volts, before and after taking VCVP line from 5 volts to 12 volts. For example, the three unselected word lines WL2, WL3 and WL4 in the selected row-decoder 32-1 receive the high voltage of VPP-Vtn from VSR line in the same way it is done in the unselected row-decoders 32-1. The selected word-line WL1 to be erased, receives "low" of 0 volts from line 334 of row driver 342 in the selected row decoder 32-1. Thus when a VPP high voltage is applied to the erase lines ELi of FIG. 8 through line VPPEL, which is controlled by the mode driver 60 to all the memory array simultaneously, then the cells along the selected row will be erased. This operation of erasure is called the page-erase mode.

As will be described below the mode driver 60, provides VCC voltage of 5 volts during flash-erase mode to the XDVSS line of row decoder block 32, which causes all WLi terminals at the output of each row decoder circuit 32-1 (FIG. 4) to VSS voltage of 0 volts. By doing so and at the same time applying VPP voltage of 12 volts to the VPPEL line from the mode driver 60, the erasure of the entire memory array 12 (FIG. 1) is performed simultaneously. This operation of erasure is call the flash-erase mode.

Improvements to the decoder circuits can be made in the following manners: PMOS transistors (not shown) may be added in parallel to each of NMOS transistors 316, 319, 322 and 325 that transfer the VSR signal to word-lines WL1-WL4. The gates of these PMOS transistors would be driven by true R1-R4 signals of bus 58. The advantage will be that full VPP voltage is delivered to the word-line without Vtn (threshold voltage) drop across the NMOS transistors 316, 319, 322 and 325. The disadvantage is that the layout of an additional transistor in the memory cell pitch is very difficult. Also the additional PMOS transistors load the output of the share-predecoder 53, thus slow the chip down.

Figure 13:
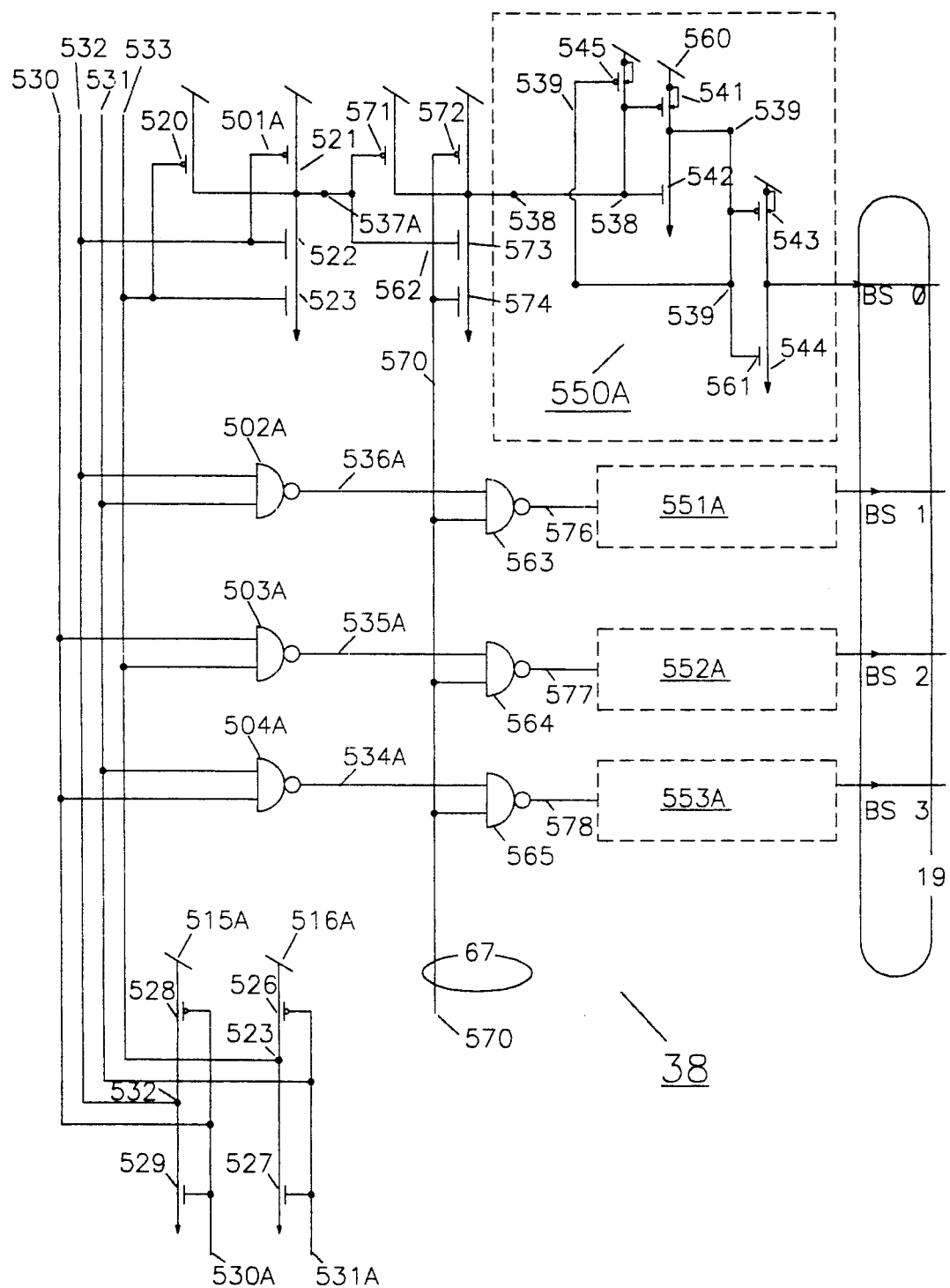
FIG. 13 is a circuit diagram of a two-to-four column byte-select decoder circuit.

Referring to FIG. 13 the byte-select decoder 38 is illustrated. As in the shared row-predecoders 53, here too the two-to-four decoding is accomplished using NAND gates. The output terminals are BS0, BS1, BS2 and BS3, which connect to bus 19 drive the second-level-mux 24SL. Output terminals BS0-BS3 are driven by bus 19 drivers 550A, 551A, 552A and 553A respectively. The voltage isolation NMOS transistor 540 was removed from bus driver 550A since the maximum high voltage swing required is 5 volts, otherwise the circuit of bus drivers 550A-553A are similar to the circuits of bus drivers 550-553 of the share row predecoder 53 of FIG. 12. The input terminals 530A and 531A of byte-select decoder 38 are controlled by address inputs A3 and A4 respectively and the response of the four NAND gates 501A-504A to changes in logic combination of input terminals 530A and 531A of this byte-select decoder 38 are similar to those of shared row-predecoder 53. Byte-select decoder 38 also contains another set of two inputs NAND gates 562, 563, 564 and 565 that control the signals between NAND gates 501A-504A and the bus drivers 550A-553A. Each of these NAND gates 562-565 has an input that connects to input terminal 570, which is at 5 volts during read operation, but goes to 0 volts during some period of the programming operation as will be explained below. Taking input terminal 570 to 0 volts forces all output terminals BS0-BS3, which connects to bus 19, to be at high logical state of 5 volts simultaneously. The CMOS NAND gate 562 consists of PMOS pullup transistors 571 and 572 and NMOS pulldown transistors 573 and 574. One of the inputs of NAND 562 connects to input terminal 570, the second input comes from the output of NAND gate 501A at line 537A. The output of NAND gate 562 is at line 538, which is also the input line of bus driver 550A. In the same manner NAND gate 563's second input comes from NAND 502A's output at line 536A and NAND 563's output line 576 is also the input of bus driver 551A. Also NAND gate 564's second input comes from NAND 503A's output at line 535A and NAND 564's output line 577 is also the input of bus driver 552A, and so NAND gate 565's second input comes from NAND 504A's output at line 534A and NAND 565's output line 578 is also the input of bus driver 553A.

Figure 14:
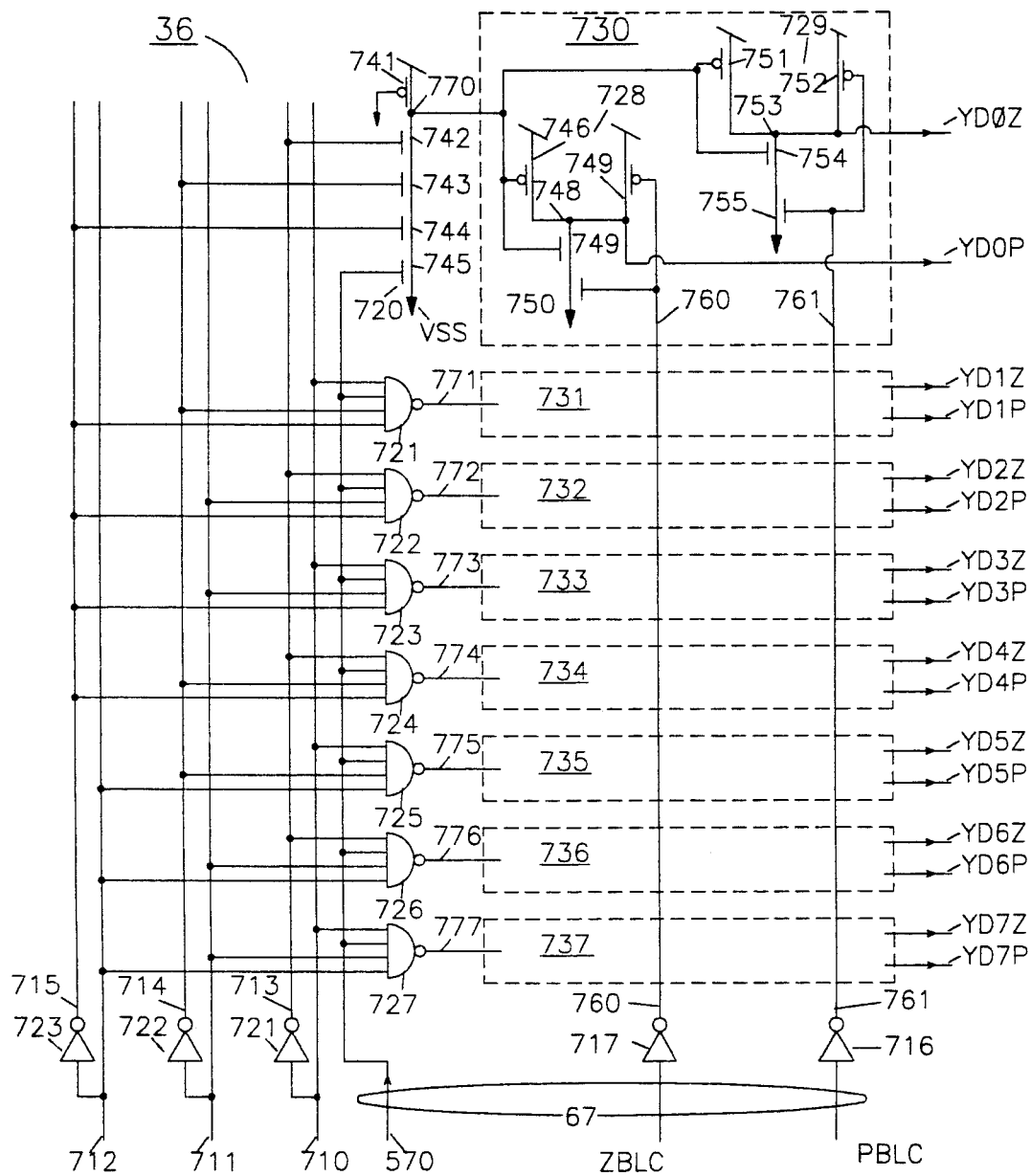
FIG. 14 is a circuit diagram of a three-to-eight column decoder circuit.

Referring to FIG. 14 the column decoder 36 is illustrated. The three-to-eight decoding is accomplished using NAND gates. The column decoder 36 has three input terminals 710, 711 and 712, which accept three column address inputs and generate two sets of eight outputs. One set of eight outputs drives terminals YD0Z, YD1Z, YD2Z, YD3Z, YD4Z, YD5Z, YD6Z and YD7Z, the other set of eight outputs drive terminal YD0P, YD1P, YD2P, YD3P, YD4P, YD5P, YD6P and YD7P. The eight output terminals YD0Z-YD7Z connect to bus 20, which drives one set of control inputs to the first-level-mux 24FL which are the gates of transistors MZi in FIG. 9. The eight output terminals YD0P-YD7P connect to bus 21, which drives a second set of control inputs to the first-level-mux 24FL which are the gates of transistors MPi in FIG. 9. Column decoder 36 has two additional inputs lines ZBLC and PBLC, which are controlled by the mode driver 60 through bus 67 (FIG. 1), as will be detailed below. Each of the eight NAND gates 720, 721, 722, 723, 724, 725, 726 and 727 decodes one of the eight logic combinations presented at lines 710, 711, 712, 713 by the three addresses at the input lines 710, 711 and 712. Each of the NAND gates 720-727 has three address inputs, one control input that is connected to line 570 and one output. For example NAND gate 720 consists of one PMOS pullup transistor 741 whose gate is connected to VSS and is at 0 volts and four series pulldown transistors 742, 743, 744 and 745. The inputs of NAND gate 720 are lines 713, 714, 715 and 570 and the output is at line 770. In the same manner the three address inputs of each of the NAND gates 721-727 are connected to one unique combination of the lines 710-715, and each NAND gate 721-727 has an input that is connected to line 570 as shown in FIG. 14. The outputs of NAND gates 721-727 are lines 771-777 respectively.

The output 770 of select NAND 720 connects to a dual-bus driver 730, which drives one output terminal YD0Z that connects to bus 20 and a second output terminal YD0P that connects to bus 21. Dual-bus driver 730 also has two control inputs 760 and 761, which are the logic complements of the signals at input lines ZBLC and PBLC respectively and are generated by CMOS inverters 717 and 716 respectively. During read operation inputs 760 and 761 are held at 5 volts and allow normal decoding operation, however as will be detailed below, one of inputs 760 and 761 is held at 0 volts during portion of the programming operation, forcing all bits of either bus 20 or bus 21 to a "1" logical state simultaneously.

Dual-bus driver 730 consists of two separate two-input NAND gates 728 and 729, each receives the output 770 of select NAND gate 720, but NAND 728 drives output terminal YD0P and NAND 729 drives output terminal YD0Z. NAND 728 consists of PMOS pull-up transistors 746 and 747 and NMOS pulldown transistors 749 and 750. A first select input of NAND 728 connects to line 770, the second input connects to line 760 and the output line 748 connects to output terminal YD0P. NAND 729 consists of PMOS pullup transistors 751 and 752 and NMOS pulldown transistors 754 and 755. A first select input of NAND 729 connects to line 770, the second input connects to line 761 and the output line 753 connects to output terminal YD0Z. The other seven dual-bus drivers 731-737, have identical circuit schematic as that of dual-bus driver 730, and they all share the same control inputs 760 and 761. The first select input of each dual-bus driver 731, 732, 733, 734, 735, 736 and 737 connects to one of select-NAND outputs lines 771, 772, 773, 774, 775, 776 and 777 respectively. Each of the dual-bus drivers 731-737 drives a pair of the output terminals according to the following arrangement: dual-bus driver 731 drives output terminals YD1Z and YD1P, 732 drives YD2Z and YD2P, 733 drives YD3Z and YD3P, 734 drives YD4Z and YD4P, 735 drives YD5Z and YD5P, 736 drives YD6Z and YD6P, and 737 drives YD7Z and YD7P.

As was indicated above each of the eight NAND gates 720-727 has an input that connects to input line 570, which is at 5 volts during read operation, but goes to 0 volts during some period of the programming operation as will be explained below in reference to FIGS. 28 and 31. Taking input terminal 570 to 0 volts forces lines 770-777 to a "high" logical state. These "high" state on lines 770-777 forces all eight lines YD0-P–YD7P of bus 21 to a "low" logical state of 0 volts simultaneously if at the same time the signal on line ZBLC is at "low" state. Alternatively these "high" state on lines 770-777 forces all eight lines YD0-Z–YD7Z of bus 20 to a "low" logical state of 0 volts simultaneously if at the same time the signal on line PBLC is at "low" state.

The theory and the logic behind the control of the cross-point switch 27 by the Least-Significant-Bit (LSB) of the row address buffer (not shown) in order to find the location of the drain 103 of a memory cell 100 along a particular column of memory array section 14 of array 12 will now be described. This method of addressing two dimensional array's column location using a row address may find applications in other types of semiconductor memories such as ROMs, Dynamic RAMs and Static RAMs, as well as, in arrays of Liquid Crystal displays (LCD).

Figure 15:
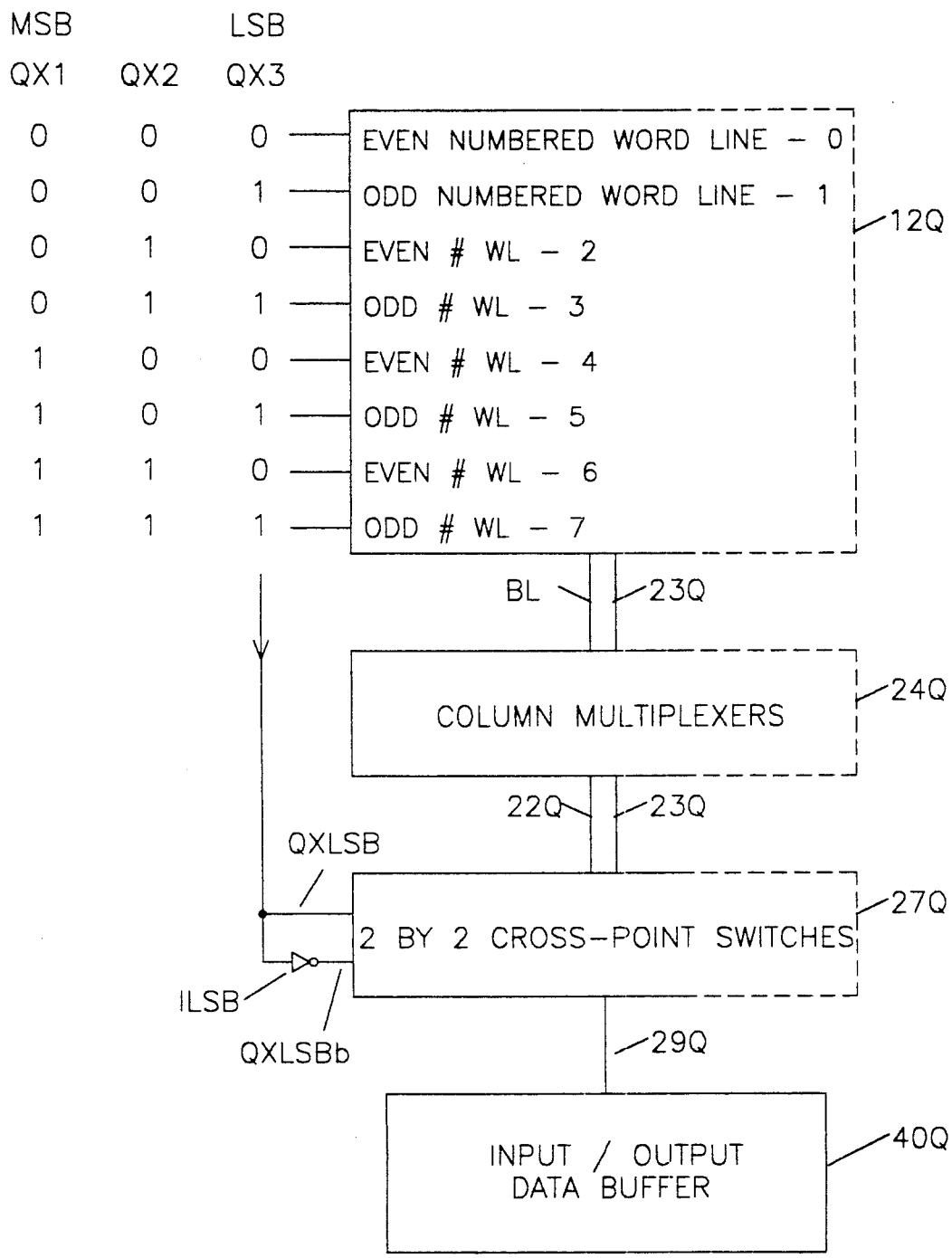
FIG. 15 is a block diagram of a memory illustrating the use of the least-significant-bit of the row address together with a cross-point switch to select a memory cell.

Referring to FIG. 15, it describes a two dimensional memory array block 12Q having eight rows and any number n columns. Each row has a corresponding word-line and so the number of the word-line is indicated in block 12Q of FIG. 15. In order to select one word-line, eight binary combinations of three address inputs QX1, QX2 and QX3 are hardware programmed to the word-lines, as is well known is the art. The four even-numbered word-lines 0, 2, 4, and 6 connect to combinations where the Least-Significant-Bit QX3 is "0". It is also seen that the four odd-numbered word-lines 1, 3, 5, and 7 connect to combinations where the Least-Significant-Bit QX3 is "1". This is true regardless of the data of other row address bits. It is therefor possible to use the QX3 signal and its complement QX3b in order to coordinate the selection of a given memory cell in the array 12Q according to a cell feature which is related to the position of that given cell along a given column and to an odd or to an even word line. In this embodiment a cross-point switch 27Q is used in order to route memory cell data to line 29Q of the Input-Output Data Buffer 40Q.

Memory cell sense-data that is selected by an even-numbered word-line from a column of a memory array 12Q, a portion of is similar to array section 14 of FIG. 2, on a first bit-line will be routed to line 22Q by the column address decoding circuit (not shown), while the second bit-line of the same column is routed to line 23Q. The LSB row-address bit QX3, which in this case is the signal QXLSB, and its complement QXLSBb that is generated by inverter ILSB, control the cross-point switch 27Q. The sense-data on line 22Q will be routed by cross-point switch 27Q to I/O Data-Buffer 40Q when QXLSBb="1" and at same time line 23Q is routed to ground. On the other hand memory cell sense-data that is selected by an odd-numbered word-line from the same column on the second bit-line will be routed to line 23Q by the column address decoding, while the first bit-line of the same column is routed to line 22Q. Therefor under the control of the LSB row-address bit QX3, sense-data on line 23Q will be routed by cross-point switch 27Q to I/O Data-Buffer 40Q when QXLSB="1" and QXLSBb="0". At the same time line 22Q is routed to ground. A cross-point switch 27Q may be identical to cross-point switch 27 of FIG. 9.

Figures 16, 17:
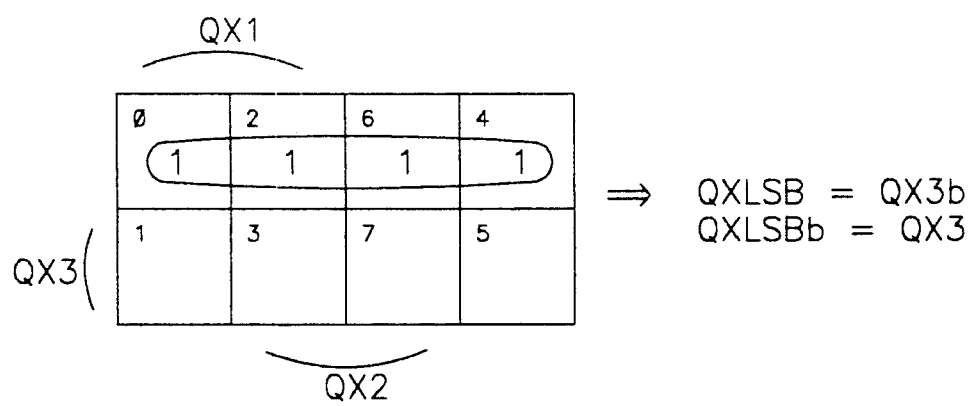
FIG. 16 is a truth table for generating the control signals of the cross-point switch of FIG. 15.
FIG. 17 is a karnaugh map for generating the control signals of the cross-point switch of FIG. 15.

FIG. 16 is a truth table for the desired QXLSB and QXLSBb functions, and FIG. 17 is a Karnaugh map for the desired QXLSB and QXLSBb functions. Both prove the conclusion relative to FIG. 15 to be true.

FIG. 18 is a truth table describing a well known in the art logic function of a two-to-four predecoder, such as the logic function of shared-predecoder 53 of FIG. 6. The row address input consists of bit XA7 and the Least-Significant-Bit XA12. The output bits of the two-to-four predecoder are R1, R2, R3 and R4 and for the sake of simplicity the logic complements R1b, R2b, R3b and R4b are not indicated in FIG. 18. During read operation when output bits R1-R4 are connected by bus 58 of FIG. 1 to row-decoder circuit 32-1 of FIG. 4, so as to control transmission gates 351, 352, 353 and 354, then only one word-line terminal WL1, WL2, WL3 or WL4 will be selected.

From FIG. 18 one can see that the logical state of R2 and R4 that select the even-numbered word-line terminals WL2 and WL4 in every row-decoder circuit 32-1 is "1" when the logical state of the LSB bit XA12 is "1", regardless of the logical state of the other address bit XA7. Also the logical state of R1 and R3 that select the odd-numbered word-line terminals WL1 and WL3 in every row-decoder circuit 32-1 is "1" when the logical state of the LSB bit XA12 is "0", regardless of the logical state of the other address bit XA7. Since bus 58 lines R1–R4 connect to all row- decoder circuits 32-1 in row-decoder block 32 (FIG. 1) in an identical manner, the least-significant-bit of the row-address input will always be the bit that determines whether an odd-numbered or an even-numbered word-line is selected, regardless of the information of the higher significance row address bits.

In some embodiments of the present invention, for example when a cross-point switch column decoding is added to an Orthogonal Array Segmentation architecture like the one shown in FIG. 1, page 41 of a paper by B. Ashmor, et. al. published in 1989's International Solid State Conference digest of papers and incorporated herein by reference, the control signals XLSB and XLSBb may be generated locally near every array segment from the R1–R4 signals of a global bus.

In the Orthogonal Array Segmentation architecture several arrays 12 are build on the same chip, each will have dedicated column decoding, cross-point switch 27 and sense amplifier blocks 40, but all will share the same row address A5–A12 and shared-predecoder 58, it is advantageous to reduce the number of interconnects from the least-significant-bit address input to each cross-point switch 27 associated with an array 12 in order to reduce capacitive load on the address buffer. This reduction in interconnect length can be achieved, as shown in FIG. 19, by locally generating the XLSB control signal from R2 and R4 lines of bus 58 by an OR logical gate that includes CMOS NOR gate 861 whose output on line 862 drives CMOS inverter 863, as well as, generating the XLSBb control signal from R1 and R3 lines of bus 58, by an OR logical gate that includes CMOS NOR gate 864 whose output on line 865 drives CMOS inverter 866.

Another example in FIG. 20 illustrates a truth table of a three-to-eight shared-predecoder for use with a row-decoder circuit, which has eight word-line multiplexers in the output. The row address inputs are KX1, KX2 and KX3 and the output of the shared-predecoder are KR1-KR7. The control inputs KXLSB and KXLSBb to the cross-point switch can be generated directly from the LSB bit KX3. Alternatively as illustrated in FIG. 21, KXLSB can be generated by an OR logical function of lines KR0, KR2, KR4 and KR6 that includes CMOS NOR gate 871 whose output on line 872 drives CMOS inverter 873, as well as, generating KXLSBb by an OR logical function of lines KR1, KR3, KR5 and KR7 that includes CMOS NOR gate 874 whose output on line 875 drives CMOS inverter 876.

The above examples showed that the control signals for the cross-point switch 27 can be generated from the least-significant-bit of the row address or alternatively from logical combinations of predecoded binary signals Ri-Rj generated from a minimum of one row-address bit containing the least-significant-bit, which also controls the outputs of all the row-decoder circuits 32-1. This decoding scheme ensures that any memory cell 100 in the array 12 can be accessed at random and receive, if it is so desired, the same voltage biasing conditions as those applied to any other memory cell 100 during a given cycle or mode of operation. In this first embodiment each of the memory cells 100 stores binary data of "0" and "1" and it is therefor desired that each of the memory cells 100 will receive that same voltage biasing conditions in order to exhibit the same value of drain-source drive current Ids corresponding to the two binary states in order to simplify the design of a sense amplifier 40 and also to minimize read access time pattern sensitivity. Strong pattern sensitivity causes slow sensing time specifications on the data sheet of an Integrated Circuit memory component where fast access time is very important and commands high selling price. This generally induces lower selling price and a smaller customer market size.

The cross-point-switch 27 of this embodiment is inserted between the memory array sections 14 and the sense amplifier block 40, so it must be able to transfer the analog signal of the memory cells to the sense amplifier 40. Therefor it was implemented by means of CMOS transmission gates.

In order to achieve fast read access time and simplify the column decoding circuitry, the row address bit that controls the cross-point-switch 27 does not interfere with the column address decoding circuitry of blocks 36 or 38 directly or indirectly. Also, the present invention avoids the use of an additional time and chip area consuming Boolean logical function generator that will perform a function between the row and column address bits to generate a flagging signal that will coordinate the location of the drain 103 of a selected transistor 100 with a given odd or with an even numbered word line.

A first case of a bad decoding scheme which is to be avoided because it causes a strong pattern sensitivity will now be described in reference to FIG. 2. Using some first hypothetical decoding scheme a memory cell 100 along a given column 70 and along an even numbered row 84 has been selected for reading. Its drain 103 is connected to an even numbered bit line BL0 and its source 104 is connected to an odd numbered bit line BL1. The first hypothetical decoding scheme will route BL0 to the sense amplifier (not shown) and also route BL1 to the VSS line with a voltage of 0 volts. Assuming the cell 100 is not programmed it will conduct Ids current and the sense amplifier will sense the Ids current of the cell and will introduce the corresponding logical state to the output pad. During another reading cycle of the memory array section 14 the same column 70 is selected by the unknown decoding scheme, however now a memory cell 100 along an odd numbered row 83 is selected for reading. Since the first hypothetical decoding scheme is not the one used by the present invention, it will still route BL0 to the sense amplifier and BL1 to the VSS line. The sense amplifier will now sense the source-drain current Isd which is significantly lower than the Ids current due to the asymmetry designed into the memory cell. This will cause a significant delay through the sense amplifier and the data at the output pad will arrive slower than the case where the cell 100 of an even numbered row was selected. Further more, those skilled in the art will realize that if this first hypothetical decoding scheme were used to select the memory cell 100 along column 70 and row 83 for programming, the high programming voltage VPP will be still routed to the BL0 which is now connected to the source of the selected memory transistor 100. Under this voltage bias condition the cell 100 that includes a split-gate transistor with the asymmetry feature will not program since a high source to drain voltage Vsd will not induce hot electrons injection under the floating gate 101. This in turn will make the memory array section 14 inoperative for practical purposes because half of the memory cells 100 cannot be programmed.

A second case of a decoding scheme which is to be avoided even though it may be able to correctly access one column in a section at a time thereby solve the problem with the first hypothetical scheme, but will increase the physical area of the chip 10. For example the second hypothetical scheme may use circuits that require more than two transistors per bit line in the column multiplexer 24 that interfaces with the array 12. The assignment of more that two transistors per any bit line, even to one bit line every eight columns, may increase the chip size to a point where any chip size reduction that was gained by the use of the staggered floating gates architecture will be diminished. For example in the present embodiment the array 12 has 512 columns. If four transistors were used to interface with every eight column and two to the other regular columns, then the geometrical pith required to accommodate the eighth column and its four transistors interface will be that of two regular columns. Because there are 64 eighth columns along any row, the width that is equivalent to 64 regular columns will be added to the size of the array 12 in the direction of the word lines. This is especially true if this second hypothetical scheme were used in conjunction with memory array of U.S. patent application Ser. No. 07/377,311, now U.S. Pat. No. 5,099,297 in which a very narrow column pitch is achieved due to the use of a new fabrication method. This increase in array size reduces production yield exponentially and therefor is counter-productive to low cost manufacturing.

Figure 22:
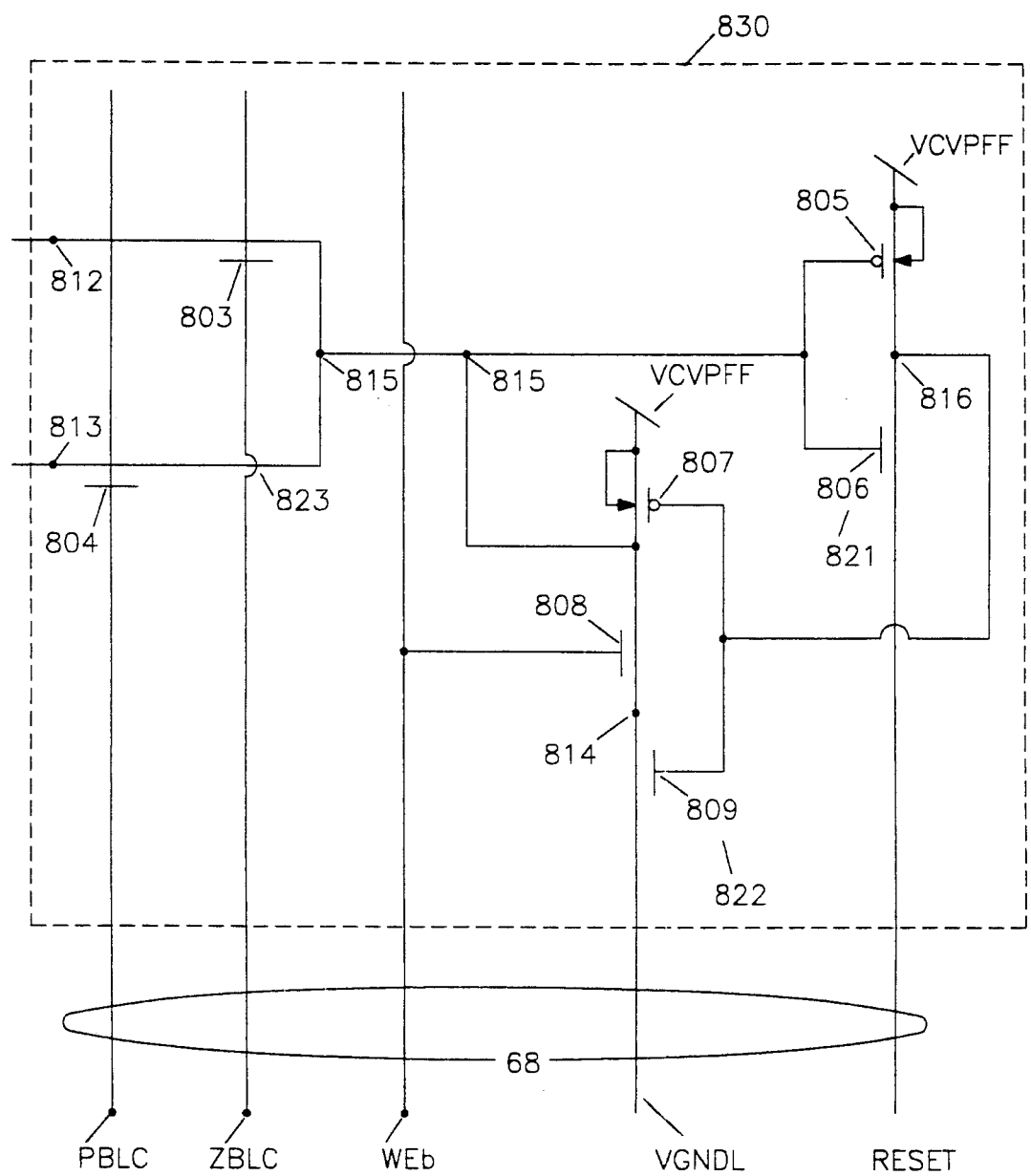
FIG. 22 is a circuit diagram of a column latch that uses mostly NMOS transistors according to the present invention.

FIG. 22 shows the circuit for the columns latch 830. A pair of adjacent columns, for example column 70 and column 71 of FIG. 7, share one columns latch 830 located at one end of the array 12. This is done in order to physically fit the column latch circuit 830's layout in the geometrical pitch of the small memory cells. Since every array section 14 has thirty two columns, each array section 14 will be served by sixteen columns latches 830, which constitute a columns latches block 88 shown in FIG. 1. In this embodiment there are sixteen column latches blocks 88 used for the array 12 and they are numbered 88-1 to 88-16 in FIG. 1. The storage means 830 includes inverter 821, inverter 822 and a latch-column-routing multiplexer 823 resulting in a clocked D-Flipflop.

Inverter 821 is comprised of PMOS pullup transistor 805 and NMOS pulldown transistor 806. The gate of PMOS 805 connects to line 815, its drain connects to line 816 and its source and bulk to the VCVP power line. The gate of NMOS 806 connects to line 815, its drain connects to line 816 and its source to an input-output terminal RESET. As will be detailed below the RESET terminal is held at VSS voltage of 0 volts in order for inverter 821 to function as logic inverter, and only during some periods of the programming mode the RESET terminal is taken to VCC voltage of 5 volts in order to clear the information in the column latch 830. Inverter 822 consists of PMOS pullup transistor 807, a pulldown transistor NMOS 808 and a second pulldown transistor NMOS 809. The gate of PMOS pullup 807 connects to line 816, its drain connects to line 815 and its source and bulk to the VCVP power line. The gate of NMOS 808 connects to an input terminal WEb, its drain connects to line 815 and its source to line 814. The gate of NMOS pulldown 809 connects to line 816, its drain connects to line 814 and its source to the VGNDL line that is controlled by the mode driver block 60 to receive the VSS ground line voltage of 0 volts during read and erase modes and during some period of the programming cycle described below in reference to FIG. 32 as the LLT time period. However during the period of the actual programming of the memory cells 100, described below in reference to FIG. 32 as the Tpg period, line VGNDL is routed by the mode driver 60 to a higher voltage of VCC-Vtn that is supplies to node 815 and from there to the selected bit line as the "low" logical state, while the voltage representing "high" logical state on node 815 during the Tpg period is the VPP voltage of 12 volts.

Still referring to FIG. 22, the latch-column-routing mux 823 is a two-to-one multiplexer and it includes NMOS transistors 803 and 804. Mux 823 has a column-latch input-output line 812 that connects to the source of NMOS 803 and that is routed by another mux 875, that is shown below in FIG. 24, to an even numbered bit line of a selected column in array section 14. Mux 823 has another input-output line 813 that connects to the source of NMOS 804 and directly to an odd numbered bit-line of the same selected column in array section 14. The third input-output line of mux 823 is line 815, which is also the data storage line of columns latch 830. Line 815 connects to the drain of NMOS 803 and to the drain of NMOS 804, as well as, to the input of inverter 821 and the output of inverter 822 of the columns latch 830. Mux 823 has two control input lines PBLC and ZBLC, which arrive on bus 68 from mode driver 60 and which are input terminals to columns latch 830. Terminal ZBLC connects to the gate of NMOS 803 and terminal PBLC connects to the gate of NMOS 804. Signals PBLC and ZBLC are the same signals that go to column decoder 36 of FIG. 14.

During read mode of the EEPROM control terminals PBLC and ZBLC are held at 0 volts, which is the logical "0" state, by the mode driver 60 through bus 68. This turns NMOS 803 and NMOS 804 "off" and isolated columns latch 830 from the input-output lines 812 and 813.

During some periods of the programming mode, data from D0-D7 pads (FIG. 1) of the EEPROM chip 10 are transferred from data-in block 41 through bus 29 (FIG. 1) with a full voltage swing of VCC of 5 volts to VSS of 0 volts to the column routing blocks 28, 27 and 24 (FIG. 1). Bit line select mux block 24-i drive the bit-lines with a reduced "1" logic voltage level of Vcc-Vtn volts, that is VCC minus the threshold voltage of an NMOS transistor (Vtn) used in the multiplexer of block 24. The input data routed through max 823, when one of the control terminals PBLC or ZBLC is held "high", to line 815 to be stored in the storage line 815 of latch, while terminal WEb is held at "0" logical state, so that NMOS 808 is "off". Once the data is written into column latch 830 from the data-in block 41, the voltage of the VCVP is raised from VCC of 5 volts to VPP of 12 volts and so is the selected control terminal ZBLC. If line 815 stored "1" logical state then line 815 will be also pulled to 12 volts causing the voltage of line 812 to increase to VPP-Vtn value of about 9 volts, which is needed for programming a selected memory cell. Transistor NMOS 808 is turned off during the writing from the memory array bit-line into the latch 830, in order to cut the transient current path from VCVP to VSS of inverter 822, thus assist PMOS 807 to pull line 815 to a full VCC voltage level, or logic "1", since NMOS 803 in mux 823 will cut off when line 815 reaches VCC-Vtn volts. When writing "0" into line 815 from the same line 812, NMOS transistor 803 is in saturation, since its source line 812 is at 0 volts and its gate is at VCC of 5 volts, as before because control terminal ZBLC is at "1" state. This bias enables NMOS 803 to pull line 815 to 0 volts quickly, since PMOS 807 is designed to be a smaller transistor with a smaller drive current then NMOS 803. Making PMOS 807 smaller then NMOS 803 makes an additional PMOS transistor in series to PMOS 807 driven by a complement WEb signal superfluous, thus reducing the number of transistors in the latch 830 to allow a smaller layout area.

Several advantages of the column latch of the present invention over prior art are as follows: The use of enhancement PMOS and NMOS transistors only, such that there is no need for an additional masking step to accommodate a depletion transistor. The use of the RESET signal to clear the data in latch 830 that also provides a ground path to inverters 821 eliminates the need for a dedicated RESET transistor, thus reduces the layout area for the latch. The use of mostly NMOS transistor and only two PMOS transistors enables routing of signal lines within latch 830 to be accomplished using N+ diffusion, which eliminates the need for several metal to diffusion contacts, thus further reduces the layout area of the latch 830. The fact that there is no metal contact between the NMOS transistors 808 and 809 is especially important since this allows the use of a very short physical spacing between their gates. The storage node is between the PMOS and transistor 807 and the NMOS transistor 808, where there exists a metal contact anyway for the formation of the inverter 822. Also, lines 815 and 816 provide full VCC and VSS levels during the writing of the data into the latch 830 and also provide full VPP and VGNDL voltage levels during programming mode, which ensure that there is no parasitic current path from the high voltage source VPP, such as a charge-pump, to ground VSS or to VGNDL exists. Another advantage is the fact that column latch 830 does not have any dynamic lines that require periodic refresh pulse, consume excess power and are sensitive to variations in fabrication process.

Bus 68 delivers signals PBLC, ZBLC, WEb and RESET to all columns latches 830 in all columns latches block 88 of the EEPROM chip 10 from mode driver 60.

Figure 22A:
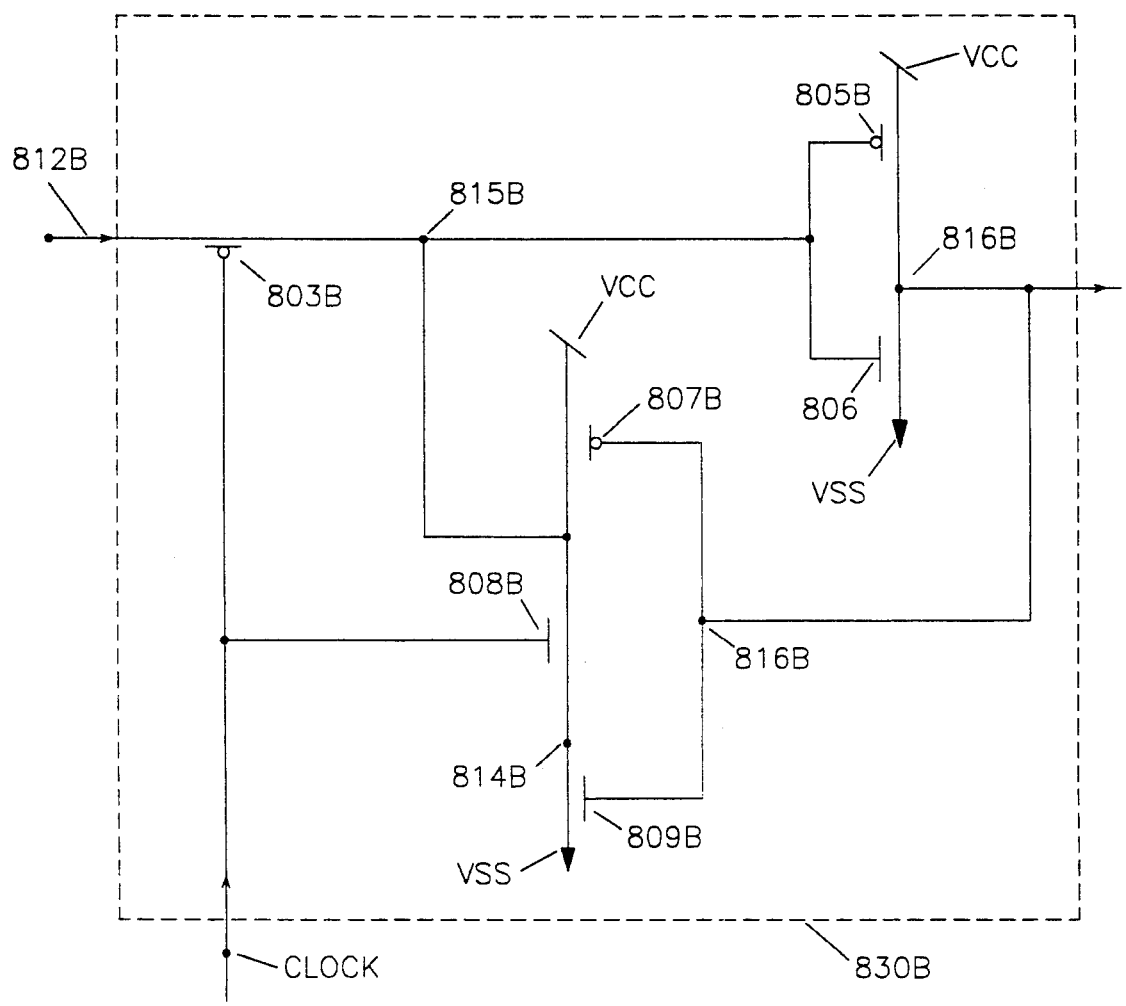
FIG. 22A is a circuit diagram of the column latch of FIG. 22 that is modified for use as a D-flipflop circuit that is advantageous for use in any digital integrated circuit.

The clocked D-flipflop (D-FF) of FIG. 22 can be used as a storage means in other digital circuits if the sources of NMOS transistors 806 and 809 are connected to the VSS line as is shown in FIG. 22A. In FIG. 22A the mux 823 was replaced by a single PMOS transistor 803B whose gate is connected to the clock input of the D-flipflop 830B. Also transistor 808 was replaced by NMOS transistor 808B whose gate connects to the clock input. The data-out node of D-FF is from node 816B and the data-in is from node 812B.

Figure 23:
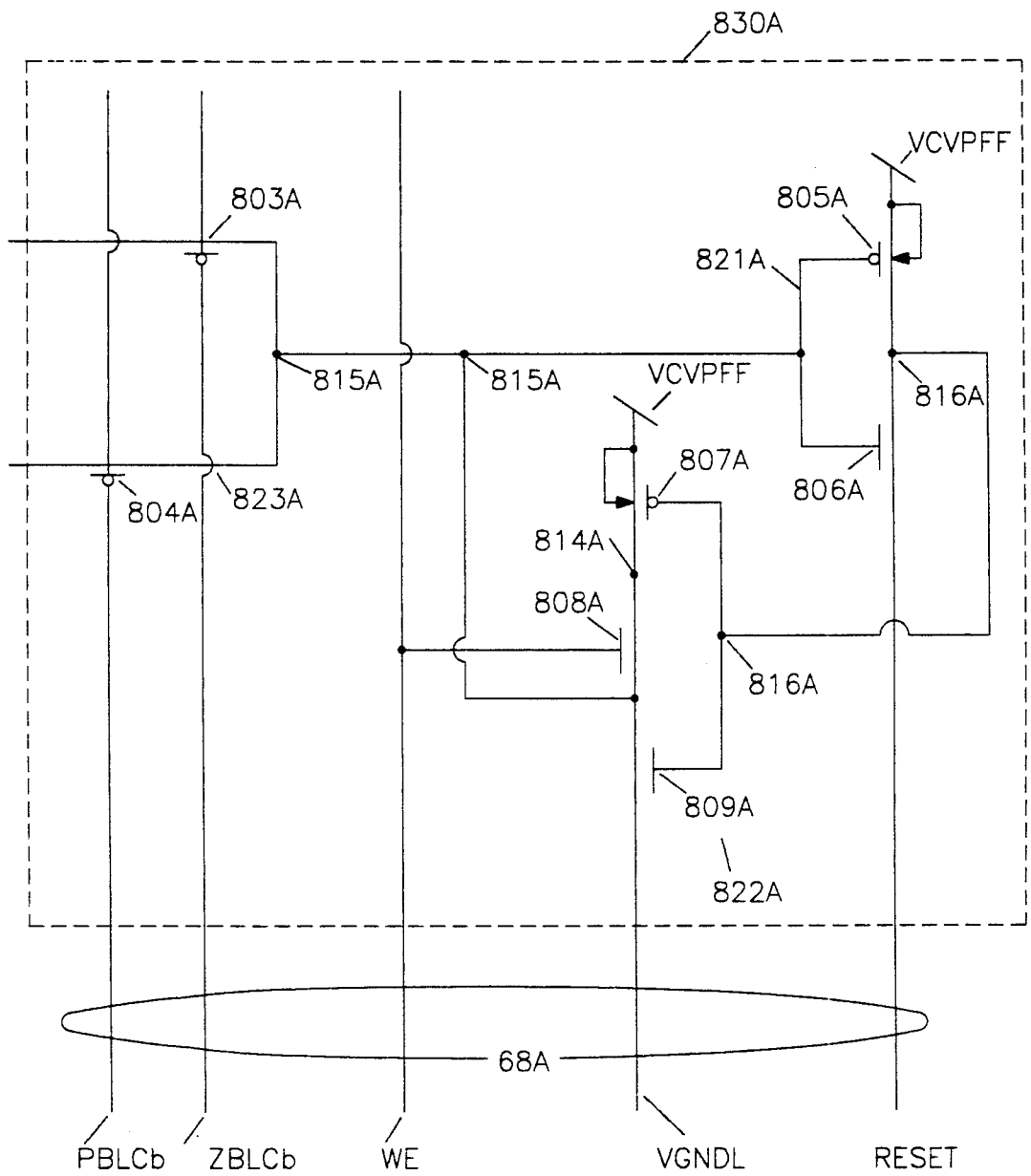
FIG. 23 is a circuit diagram of a column latch that uses mostly PMOS transistors according to the present invention.

FIG. 23 shows another embodiment of columns latch 830A, which uses mostly PMOS transistors. The use of PMOS transistors especially in mux 823A is advantageous when supplying high voltage VPP of 12 volts during programming to the bit-line of a memory cell such as the cell of U.S. Pat. No. 4,845,538 which can be programmed without the injection of hot electrons from the bulk. The operation of latch 830A of FIG. 23 is similar to that of latch 830 of FIG. 22, with the understanding that the logic levels of the signals of bus 68 are adjusted to the fact that mostly PMOS transistors are used. The output of inverter 822A at line 815A was also moved to accommodate the fact that 0 volts on line 812 from the memory array bit-line will pulldown line 815A only to VSS+Vtp voltage above ground, which is the threshold voltage of a PMOS transistor above VSS.

Figure 24:
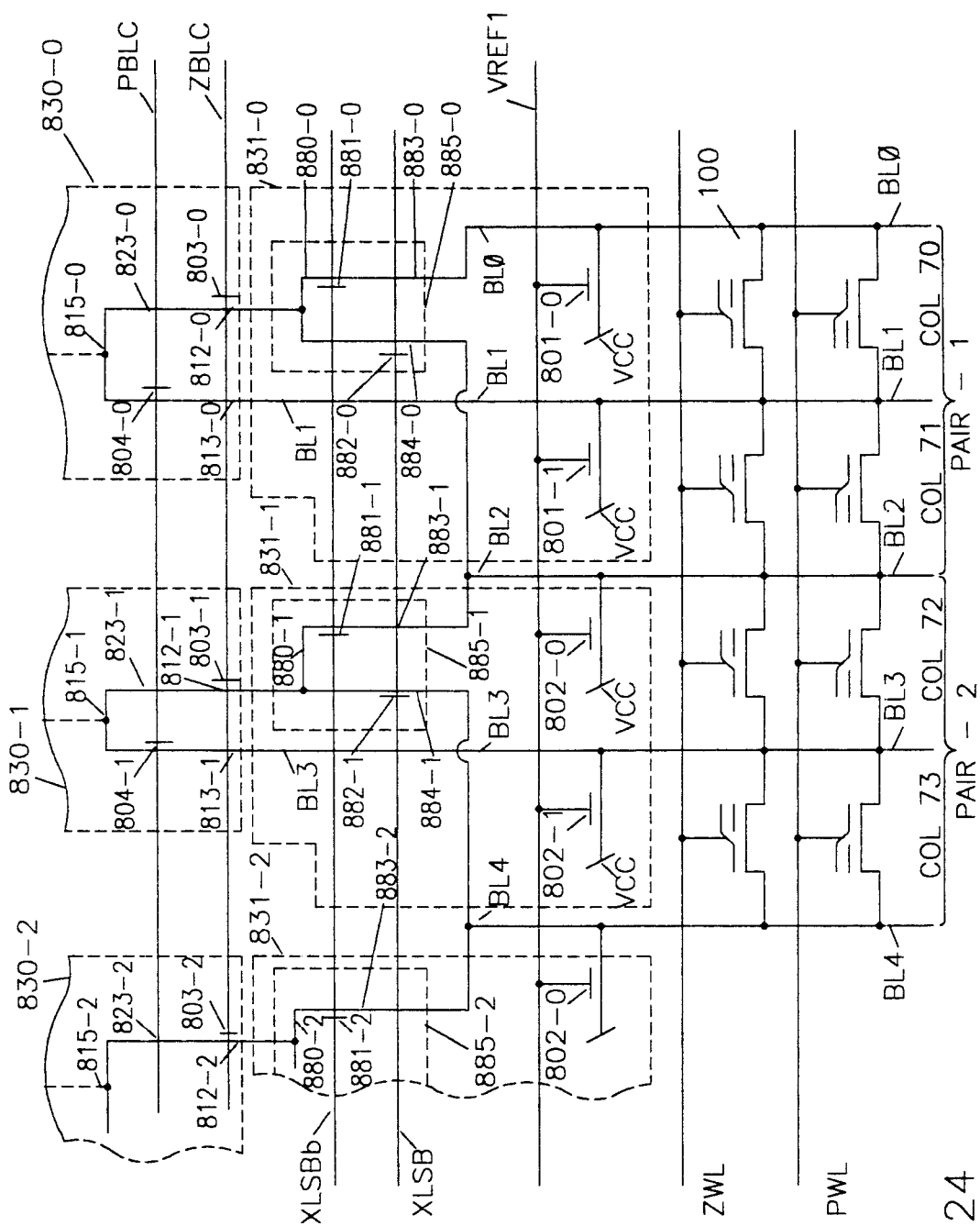
FIG. 24 is a circuit diagram of a column latch to row coordinator and its interface to memory array, to the column latch circuit and to neighboring column latch coordinators.

FIG. 24 illustrates two complete units of the latch to row coordinator (LTRC) circuit 831-0 and 831-1, each is used to interface an associated column latch circuit 830 to its associated pair of columns in a way than enables the delivery of the latch data to the drain of a memory transistor in any cell along a selected column while taking into account the association of the cell with an even numbered row or with an odd numbered row. FIG. 24 also illustrates parts of a third LTRC circuit 831-2 and parts of three column latch circuits 830-0, 830-1 and 830-2 as well as part of two pairs of columns, pair-1 and pair-2, that show part of one even numbered row ZWL and part of one odd numbered row PWL of array section 14.

The LRTC circuit 831 will be described in reference to LTRC circuit 831-1 and its interaction to the surrounding circuits. The latch to row coordinator (LTRC) circuit 831 includes the latch to row coordinator multiplexer (LTRC-mux) 885 and two column pullup NMOS transistors 801 and 802.

The LTRC-mux 885 will be described with reference to LTRC-mux 885-1, because all LTRC-mux 885-i are identical. LTRC-mux 885-1 is a two-to-one multiplexer that passes information to and from line 880-1 and line 883-1 or line 884-1 in both directions during the programming operation mode of the chip 10. Line 880-1 connects to node 812-1 of the column latch 830-1 and lines 883-1 and 884-1 connect to the even numbered bit lines BL2 and BL4 of pair-2 respectively. The signal path between line 880-1 and line 883-1 is controlled by NMOS transistor 881-1 whose drain connects to line 880-1, whose source connects to line 883-1 and whose gate connects to the complement of the Least-Significant-Bit, XLSBb line of the row address. The signal path between line 880-1 and line 884-1 is controlled by NMOS transistor 882-1 whose drain connects to line 880-1, whose source connects to line 884-1 and whose gate connects to the Least-Significant-Bit, XLSB line of the row address, which in this embodiment is address line A12. The XLSB and XLSBb lines connect to all the LTRC-muxes 885-i in the same fashion. Those skilled in the art will realize that it is desirable to control the XLSB and XLSBb lines so that they will be gated through a combinatorial logic circuit before connecting to the LTRC-muxes 885-i in order to hold the gates of the transistors of the LTRC-muxes 885-i at 0 volts during the read mode of operation in order to reduce power consumption and avoid parasitic modulation of the bit lines by the miller capacitance of the NMOS transistors of the LTRC mux 885-i.

Each of the even numbered bit lines BL2 and BL4 also connects to one adjacent LTRC-mux 885 that is within an adjacent LTRC circuit 831. For example BL2 connects to LTRC-mux 885-0 on line 884-0 whose path to the column latch 830-0 is controlled by the XLSB line. And BL4 connects to LTRC-mux 885-2 on line 883-2 whose path to the column latch 830-2 is controlled by the XLSBb line. In this way, except for the even numbered bit lines on the edges 93 and 94 of the array 12 of FIG. 1, all the other even numbered bit lines through the entire memory array 12 are shared between the pairs of columns pair-i and the corresponding column latches 830-i without any interference between the column latches 830. In the latch to row coordinator (LTRC) circuit 831-1 the only odd numbered bit line BL3 of pair-2 is connected only to pull up transistor 802-1, and it connects directly to node 813-1 of the column latch 830-1. In the same way the odd numbered bit line of all the pairs of columns connects directly to the corresponding column latch circuit 830.

Within LTRC circuit 831-1 the sources of column pullups NMOS transistors 801-1 and 802-1 are connected to bit-lines BL2 and BL3 respectively, their drains are connected to the VCC line, and their gates are connected to the Vref1 line. Vref1 line is biased at a voltage of about 3 volts during the read operation, and at 0 volts during program and erase operations. The column pull up transistors of the other column pairs of memory array 12 are connected in a fashion similar to the arrangement of column pair-2.

During the read and erase mode of operation of the EEPROM chip 10, lines PBLC and ZBLC are held at "low" state of 0 volts by the mode driver block 60 in order to turn off the signal path between the bit lines of the memory array 12 and the storage node 815 of the column latches 830. During the program mode of operation the column latch circuits 830-i will be routed to the corresponding column within the pair of columns according to the address location of the selected memory cell and according to the orientation of the drain of its transistor. The output stage of the address buffer of the LSB row address pad A12 must be able to supply the 12 volts VPP to lines XLSB and XLSBb during some periods of the programming cycle that are identified below in FIG. 32 as Gt2 to Gt3 and Gt5 to Gt6. During these periods the VPP voltage is applied to the VCVP line and so to the storage node 815 in the column latches 830. Therefor it is preferred that the output stage of such an address buffer be a bus driver circuit that is similar to the bus driver 550 of the share predecoder 53 of FIG. 12 whose positive supply line is VCVP.

For embodiments where the floating gates are not staggered along the column, but rather the floating gates of all rows are associated with the samse bit line of the column, there is no need to coordinate the location of the drain of the cell 100 with the selected word line. Therefor the LTRC-mux 885 is not needed and the XLSB/XLSBb lines do not route the output of the column latches 830.

Figure 25:
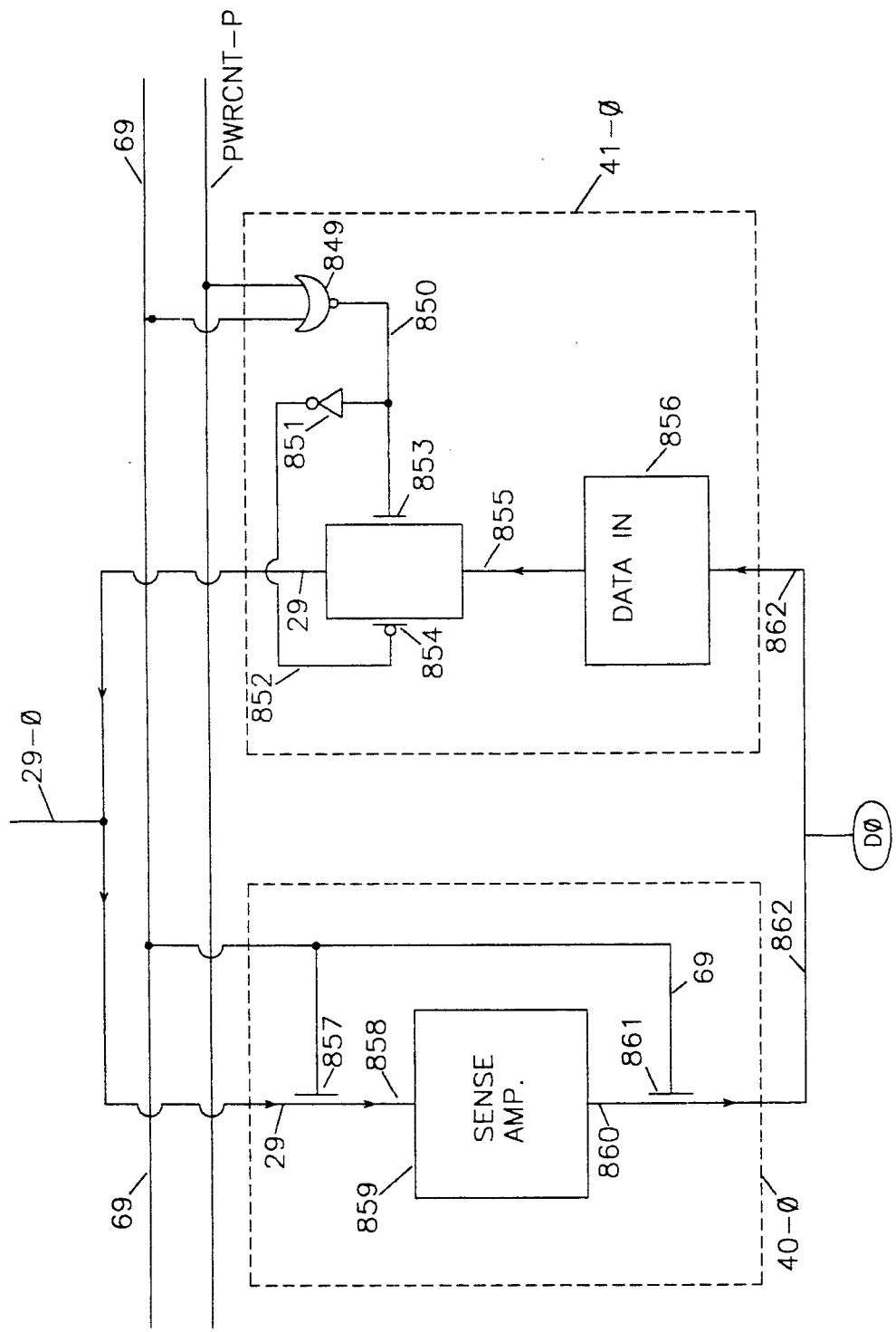
FIG. 25 is a circuit diagram of the routing of the sense amplifier block and data-in circuit block to a data pad.

FIG. 25 shows the sense amplifier block 40-0 and data-in block 41-0 of least-significant-bit of the eight data bits together with the circuit and control lines that route data between line 29-0 and the data pad D0. The block diagram and circuits of the other seven data bits is identical and are connected between the corresponding line 29-i and data pad D-i.

Data-in block 41-0 includes two-inputs CMOS NOR gate 849 whose first input connects to line 69 that comes from the mode driver block 60 and whose second input comes from PWRCNT-P line that also comes from the mode driver block 60. The output of NOR 849 connects to the gate of NMOS transistor 853 and to the input of CMOS inverter 851 whose output on line 852 connects to the gate of PMOS transistor 854. The sources of transistors 853 and 854 connect to line 29-0 and their drains on line 855 connect to the output of data-in circuit 856. Data-in circuit 856 of this embodiment may be simply a chain of CMOS inverters. The input of data-in circuit 856 comes from line 862 which is connected to the data pad D0 of the EEPROM chip 10. In other embodiment of the present invention where more than two logical states are to be stored in the memory cell 100, for example by storing one of multiple values of charge on the floating gate 101, the data-in block 41 may be a digital to analog circuit, or other signal processing means, that translates digital information at the input to a quantified analog information for storage in the memory cell 100, thereby increasing memory density per unit of silicon chip area.

Still referring to FIG. 25, sense amplifier block 40-0 includes NMOS transistor 857 whose gate connects to line 69 and its drain connects to lines 29. The source of NMOS transistor 857 connect by line 858 to the input of sense amplifier circuit 859 whose output on line 860 connects to the drain of NMOS transistor 861. The gate of NMOS transistor 861 connects to line 69 and its source connects by line 862 to the data pad D0. The sense amplifier circuit 859 may include several amplifier stages connected in cascade where the first stage may be a differential input amplifier circuit or a single input amplifier circuit, as is known in the art. In the case of a differential input circuit (not shown) one input connects to line 858 and the second input connects to a reference voltage, as is known in the art. The output of the last amplifier in the cascade connects to line 860.

During the read mode of operation line 69 is held "high" and line PWRCNT-P is held "low" by the mode driver block 60. The "high" on line 69 turns on transistors 857 and 861 which allows the signal that represents the data of the memory cell on line 29-0 to be amplified by the sense amplifier circuit 859 and be presented on line 862 as a voltage representing a logical state on the data pad D0. At the same time the "high" on line 69 causes line 850 to a "low" which is inverted by inverter 851 to a "high" on line 852 thereby turning transistors 853 and 854 off and preventing signals from the output of data-in circuit 856 on line 855 from reaching line 29-0.

During the program mode cycle the logical state of line 69 is "low". The logical state of line PWRCNT-P is "low" during the period in which data is written into the column latches 830, but it is changed to a "high" during the period in which the data is programmed from the column latched into the memory cells, as will be detailed below in reference to the timing diagram of FIG. 32.

Figure 26:
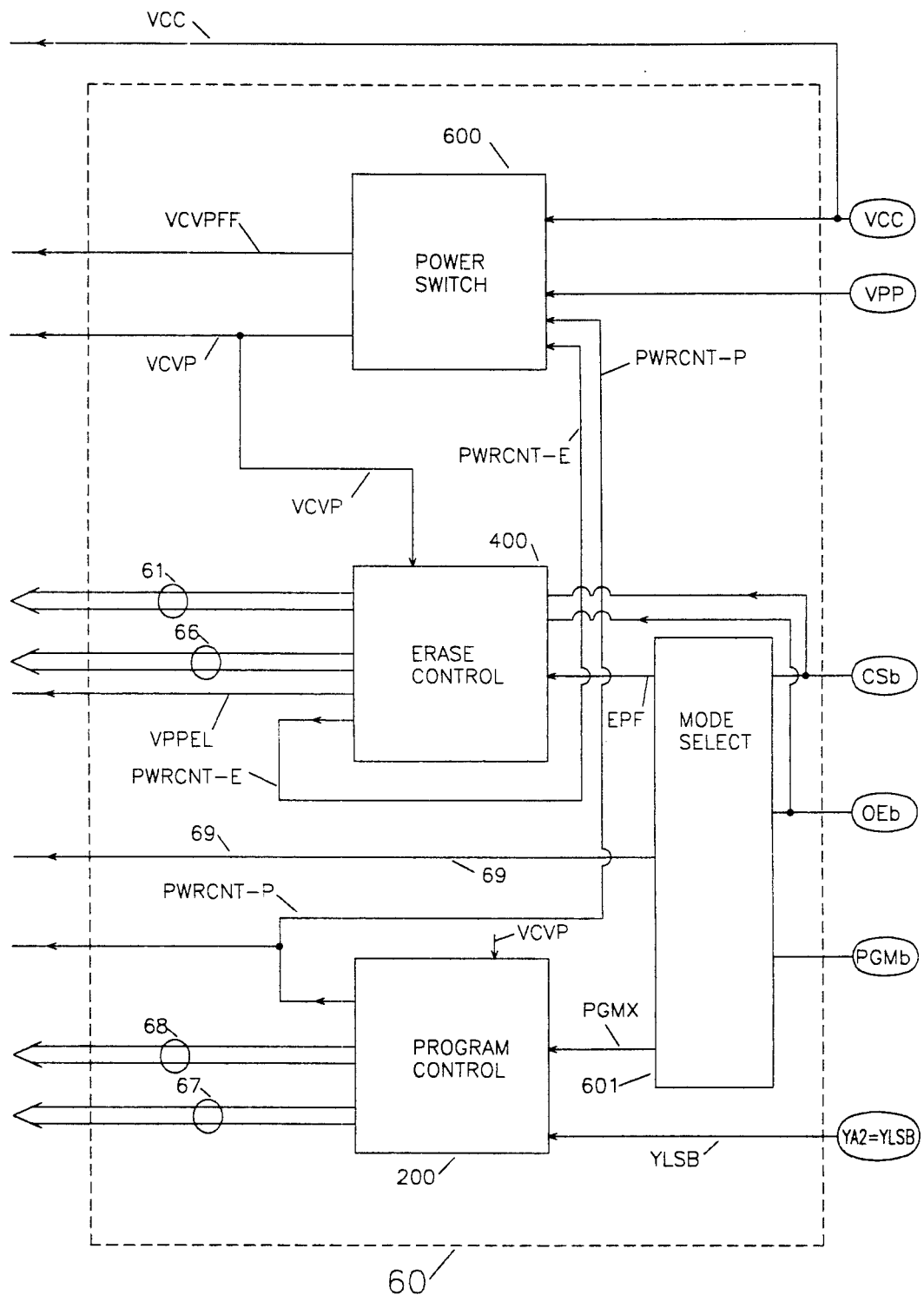
FIG. 26 is a block diagram of the mode driver according to the present invention.

FIG. 26 illustrates a block diagram of the mode driver 60 that controls the programming and erase operations of the EEPROM chip 10 of FIG. 1. It includes the mode select block 601, program control circuit 200, erase control circuit 400 and the power switch circuit 600.

The inputs to mode driver 60 come from the inputs to the EEPROM chip 10 (FIG. 1) on pads VCC, VPP, CSb, OEb, PGMb and YA2. YA2 is the Least-Significant-Bit of the column address and also will be referred to below as YLSB. The VCC pad provides the 5 volts supply to the entre chip 10, and the VPP pad provides the 12 volts supply for the chip 10 at the mode driver 60. As will be detailed in reference to FIGS. 25 and 26 input pads CSb, OEb and PGMb provide the logic combination to the mode select block 601, which determines the action to be performed by the mode driver 60.

The following are the outputs of the mode driver 60: line VCVPFF which supplies only the columns' latches blocks 88 with VCC of 5 volts during the read mode and VPP of 12 volts during the program and erase modes. Line VCVP which supplies the rest of the circuit blocks, such as address decoders, of the chip 10 that require higher voltage supply during the programming operation with VCC of 5 volts during the read mode and VPP of 12 volts during the program and erase modes. The VCVP line also supplies power to the erase control circuit 400 and the program control circuit 200 within the mode driver 60. The reason for separating the high voltage supply line VCVPFF for the columns' latches blocks 88 from the VCVP line will be detailed below. Bus 61 and bus 66 adapt the row decoder block 32 for read, program or erase modes of operations by supplying appropriate voltages as will be detailed below. Line 69 routes bus 29 (FIG. 1) to data pads D0-D7 to the sense amplifiers 40-i during read mode or to the data-in buffers 41-i during program mode. The common erase line VPPEL supplies the high voltage to the erase lines of the array 12 during the erase modes. Bus 68 adapt the columns latches blocks 88 for the read, program and erase modes of operations by supplying appropriate voltages as will be detailed below. Bus 67 adapt the column decoder 36 and byte select decoder 38 to the read, program and erase modes of operations by supplying appropriate voltages as will be detailed below.

Within mode driver 60 the mode select block 601 outputs line EPF to the erase block 400 and line PGMx to the program control circuit 200. Also the erase control circuit 400 outputs line PWRCNT-E to the power switch circuit 600 and the program control circuit 200 outputs line PWRCNT-P to the power switch circuit 600.

Figures 27, 28:
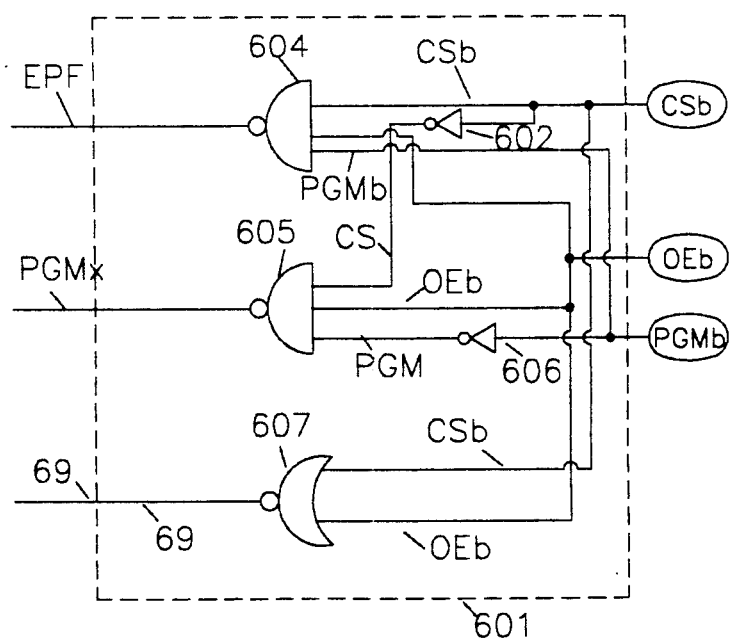
FIG. 27 is a truth table that determines the mode of operation of the mode driver of the present invention.
FIG. 28 is a circuit diagram of the mode select circuit of the mode driver.

Referring to FIG. 27 a truth table for the mode of operation of the EEPROM chip 10 (FIG. 1) is described as a function of the input pads CSb, OEb and PGMb of the mode selector block 601. By definition when input pads CSb and OEb are at "low" logic state or 0 volts and pad PGMb is at "high" logical state or 5 volts the chip 10 is at the read mode of operation in which data stored in the array 12 is read and presented at the data pads D0-D7. When pads CSb and PGMb are at "low" logical state or 0 volts and pad OEb is at "high" logical state or 5 volts the chip 10 is at the program (also called write) mode of operation in which data from the data pads D0-D7 is written into the memory cells of array 12. When pads CSb and OEb are at "high" logical state or 5 volts and pad PGMb is pulsed once with a short "low" logical state pulse (for example for only 300 nS pulse width) the chip 10 is at the page-erase mode of operation in which information from memory cells along only one row of memory cells is erased. When pads CSb and OEb are at "high" logical state or 5 volts and pad PGMb is pulsed twice with a short "low" logical state pulse (for example for only 300 nS each pulse width) the chip 10 is at the flash-erase mode of operation in which information from the entire array of memory cells 12 is erased.

FIG. 28 is a logic diagram of the mode select block 601. It includes CMOS NAND gate 604 which outputs on line EPF the signal that starts the erase mode operation. NAND gate 604 has three inputs, the first input comes from CSb pad, the second input comes from the OEb pad, and the third input comes from the PGMb pad. Mode select block 601 also includes CMOS NAND gate 605 which outputs on line PGMx the signal that starts the program mode operation. NAND gate 605 has three inputs, the first input comes from OEb pad, the second input comes from the CS line which carries the complement of the signal of pad CSb generated by CMOS inverter 602, and the third input comes from line PGM which carries the complement of the signal of the PGMb pad generated by CMOS inverter 606. Mode select block 601 also includes CMOS NOR gate 607 which outputs on line 69 the signal that starts and ends the read mode operation.

Figure 29:
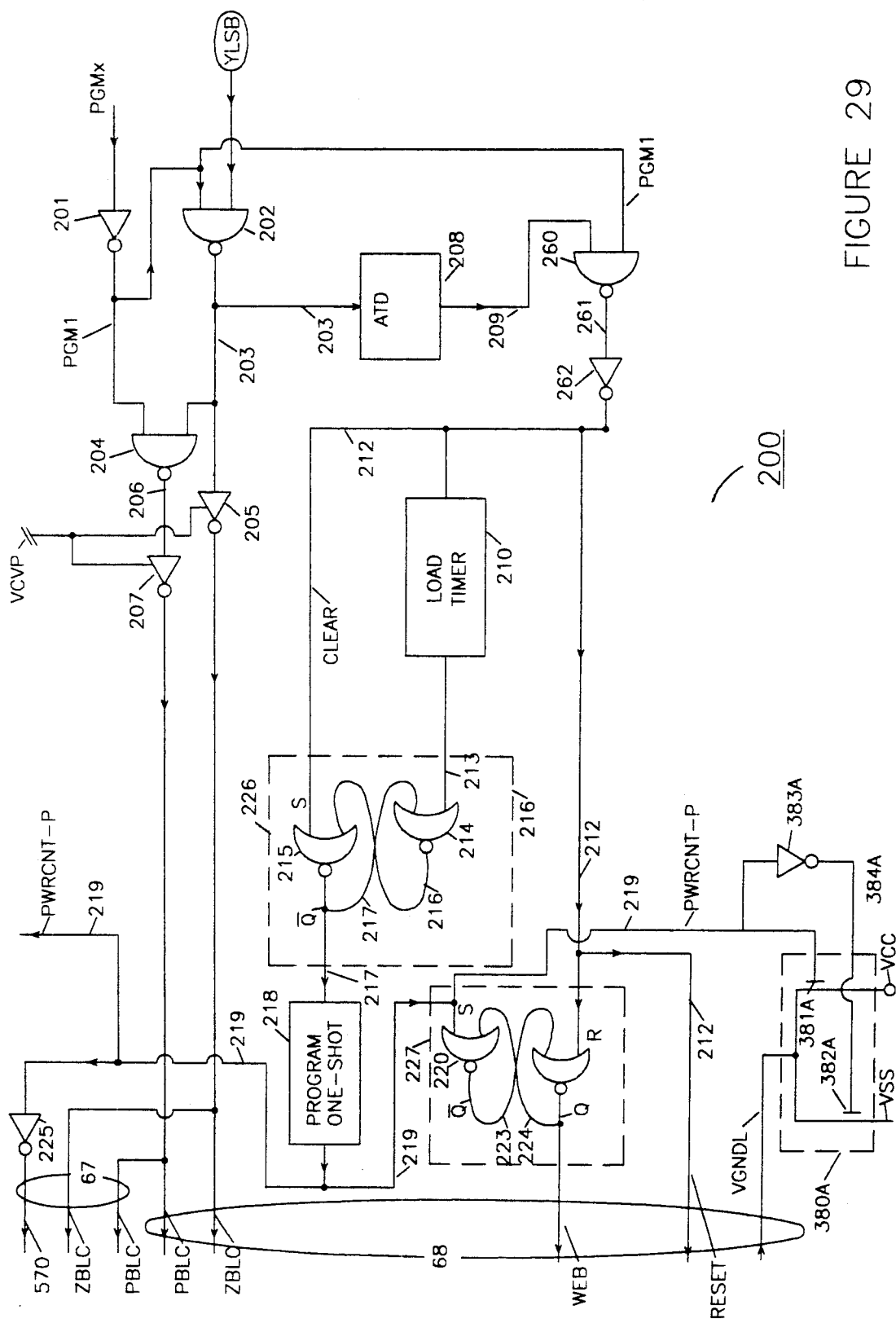
FIG. 29 is a circuit diagram of the program control circuit of the mode driver.

FIG. 29 is a logic and circuit diagram of the program control circuit 200. It consists of CMOS NAND gate 202 which receives the first input from the Least-Significant-Bit YA2 of the column address and the signal PGM1 that is the complement of the signal PGMx that is coming from the mode control block 601. The signal PGM1 is generated by CMOS inverter 201. The output of NAND gate 202 on line 203 connects to an input of CMOS NAND gate 204, to the input of inverter 205 and to the input of address-transition-detector (ATD) 208. The circuit diagram of ATD 208 will be detailed below. The second input of NAND gate 204 comes from line PGM1 and its output is on line 206, which is inverted by the high voltage inverter 207, whose circuit is similar to inverter 560 of FIG. 12, to generate signal PBLC that is outputed on bus 67 and on bus 68. Signal ZBLC is generated by high voltage inverter 205, whose circuit is similar to inverter 560 of FIG. 12, and is outputed on bus 67 and on bus 68. The output of ATD circuit 208 on line 209 drives an input of CMOS NAND gate 260. The second input of NAND 260 is line PGM1 and its output on line 261 drives CMOS inverter 262 whose output on line 212, which is the RESET line, drives the load timer 210, the Set input of SR-flipflop (SRFF) 226 and the Reset input of SRFF 227. The output line 213 of load timer 210 drives the Reset input of SRFF 226. Line 212 also connects to the RESET line of bus 68. The Qb output of SRFF 226 connects on line 217 to the input of program one-shot 218. The output of program one-shot 218 connects on line 219 to the Set input of SRFF 227. Line 219 is also signal PWRCNT-P that connects to the input of power switch circuit 600 (FIG. 26) and it also connects to the input of CMOS inverter 225 which generates the complement of PWRCNT-P signal on line 570 of bus 67. The Q output of SRFF 227 on line 224 connects to line WEb of bus 68. The PWRCNT-P line also connects to the first control input of low voltage multiplexer (LV mux) 380A and to the input of CMOS inverter 383A whose output connects to the second control input of LV mux 380A. The LV mux 380A has a data input line VGNDL which connects to the sources of all the pull down transistors 809 of the column latches 830 (FIG. 22). The LV mux 380A also has two data outputs of which the first connects to the VSS line and the second connects to the VCC power supply line. Within LV mux 380A, NMOS transistor 381A controls the path between line VGNDL and the VCC line and NMOS transistor 382A controls the path between line VGNDL and the VSS line. The source of transistor 381A connects to line VGNDL, its gate connects to the PWRCNT-P line and its drain connects to the VCC line. The drain of transistor 382A connects to line VGNDL, its gate connects to the complement of the PWRCNT-P signal on line 384A and its source connects to the VSS line. The PWRCNT-P line also connects to the eight data-in blocks 41-i of FIGS. 1 and 25.

Still referring to FIG. 29, the circuit of SRFF 226 is well known in the art and it consists of CMOS NOR gates 214 and CMOS NOR gate 215. NOR gate 214 has two inputs the Reset input of line 213 and the Qb input of line 217 and an output Q on line 216. NOR gate 215 that has two inputs, the Set input on line 212 which is marked as the Clear input, and the Q input on line 216, and a Qb output on line 217. SRFF 227 consists of CMOS NOR gate 220 that has two inputs, and CMOS NOR gate 221 which also has two inputs. NOR 220 has a Set input on line 219, a Q input on line 224, and an output Qb on line 223. NOR 221 has a Reset input on line 212, a Qb input on line 223, and an output Qb on line 224.

Figure 30:
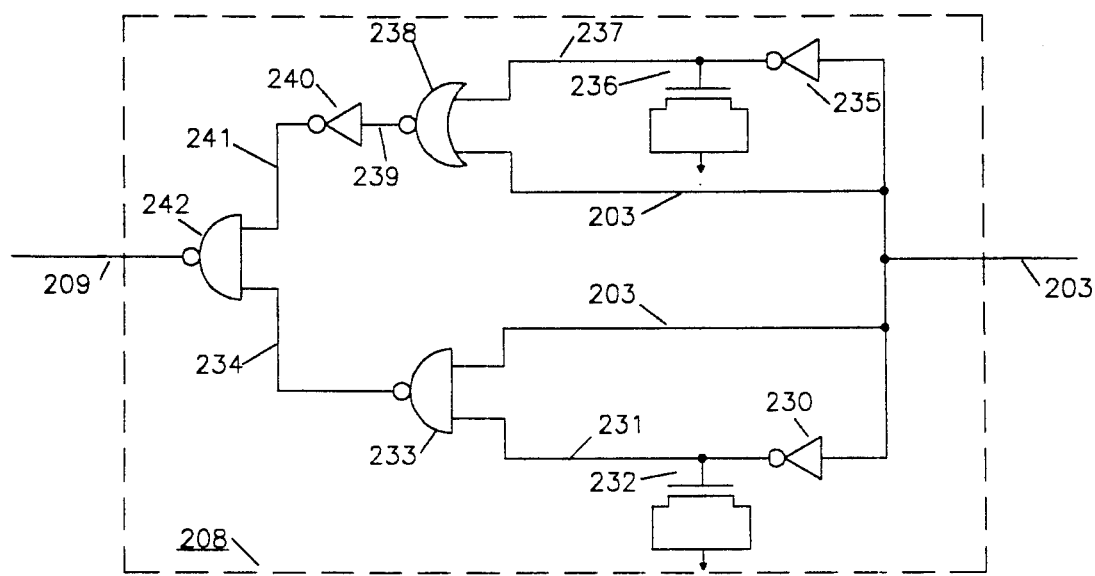
FIG. 30 is a circuit diagram of an address transition detector for use with the least-significant-bit of the column address during the programming mode.

FIG. 30 is a circuit diagram of the Address Transition Detector (ATD) block 208. The ATD block generates a pulse of 50 nanoseconds (nS) during the program mode every time the YLSB pad changes its logical level. The circuit of ATD block 208 is known in the art and it includes CMOS inverter 230 and NMOS transistor 232 and CMOS NAND gate 233, which generate a short negative going pulse (of about 50 nS) on line 234 when YLSB pad changes from "0" to "1" during program mode. The ATD block 208 also includes CMOS inverter 235, NMOS transistor 236 and CMOS NOR gate 238, which generate a positive going pulse (of about 50 nS) on line 239 when the YLSB pad changes from "1" to "0" during program mode. CMOS inverter 240 inverts the pulse on line 239 to a negative going pulse on line 241. Lines 234 and 241 are the inputs to CMOS NAND gate 242 whose output at line 209 produces a positive going pulse (of about 50 nS) in response to a pulse on either line 234 or line 241. Therefor during programming when line PGMx (FIG. 29) is "low" any logical level transition of the YLSB input pad causes a short positive going pulse at the output of the ATD block 208. The pulse width at the output of ATD circuit 28 is a short 50 nS wide, which is enough to accomplish a clear function of SRFF 226, the reset function of SRFF 227 and of the column latches 830 (FIG. 22) on RESET line 227.

Still referring to FIG. 30 NMOS transistors 232 and 236 have their source and drain connected to VSS ground line and their gates are connected to the outputs of inverters 230 and 235 respectively. This connection of the terminals of the transistors 232 and 237 make them act as capacitors. As is known in the art by varying the size of these transistors one can vary the delay on line 231 and 237 respectively.

Figure 31:
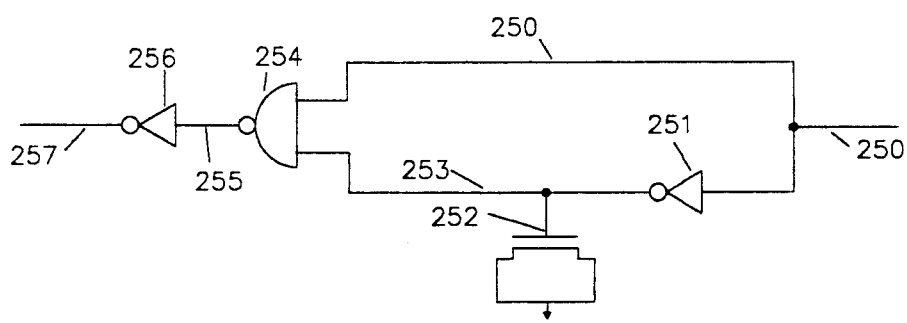
FIG. 31 is a circuit diagram of a one-shot circuit that is used in the program control and in the erase control circuits.

FIG. 31 is a diagram of a one-shot circuit that is well known in the art. The one-shot circuit of FIG. 31 has an input on line 250 that connects to CMOS inverter 251 and to an input of CMOS NAND gate 254. The output of inverter 251 connects to the second input of NAND 254 and to NMOS transistor 252 which has its drain and source connected to VSS ground line in a capacitor configuration. The output of NAND 254 on line 255 connects to the input of CMOS inverter 256 whose output on line 257 is the output of the one-shot circuit. Upon transition from "low" to "high" of the input line 250 a positive going pulse will start at the output line 257. The duration of that output pulse is determined by inverter 251 and its capacitive load on line 253, as is known in the art. A transition from "high" to "low" at the input line 250 will not cause a pulse at the output line 257.

Referring back to FIG. 29 one-shot circuit 218 may use the circuit of FIG. 31 to accomplish its function. The pulse width at the output PWRCNT-P, that is on line 219, of the program one-shot circuit 218 is one microsecond wide and will be referred to below in FIG. 32 as Tpg. This one microsecond pulse causes the outputs of the power switch circuit 600 (FIG. 36) to deliver the 12 volts high voltage that is required for programming all the memory cells along a given row that are associated with the column latches 830 during that programming. It should be noted here that this one microsecond programming time relates to a memory cell such as memory cell 100 of FIG. 8 or other embodiments of the '299 patent in which the electrical length of the floating gate over the drain area of the channel is 1.5 micrometers. However with advanced photolithography equipment or with novel processing methods, such as the one disclosed in U.S. patent application Ser. No. 07/377,311, now U.S. Pat. No. 5,099,297 filed on Jul. 10, 1989 by the applicant of the present patent application, smaller electrical length of the floating gate can be achieved, thereby reducing the programming period. A shorter programming period, will allow the design of program one-shot 218 to produce shorter pulse at the output line PWRCNT-P. A detailed timing diagram for the operation of the program control circuit 200 will be shown below.

Still referring to FIG. 29 the load timer block 210 may be formed of a chain of D-flipflops as is known in the art. The load timer 210 delays the RESET pulse of line 212 for a period that is required to load the column latches 830 from the data pads D0–D7. This period within the program mode is referred to as latches load time (LLT) and is calculated according to Eq. 1 below:

$$LLT = (\#CL/2)*(1/\# \text{ data pads})*(Tw \text{ of one latch}) \quad \text{Eq. 1}$$

Where the term "# CL/2" is the number of columns divided by 2, and it stands for the number of column's latches 830 associated with array 12 (FIG. 1), the term "# data pads" is the number of pads D-i (eight pads in FIG. 1) or the number of data bits. The term "Tw" is the time required to write new data from the a data pad into a column latch 830. In the embodiment of FIG. 1 eight column latches 830 are written into during Tw. In other embodiments a wider data bus may be used, for example since there are sixteen memory array sections 14, sixteen column latches 830 may be written into simultaneously if section select mux 28-i are removed and column address YA13 is eliminated. This will also require direct connection between a first set of eight sense-amps 40-i and data-in buffers 41-i to bus 25 (not shown) and also direct connection between a second set of eight sense-amps 40-i and data-in buffers 41-i to bus 26 (not shown).

The total amount of time that is required to write new data from the data-in pads into memory cells of a given row that are associated with the even numbered columns is therefor calculated as in Eq. 2 below and is equal to the time required to write into the cells associated with the odd numbered columns.

$$Twt = LLT + Tpg \quad \text{Eq. 2}$$

Figure 32:
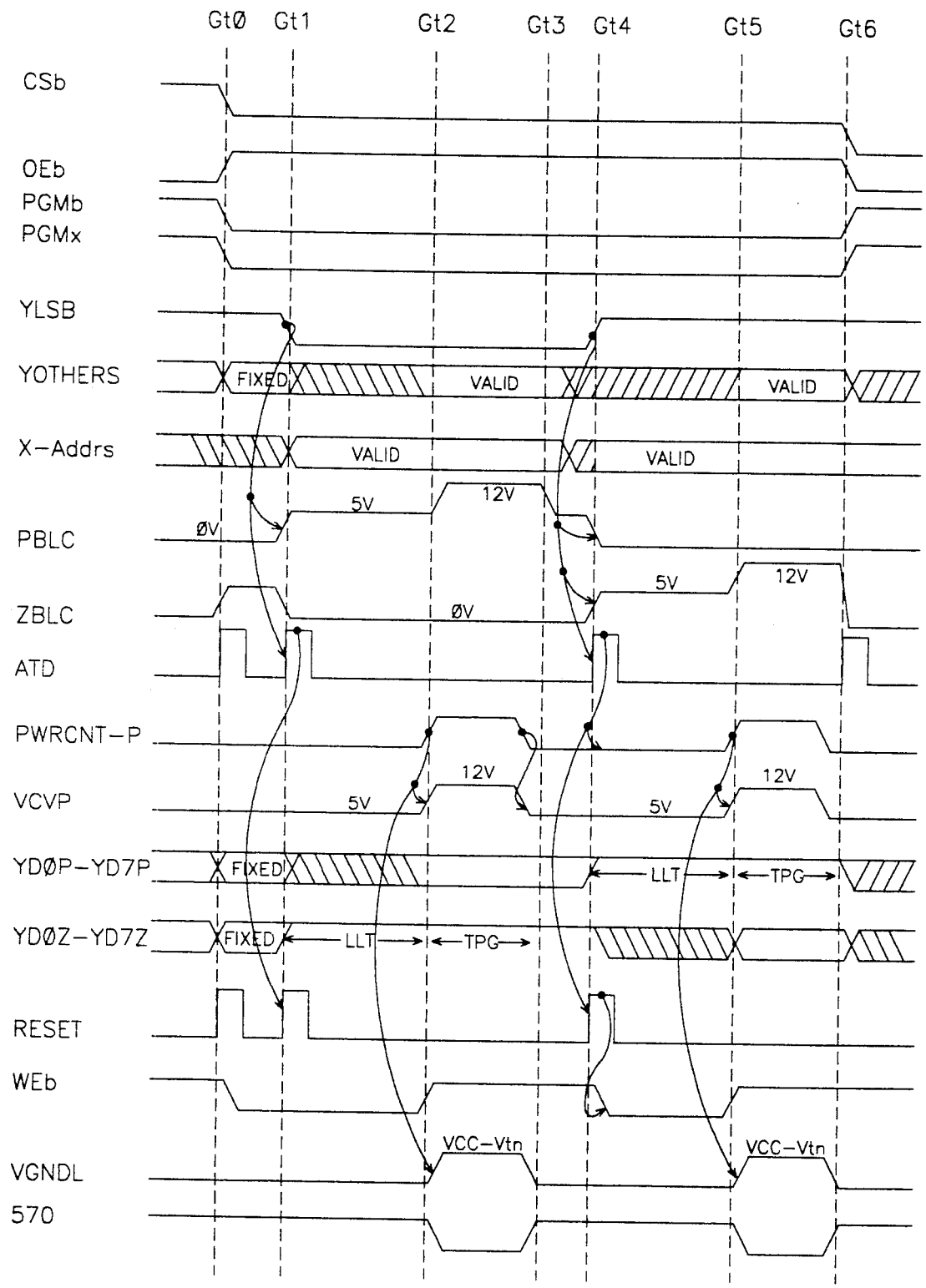
FIG. 32 is a timing diagram showing the signal levels of various lines during the program mode cycle of the present invention.

FIG. 32 is a timing diagram illustrating the response of the mode driver 60 to the inputs of the mode select block 601 during the program mode of operation. As can be seen when PGMb="0", CSb="0" and OEb="1" the mode select block 601 outputs on line PGMx a "low" state which drives the program control circuit 200 at the input of inverter 201 at time Gt0. At the beginning of the program mode cycle at time Gt0 the YLSB pad must be held at "high" state. Inverter 201 outputs a complementary signal PGM1 that causes the output of NAND gate 202 to switch and cause ATD circuit 208 to generates the short pulse on line 212 that starts the load timer 210. By specifications, for example on the data sheet of the EEPROM chip 10, within 200 nS the user must decide if the memory cells of the even numbered bit-lines or the memory cells of the odd numbered bit-lines are to be programmed. If memory cell of even numbered bit-lines are to be programmed pad YLSB remains "high" and so line ZBLC is "high" and line PBLC is "low". However if memory cells of odd numbered bit-lines are to be programmed pad YLSB is switched to "low" at time Gt1 (200 nS after Gt0) and so line ZBLC is "low" and line PBLC is "high" as is shown in FIG. 32. This transition of YLSB generates another ATD pulse on line 209 and also another RESET pulse on line 212. Between Gt1 and Gt2, which is LLT period, the data of the data pads D0–D7 may be written into the latches 830, while WEb line is held at "low". During this period of YLSB="low" the eight outputs YD0Z–YD7Z on bus 20 of the column decoder 36 are forced to a "high" state simultaneously by the "high" state on line PBLC (FIG. 14), so as to connect all even numbered bit-lines to ground through cross point switch 27. The eight YD0P–YD7P outputs on bus 21 of the column decoder 36 respond normally to the address change during LLT period between Gt1 and Gt2, but during the Tpg period line PWRCNT-P disconnects data-in buffers 41-i from the bit-lines and the signal of line 570 goes "low" which forces the eight outputs YD0P–YD7P of bus 21 to a "low" thereby preventing the signal of any odd numbered bit-line from reaching line SL23 (FIG. 9) which is the input of the cross-point-switch 27. At the end of the latch load period LLD at Gt2, the load timer 210 resets SRFF 226 which in response starts the program pulse of one microsecond at the output of program one-shot circuit 218 on line 219. This resets line WEb to "high" which actually latches the data into the column latches 830. At the same time line PWRCNT-P goes "high" which turns off the signal path between lines 29-i and the output of the data-in circuit 856 (FIG. 25) and simultaneously causes the power switch circuit 600 to increase its output voltage from 5 volts to 12 volts programming voltage for the program period Tpg that ends at Gt3. The programming of additional memory cells of odd numbered columns may continue by changing the PGMb to "high" and then to "low" again and then changing the row address so cells along a new row, and still on odd numbered columns, will be programmed. However in order to program the memory cells of the even numbered columns along the same row, YLSB column address must be switched from a "low" to a "high" thereby causing another ATD pulse that starts the reset pulse, the load timer and other signals as shown in FIG. 32. At the end of the program mode the signal of PGMb pad switches to a "high" which brings PGM1 line to "low". The "low" at the input of NAND 260 prevents the pulse that is generated by the ATD circuit 208 on line 209 from generating a RESET pulse on line 212.

During the period in which the signal of PWRCNT-P line is at "high" logical state, the signal of line 570 is at "low" logical state, which forces all lines of the output bus 19 of byte-select decoder block 38 (FIG. 13) to be at "high" logical state simultaneously. This forces all the transistors of the second-level-muxes 24SL-i to turn on and enable the simultaneous transfer of the signals of all the bit-lines that function as sources for the selected memory row to the cross-point switches 27-i and from there to the VGND line (FIG. 9) which is connected to the LV mux 380 which supplies it with the VCC-Vtn voltage. Another result of a "low" state on line 570 is that all the bits of bus 20 are forced to a "low" state if the signal of line ZBLC is at "low" or alternatively all the bits of bus 21 are forced to a "low" state if the signal of line PBLC is at "low". As was detailed above in reference to FIG. 9, the signal of the PWRCNT-P line connects from the program control circuit 200 to the LV mux 380 of each two memory array sections 14-i. In order to switch the source of the transistors to be programmed from the VSS voltage of 0 volts to the VCC-Vtn voltage of about 4 volts. The PWRCNT-P signal performs a similar function in switching the VGNDL line of the column latches 830-i from 0 volts during the read and erase operations and during the latch load period LLT that is illustrated in FIG. 32 to the VCC-Vtn volts during the Tpg period of actual programming. By during so the "low" logical state of the latch 830 on node 815 and therefor on the drain 103 of the memory transistor 100 is equal to the "low" logical state that is presented to the source 104 of the memory cell 100 by the VGND line and LV mux 380. Therefor the drain to source voltage will be 0 volts and no programming will take place.

The reason for generating the PBLC and ZBLC signals at the mode driver 60 from the YLSB bit of the column address is so that the routing of the column's latches 830 to an even or an odd given bit-line is accomplished in coordination with the selection of the same given bit-line by the outputs of the column decoder 36 when driving the control inputs of bit-line select mux 24-i. As was explained above in reference to FIG. 20 for a decoder which has a similar logical decoding function as the column decoder 36, the least-significant-bit may be used for identifying if an even or an odd numbered decoder output line was selected. Therefor when the outputs of the column decoder 36 (FIG. 14) on busses 20 and 21 drive the bit-line select muxes 24-i (FIG. 9) the least-significant-bit of the column address is coordinating whether an even or an odd numbered bit-line is selected by the bit-line select muxes 24-i, and so the connections to a given bit-line on both ends of the memory array 12 are routed by the least-significant-bit of the column address YLSB.

Figure 33:
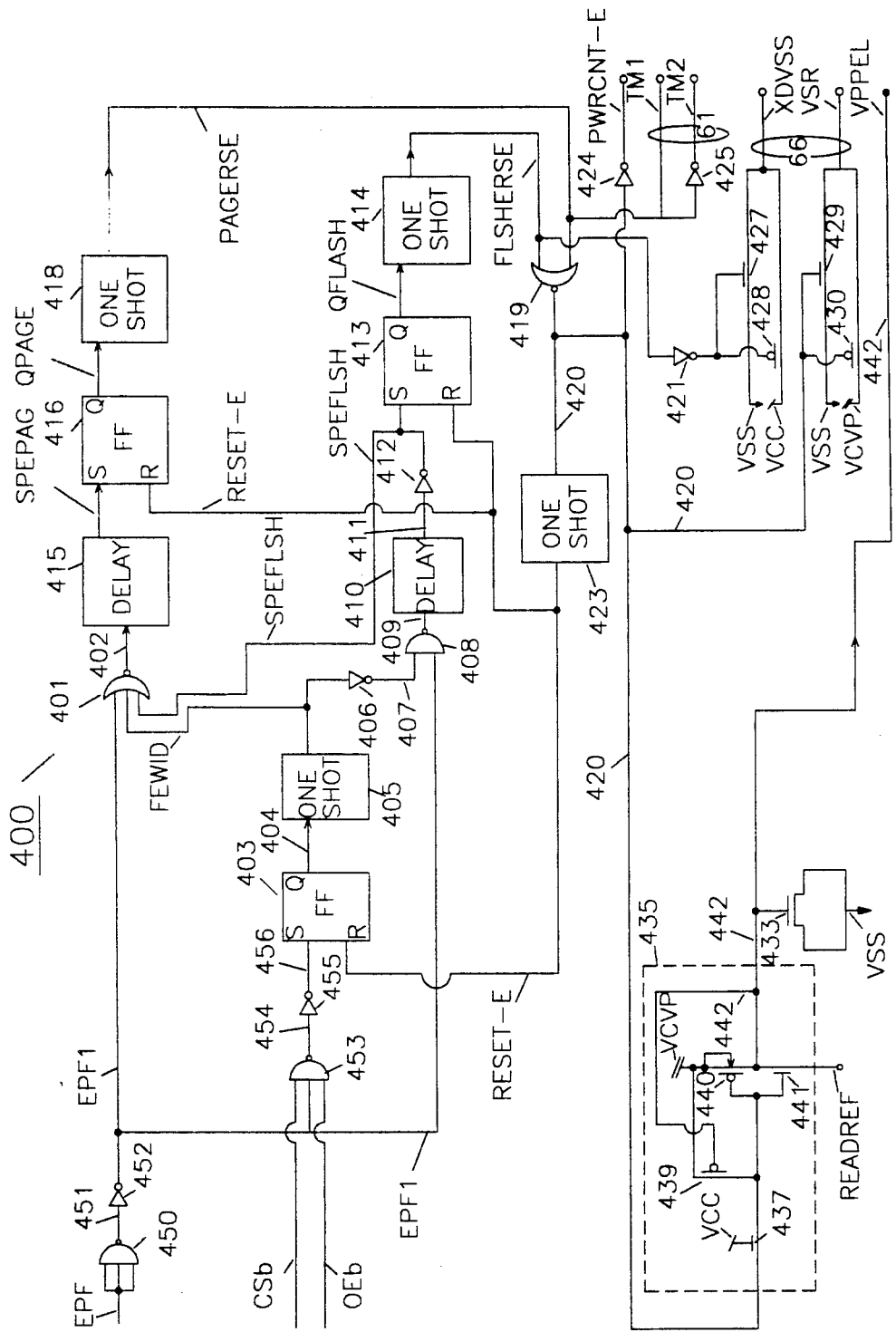
FIG. 33 is a block diagram and partly a circuit diagram of the erase control circuit of the mode driver of the present invention.

Referring now to FIG. 33 the logic diagram and some of the circuits of the erase control circuit 400 of the mode driver 60 are shown. Input line EPF arrives from the mode select block 601 and connects to all three inputs of three input CMOS NAND gate 450. The output of NAND 450 on line 451 connects to CMOS inverter 452 whose output is line EPF1. Line EPF1 carries the delayed signal of line EPF and is connected to one input of the three-inputs CMOS NOR gate 401, to one input of three-input CMOS NAND gate 409 and to one input of three-inputs CMOS NAND gate 453. The second input of NAND 453 connects to pad OEb and the third input of NAND 453 connects to line CSb of the EEPROM chip 10 as shown in FIG. 26. The output of NAND 453 on line 454 connects to the input of CMOS inverter 455 whose output on line 456 connects to the Set input of SRFF 403. NAND gate 450 and inverter 452 add time delay from line EPF to line EPF1 so that the signal on line EPF will arrive to the input of NAND 453 after the signals on lines CSb and OEb, thereby preventing the setting of SRFF 403 at the end of the erase mode.

The Reset input of SRFF 403 is line RESET-E that connects to the output of one-shot circuit 423, and the Q output of SRFF 403 connects by line 404 to the inputs of delay circuit 405. The output of delay circuit 405 connects by line FEWID to the second input of NOR 401, and to the input of CMOS inverter 406 whose output on line 407 connects to the second input of NAND 408 whose output connects by line 409 to the input of delay circuit 410 whose output on line 411 connects to the input of CMOS inverter 412. The output of inverter 412 connects by line SPEFLSH to the Set input of SRFF 413 and to the third input of NOR 401. The Reset input of SRFF 413 connects to line RESET-E and its output Q connects by line QFLASH to one-shot circuit 414 whose output connects by line FLSHERSE to the first input of two-input CMOS NOR gate 419. The output of NOR 401 connects by line 402 to the input of delay circuit 415 whose output connects by line SPEPAG to the Set input of SRFF 416. The Reset input of SRFF 416 connects to the RESET-E line and its Q output connects by line 417 to one short circuit 418 whose output connects by line PAGERSE to the second input of NOR 419 and to the input of CMOS inverter 425. Line PAGERSE also connects to line TM1 of bus 61. The output of inverter 425 connects to line TM2 of bus 61. The output of NOR 419 connects by line 420 to the input of one-shot circuit 423 whose output connects to the RESET-E line. Line 420 also connects to the inputs of CMOS inverter 424, and to the inputs high-voltage inverter 435. The output of inverter 424 connects to line PWRCNT-E that drives the power switch circuit 600 (FIG. 26). The output of inverter 451 on line 442 connects to the gate of NMOS transistor 433 that is connected in a capacitor configuration and then to the common erase line VPPEL that connects to the erase word-lines of the memory array 12. Line 420 also connects to the gate of NMOS transistor 429 and to the gate PMOS transistor 430. The drain of NMOS transistor 429 connects to line VSR of bus 66 and its source connects to the VSS line. The drain of PMOS transistor 430 connects to line VSR of bus 66 and its source connects to the VCVP line. The output of one-shot circuit 414 also connects by line FLSHERSE to the input of CMOS inverter 421 whose output connects by line 426 to the gate of NMOS transistor 427 and to the gate PMOS transistor 428. The drain of NMOS transistor 427 connects to line XDVSS of bus 66 and its source connects to the VSS line. The drain of PMOS transistor 430 connects to line XDVSS of bus 66 and its source connects to the VCC line.

Still referring to FIG. 33 high voltage inverter 435 operates in the same way that inverter 560 of FIG. 12 operates using a circuit well known in the art. Included in inverter 435 are PMOS transistors 440 and 439 whose source connect to the VCVP line. PMOS transistor 440 has its drain connected to the output line 442 and its gate to line 438, and PMOS transistor 439 has its drain connected to line 438 and its gate to the output line 442. Also included in inverter 435 are NMOS transistor 441 with drain connects to the output line 442, its source connected to a reference voltage line READREF and its gate to line 438 that connects to the drain of NMOS transistor 437 whose gate is connected to the VCC line and its source is connected to line 420 which is also the input of inverter 435.

Reference voltage line READREF may be connected to the VSS line of 0 volts or to a reference voltage circuit (not shown) that produces about 3 volts. By biasing line READREF at 3 volts the inverter 435 produces "low" logical state at the output line 442 during the read mode operation, that is 3 volts and not 0 volts and it appears on the VPPEL output line. The VPPEL line delivers the 3 volts to the erase lines ELi of the array 12. The erase lines ELi were shown in FIGS. 7 and 8. The advantage of supplying 3 volts to the erase lines ELi during the read mode operation is that it increases the potential of the floating gate in the memory cells and thereby it increases the read current of the memory cell which allows shorter read access time of the EEPROM chip 10. It is important to note that the voltage on the READREF line may be between 0 volts and 3 volts, however voltages higher than 3.2 volts may cause parasitic erasure of memory cell along unselected rows since the band gap energy between polysilicon of the floating gate and silicon-dioxide dielectric of the erase region of the cell is 3.2 eV as in known in the art.

Still referring to FIG. 33 the circuit of SRFF 403 and 416 are similar to the circuit of SRFF 226 of FIG. 29. The circuit of delay circuits 405, 410 and 415 may be formed by a chain of CMOS inverters as is known in the art. The circuit of one-shot circuits 414, 418 and 423 may be similar to the one-shot of the circuit of FIG. 31 with the delays adjusted for each circuit.

Figure 34:
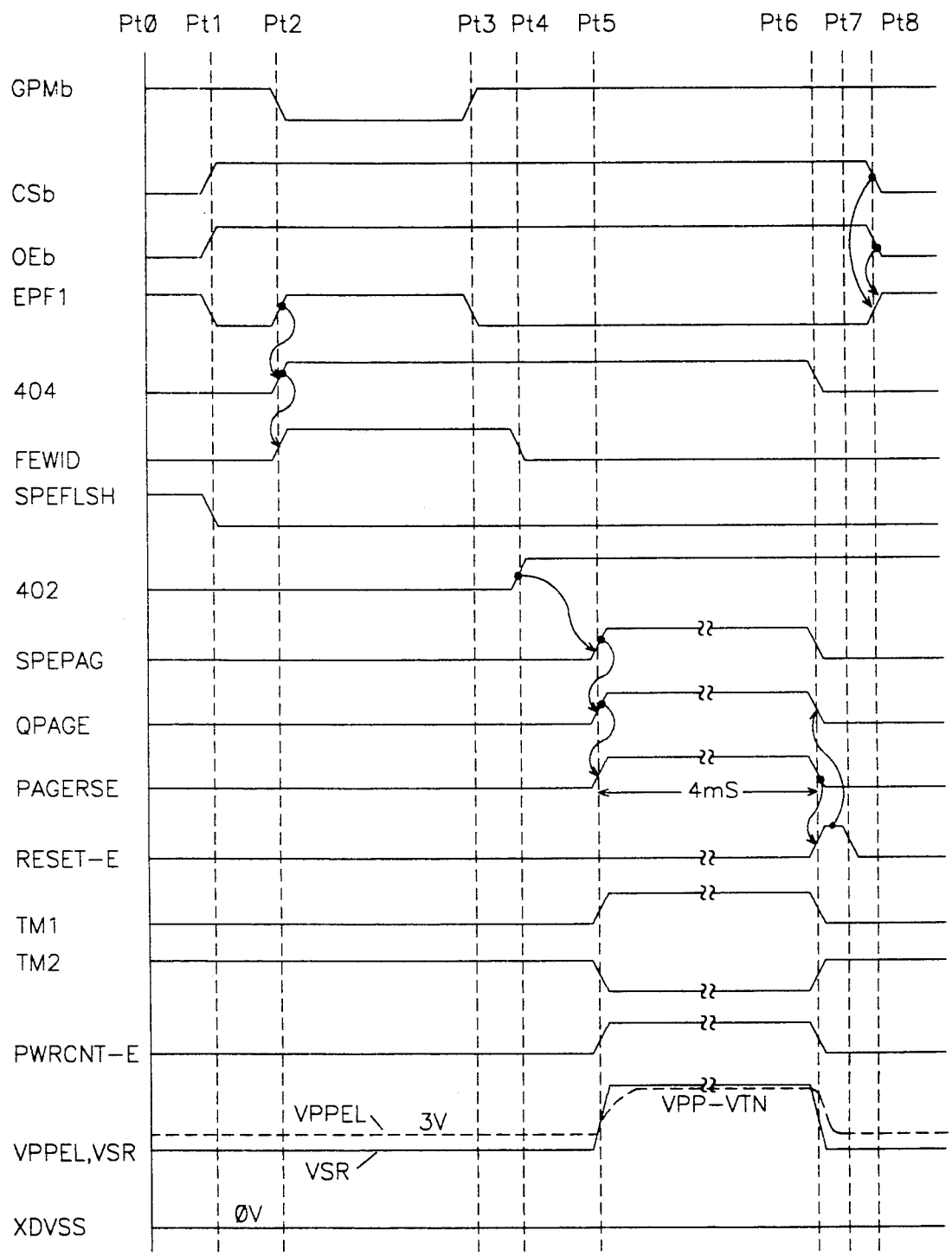
FIG. 34 is a timing diagram showing the signal levels of various lines during the page erase mode cycle of the present invention.
Figure 35:
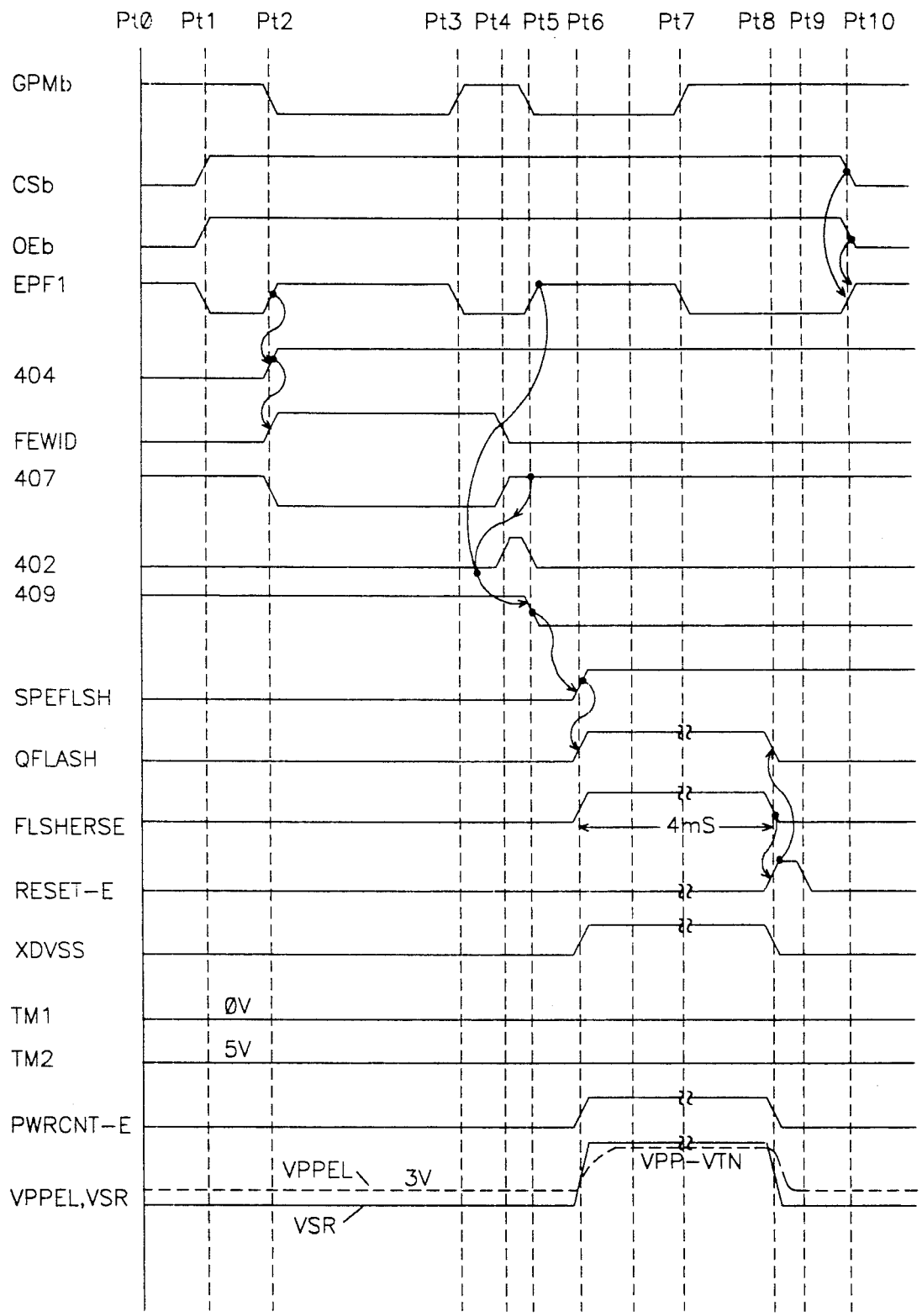
FIG. 35 is a timing diagram showing the signal levels of various lines during the flash erase mode cycle of the present invention.

FIG. 34 is a timing diagram illustrating the response of the mode driver 60 to the inputs of the mode select block 601 during the page erase mode of operation. This mode begins when CSb="1" and OEb="1" at time Pt1 and there after PGMb is taken to "low" at time Pt2 for a duration of one negative pulse of about 300 nS that ends at Pt3. The mode select block 601 outputs on line EPF the signal which drives the input of the erase control circuit 400. During the page erase mode the signal of line SPEFLSH is held "low" to ensure that SRFF 413 is not been set, thereby preventing initiation of a flash erase mode cycle. At time Pt1 NAND 453 enables the signal on the EPF1 line to set SRFF 403 so that its output on line 404 goes "high" which starts the one-shot circuit 405 that generates a pulse of about 350 nS in duration but in any case is longer than 300 nS difference between Pt3 and Pt2, but is shorter than 400 nS, which as will be explained in reference to FIG. 35 is the time of the beginning of the second PGMb pulse of the flash erase mode. At the end of the 350 nS line FEWID goes "low" at Pt4 and if the EPF1 line is still held "low" for the 200 nS delay period of delay circuit 415 that end at Pt5 it will deliver the "high" level of line 402 to line SPEPAG and set the SRFF 416 output on line QPAGE to "high". When the input of one-shot 418 goes to "high" at Pt5 it outputs a 4 milliseconds (mS) long pulse on line PAGERSE that ends at Pt6 and which initiates the page erase voltages on bus 61, bus 66, line PWRCNT-E and common erase line VPPEL. More specifically lines TM1 and PWRCNT-E go to "high" state, line TM2 goes to "low" state and lines VPPEL and VSR go to high voltage of 12 volts. At the end of the 4 mS pulse, line PAGERSE goes "low" and the output of NOR 419 goes "high" which causes the one-shot circuit 423 to generate a short 50 nS reset pulse on the RESET-E lines that ends at Pt7. The pulse on RESET-E line resets the SRFFs 403 and 416 in preparation for the next erase mode cycle. The page erase mode cycle ends by taking the signal of the CSb and OEb pads to "low" state at time Pt8 which brings the EPF1 signal "high" after NAND 453 is prevented from transferring the EPF1 signal to the Set input of SRFF 403. During the page erase mode cycle, line XDVSS remains at "low" logical state which is 0 volts.

Referring to FIG. 35 is a timing diagram illustrating the response of the mode driver 60 to the inputs of the mode select block 601 during the flash erase mode of operation. This mode begins when CSb="1" and OEb="1" at time Ft1 and there after PGMb is taken to "low" at time Ft2 for a duration of two negative pulses of about 300 nS long each. The first PGMb pulse ends at time Ft3 and the second PGMb pulse starts at time Ft5 and ends at time Ft8. The mode select block 601 outputs on line EPF the signal which drives the input of the erase control circuit 400. During the flash erase mode the signal of line 402 goes to "high" for a short period of under 100 nS which is not sufficient to pass through the inverter chain of delay circuit 415, thereby line SPEPAG remains at "low" state and ensure that SRFF 416 is not been set, thereby preventing initiation of a page erase mode cycle. At time Ft1 NAND 453 enables the signal on the EPF1 line to set SRFF 403 so that its output on line 404 goes "high" which starts the one-shot circuit 405 that generates a pulse of about 350 nS in duration but in any case is longer than 300 nS difference between Ft3 and Ft2, but is shorter than 400 nS, which is the time of the beginning of the second PGMb pulse of the flash erase mode at Ft5. At the end of the 350 nS period line FEWID goes "low" at Ft4 and if the EPF1 line is still held "high" after time Ft5 the output of NAND 408 on line 409 goes "low" at the input of delay circuit 410. If line FPF1 is still held "high" after the 100 nS delay period of delay circuit 410 then the "low" on line 409 appears on line 411 and is inverted by inverter 412 to a "high" level which sets the output SRFF 413 on line QFLASH to "high" at time Ft6. When the input QFLASH of one-shot 414 goes to "high" at Ft6 it outputs a 4 milliseconds (mS) long pulse on line FLSHERSE that ends at Ft8 and which initiates the flash erase voltages on bus 61, bus 66, line PWRCNT-E and line VPPEL. More specifically line PWRCNT-E go to "high" state, and lines VPPEL and VSR go to high voltage of 12 volts. At the end of the 4 mS pulse, line FLSHERSE goes "low" and the output of NOR 419 goes "high" on line 420 which causes the one-shot circuit 423 to generate a short 50 nS reset pulse on the RESET-E lines that ends at Ft8. The pulse on RESET-E line resets the SRFFs 403 and 413 in preparation for the next erase mode cycle. The flash erase mode cycle ends by taking the signal of the CSb and OEb pads to "low" state at time Ft10 which brings the EPF1 signal "high" after NAND 453 is prevented from transferring the EPF1 signal to the Set input of SRFF 403. During the period Ft6 to Ft8 of flash erase mode cycle, line XDVSS which supplies the VSS voltage to the mask programmable logic gate 340 of the row decoder circuit 32-1 (FIG. 10) is taken to a "high" logical state which is 5 volts. This ensures that all the read word lines ZWL and PWL (FIG. 8) that connect to the row decoder block 32 are held at "low" logical state. During the flash erase mode cycle the TM1 line remains at "low" state and the TM2 line remains at "high" logical state.

Figure 36:
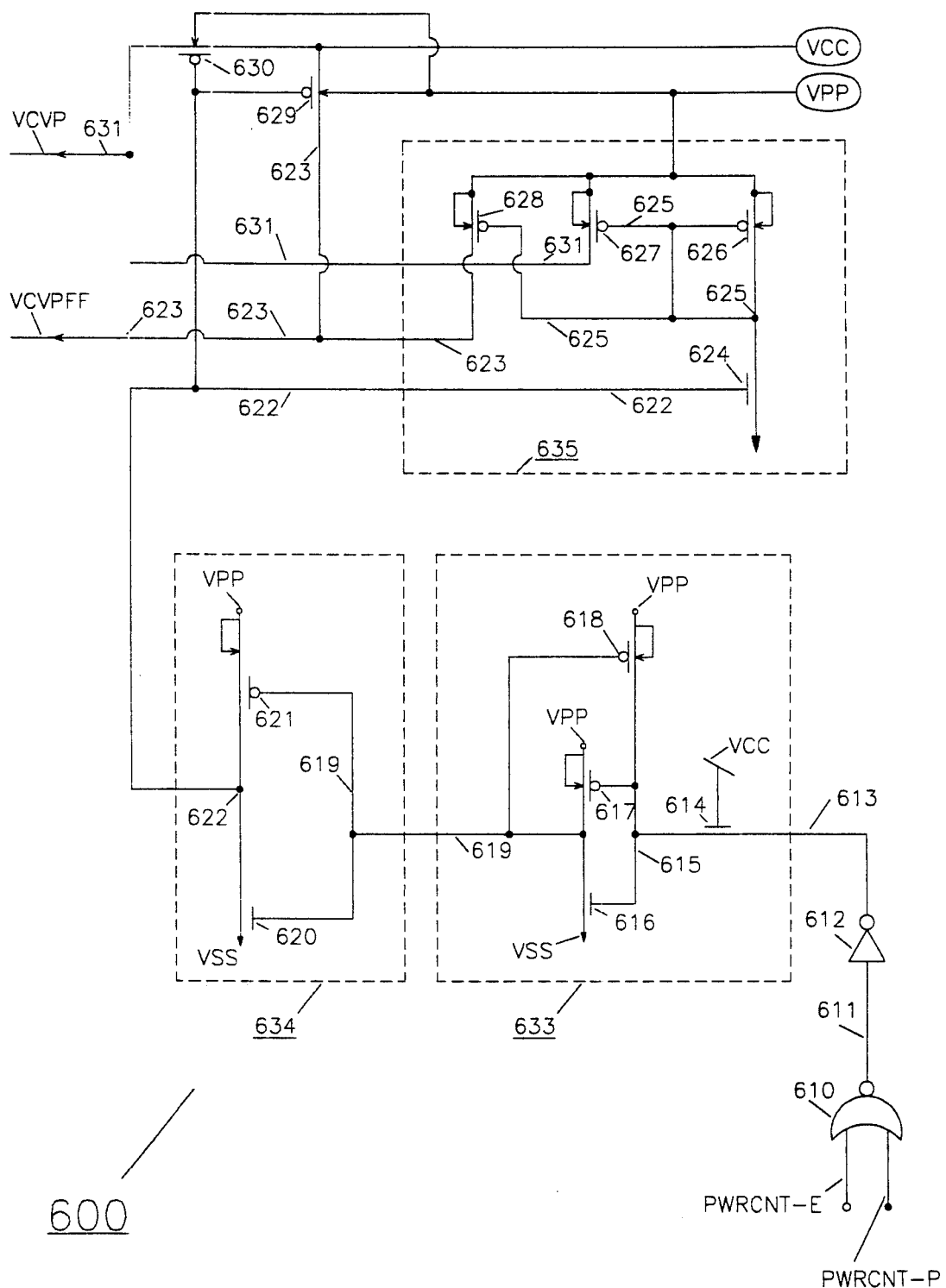
FIG. 36 is a circuit diagram of the power switch of the mode driver of the present invention.

Referring to FIG. 36 the circuit diagram of the power switch circuit 600 is illustrated. It includes two-inputs CMOS NOR gate 610 that receives the first input from the program control circuit 200 on line PWRCNT-P and the second input from the erase control circuit 400 on line PWRCNT-P. The output of NOR 610 on line 611 drives the input of CMOS inverter 612 whose output on line 613 drives the input of high voltage inverter 633. The output of inverter 633 derives CMOS inverter 634 whose output on line 622 drives the control input of current mirror circuit 635 and also drives the gates of PMOS pass transistors 629 and 630. Current mirror 635 has a first output on line 623 which is also line VCVPFF power line of the columns latches block 88-i and a second output on line 631 which is also the VCVP line of the remaining circuits of the EEPROM chip 10 that require high voltage for operation. PMOS transistor 630 has its drain connected to the VCC pad its source to the VCVP line through line 631 and its bulk terminal is connected to the VPP line. PMOS transistor 629 has its drain connected to the VCC pad its source to the VCVPFF line through line 623 and its bulk terminal is connected to the VPP line.

In FIG. 36 high voltage inverter 633 includes NMOS transistor 614 whose drain is connected to the input of the inverter on line 613, its gate is connected to the VCC line and its source is connected to line 615. Line 615 connects to the gate of pull-up PMOS transistor 617 whose source and bulk connects to the VPP line and its drain connects to the output of the inverter on line 619. NMOS transistor 616 has its drain also connected to line 619 and its source is connected to the VSS ground line. Feedback PMOS transistor 618 has its gage connected to line 619, its drain to line 615 and its source to the VPP line. CMOS inverter 634 includes PMOS pull-up transistor 621 whose drain connects to output line 622, its gate connects to the input line 619 and its source connects to the VPP line. Inverter 634 also includes NMOS pull-down transistor 620 whose gate connects to line 619, its source connects to the VSS line and its drain connects to its the output line 622.

Still referring to FIG. 36, current mirror 635 includes NMOS transistor 624 whose gate connects to control line 622, its source connects to the VSS line and its drain connects to line 625. Line 625 also connects to the gates of PMOS transistors 626, 627 and 628 and to the drain of transistor 626. The source and bulk of transistors 626, 627 and 628 connect to the VPP line. The drain of transistor 627 connects to line 631 which is also the VCVP line. The drain of transistor 628 connects to line 623 which is also the VCVPFF line.

The operation of the power switch circuit 600 will now be described. Upon supply of power to the EEPROM chip 10 the VSS pad receives 0 volts, the VCC pad receives 5 volts and the VPP pad receives 12 volts. These VSS, VCC and VPP pad voltages are delivered to the circuits of the EEPROM chip 10 on lines VSS, VCC and VCVP respectively. The high voltage of 12 volts for the VPP line may be generated internally within the EEPROM chip 10 by a charge pump or a voltage multiplier by multiplying the 5 volts of the VCC line, as is well known in the art. In the case of internally generated VPP voltage, the VPP pad is not needed, and so the saving of one pad of the integrated circuit and a saving of a 12 volts external power supply is materialized.

During read operation mode the voltage of the VPP pad is held at 5 volts and the signals on lines PWRCNT-P and PWRCNT-E are "low" and so is the signal on line 613 of the power switch circuit 600. The "low" on line 613 is inverted by inverter 633 to a "high" on line 619 and then inverted again by inverter 634 to a "low" on line 622 which is the control input of current mirror 635. The "low" on line 622 turns off transistor 624 so that no current flows through transistor 626. Since transistors 627 and 628 gate source voltage mirrors that of transistor 626, no current will flow through them to the VCVP or VCVPFF lines. The "low" on line 622 turns on transistors 629 and 630 and the VCC voltage of 5 volts to pass from the VCC pad to the VCVP line or the VCVPFF line. The fact that transistors 627 and 628 do not conduct current when transistor 624 is off, prevents current flow between the power supply sources of the VCC and VPP pads.

During program operation or erase operation modes the voltage of the VPP pad is held at 12 volts and the signals on lines PWRCNT-P or PWRCNT-E go "high" for periods of time as was illustrated in FIGS. 30, 32 and 33. During these periods of times line 613 is at "high" state of 5 volts and line 622 is at "high" state of 12 volts due to the VPP pad voltage. The 12 volts on line 622 turns off transistors 629 and 630 and turns on transistor 624 which pulls down line 625 to VSS voltage. When line 625 is pulled down it turns on PMOS transistors 626, 627 and 628 and current flows from the VPP pad to the VCVP and VCVPFF lines through transistors 627 and 628 respectively. As known in the art, if transistor 627 of a current mirror has the same channel length and channel width then they will conduct the same amount of current. However if transistor 627 has the same channel length as that of transistor 626 but its channel width is ten time wider than that of transistor 626 is will conduct ten times the amount of current that flows through transistor 626. That is to say, the amount of current that flows through transistor 627 is a multiple of the current that flows through transistor 626. For a given channel length this multiple is determined by the ratio of the width of transistor 627 over the width of transistor 626. This is also true for the relationship between the currents of transistor 628 and transistor 626 and is used to limit the maximum current that flows from the VPP supply source to the VCVP and VCVPFF lines.

The width of transistor 628 is designed so that the current to line VCVPFF from its drain is sufficient for simultaneous programming of all the memory cell that are connected to the column latches 830. For example for the array of 512 columns and 256 column latches 830 where each memory cell requires one microampere of drain current for programming, the current drive of transistor 628 should be 256 microamperes plus the current required to charge the capacitive load due to interconnects and junction diffusion area from 5 volts to 12 volts. The width of transistor 627 is designed so that the current to line VCVP from its drain is sufficient to charge the capacitive load due to interconnects and junction diffusion area from 5 volts to 12 volts.

A reason for using this power switch circuit is in order to prevent disabling of the many decoding circuits of the EEPROM chip during testing if a short circuit or other ohmic shorts, that are introduced because of contamination during manufacturing, bring the voltage of power supply lines to ground. For example the power supply to the column latch circuits which indirectly supplies high voltage to the bit-lines of the array of memory cells is connected to a separate branch of the current mirror so as to prevents any ohmic shorts within the array from lowering the power supply voltage and causing malfunction of the periphery circuits of the EEPROM chip. As known in the art redundancy techniques may be used to open the particular ohmic short and enable the use of the remainder of the memory array.

A SECOND EMBODIMENT OF THE INVENTION

The second embodiment employs all the circuits of the first embodiment, but with the addition of a new circuit block named cell-polarity-adapter 270, which interfaces between the control inputs of the cross-point switch 27 and the Least-Significant-Bit of the row address XLSB.

Figure 37:
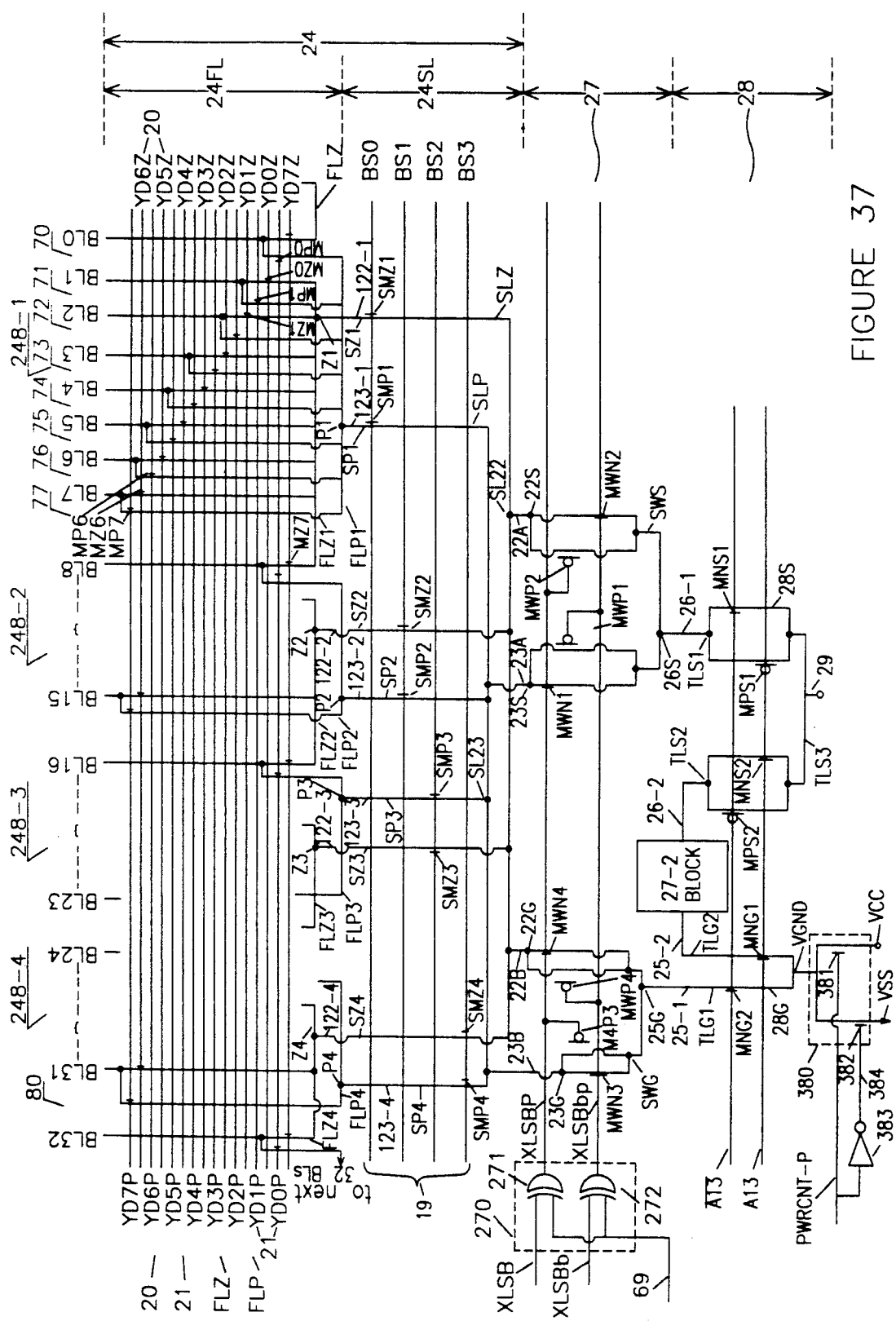
FIG. 37 is a circuit diagram of the bit-line select multiplexer and cross-point-switch of one memory array section, and the circuit diagram of the section select multiplexer for two memory array sections according to the second embodiment of the present invention.

The second embodiment of the invention will be described in reference to FIG. 37. In FIG. 37 the control of the cross-point-switch 27 comes on lines XLSBp and XLSBbp. Lines XLSBp and XLSBbp are the data output line of a cell-polarity-adaptor block (CPA) 270. The CPA block 270 also has two data input lines that connect to the XLSB address line and its complement on the XLSBb line and a control input line 69 that comes from the mode driver blocks 60 of the EEPROM chip 10.

The CPA block 270 is used in this embodiment to take advantage of the asymmetry of the memory cells 100, to improved the long term reliability of the EEPROM chip 10 by reducing the chance of parasitic and undesired programming that may occurs due to the soft-write phenomenon of floating gate memory cells that program by hot-electron injection from the substrate to the floating gate.

The soft-write problem occurs during the read mode of operation to a selected memory cell 100 with a low threshold voltage (unprogrammed cell). An example in reference to FIG. 7 will simplify the explanation. If cell 100 on row 84 and column 70 is selected for reading and it has a low threshold voltage of about 0.8 volts, it will conduct current between its drain and source. This current is typically supplied by the column pull-up transistor that is connected to each bit line. In the first embodiment and in most prior art implementations of a memory architectures using split-gate transistors, the drain 103 connects to the high voltage for programming and the drain 103 also connects to the sense amplifier for sensing and reading while the source 104 connects in both cases to a lower voltage than that of the drain. This forces the designer of the chip to bias the drain 103 of the transistor 100 at about 1.5 volts or lower during read mode to prevent the soft-write problem, and the source 104 to be biased at 0 volts. Biasing the drain 103 at a higher voltage will cause higher cell read current and a stronger electric field in the direction which favorable for programming. Therefor in order to avoid slow change of the threshold voltage of the cell 100 during a long period of time the voltage on the drain is held under 1.5 volts. This low voltage biasing of below 1.5 volts on the drain 103 also makes sense amplifier design difficult since any ground bouncing due to voltage transitions on the data pads Di may interferes with the operation of the sense amplifier 40. This causes long periods of product characterization and qualifications of the EEPROM chip 10 which translate to lost revenue.

Therefor in application where there is a need to improve noise margins and reduce time to market of new memory products, it will be desirable to bias the bit line that connects to the memory cell 100 and to the sense amplifier 40 at a voltage higher that 1.5 volts, for example 2.5 to 3.0 volts when a 5 volts power supply voltage VCC is used, and at the same time avoid the soft-writ problem.

As mentioned above the CPA block 270 is used in this second embodiment to take advantage of the asymmetry of the memory cells 100, so that during the read mode the memory cell 100 is biased such that its source 104 is connected to the sense amplifier 40, its drain 103 is connected to the VSS voltage and its control gate 102 is biased at 5 volts. This is accomplished even so during programming the memory cell 100 still receives the high programming voltage on its drain 103 and control gate 102 and its source is biased as in the first embodiment at VCC-Vtn. This is implemented by using a signal from the mode select block 601 of FIG. 28 to control whether signals with the true phases of the XLSB bit and its complement XLSBb connect to the control inputs of cross-point-switch 27 or whether signals with inverted phases will connect to the control inputs XLSBp and XLSBbp of the cross-point-switch 27.

A circuit that performs the function of the CPA block 270 is illustrated in FIG. 37 and it comprises the two CMOS Exclusive OR (EXOR) gates 271 and 272. Both EXOR gates receive one input from line 69 that carries a "low" logical state during the Program mode of the EEPROM chip 10. The second input of EXOR gate 271 connects to the XLSB line and the second input of EXOR line 272 connects to the XLSBb line. During program mode the EXOR gate do not invert an so signals with true phases of XLSB and XLSBb lines drive the XLSBp and XLSBbp lines, the routing of the bit lines through the cross-point-switch 27 is accomplished as was described above in reference to the first embodiment. However during the read mode, the signal on line 69 is "high" and so the EXOR gates 271 and 272 invert in which case signals with inverted phases of XLSB and XLSBb lines drive the XLSBp and XLSBbp lines. The routing of the bit lines through the cross-point-switch 27 is performed so that a selected cell 100 has its source routed to the sense amplifier and its drain routed to the VSS line.

Another advantage of this embodiment is that the circuit that is needed to generate the voltage reference Vref1 for the column pull-up transistors may not be used, since the gates of the NMOS pull-up transistors 801-i and 802-i may now be connected directly to the VCC line. In both embodiments however, the size of these pull-up transistors 801-i and 802-i must be small enough so that the data-in block 41-1 may pull the bit lines to VSS voltage when its so required.

Figure 38:
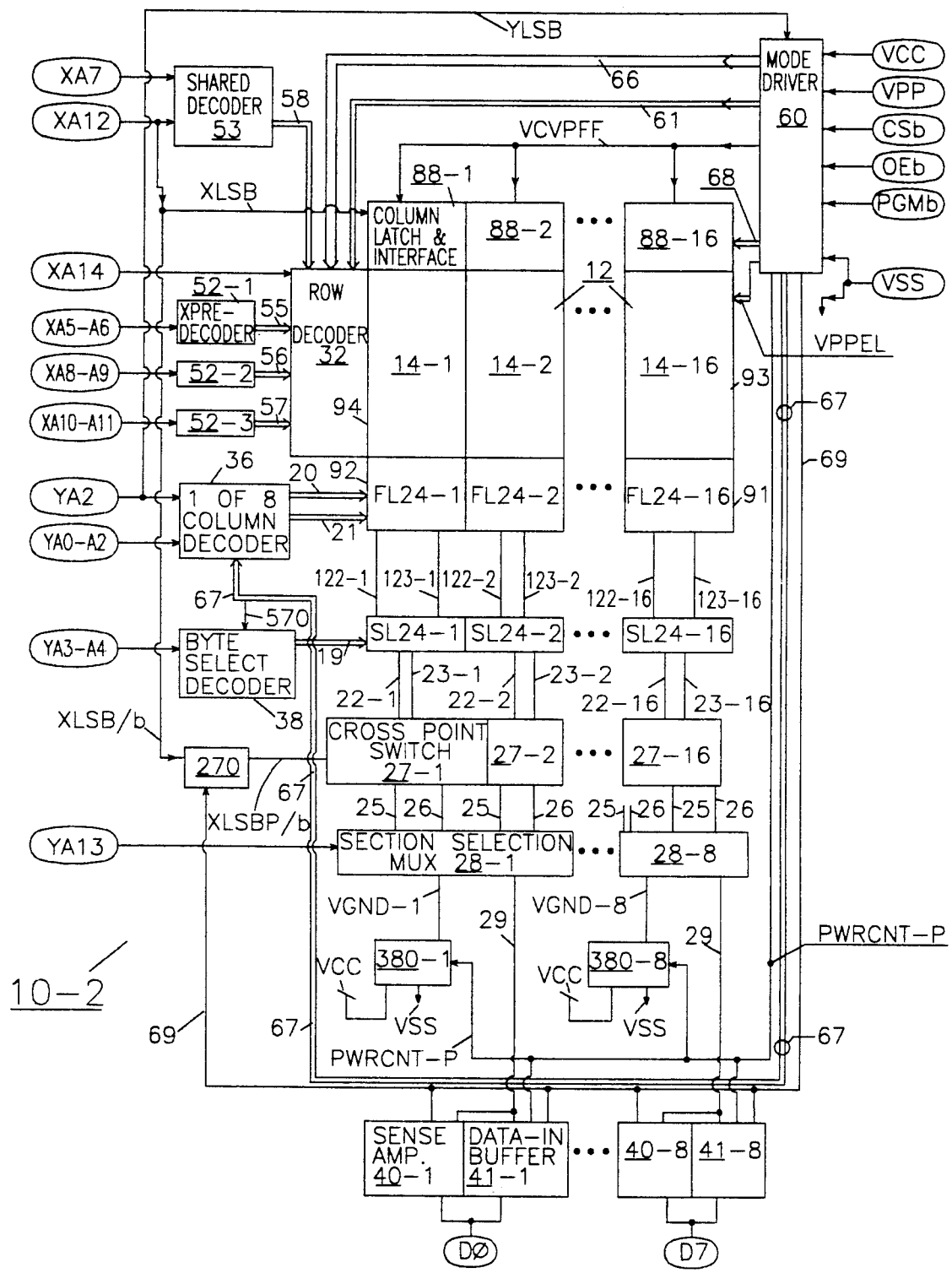
FIG. 38 is a block diagram of the EEPROM chip according to the second embodiment.

FIG. 38 illustrates the incorporation of CPA block 270 into the EEPROM chip 10 of FIG. 1 in order to form the second embodiment of the invention EEPROM chip 10-2.

Those skilled in the art will realize that other circuits may perform the function of the CPA block 270. One such circuit is a cross-point-switch, similar to cross-point-switch 27, that will receive its control input from line 69 and the complement of line 69. The data inputs and the data outputs to such a router will be those of the CPA 270 of FIG. 37.

Yet another circuit may simply replace each of the EXOR gates 271 and 272 with an inverter that has a CMOS transmission gate connected between the input and the output of the inverter as is known in the art. The inverters will invert the XLSB and XLSB signals if needed and the PWRCNT-P signal will control the conduction through the CMOS transmission gates.

A THIRD EMBODIMENT OF THE INVENTION

The third embodiment is used to store analog data in the memory array 12 and also to read analog data from the memory array 12. This is accomplished by taking advantage of the ability of the architecture of the second embodiment during the read mode of operation to apply the full power supply voltage of 5 volts to the source of a selected transistor and 0 volts to its drain while avoiding the soft-write parasitic programming that was discussed above.

Figure 39:
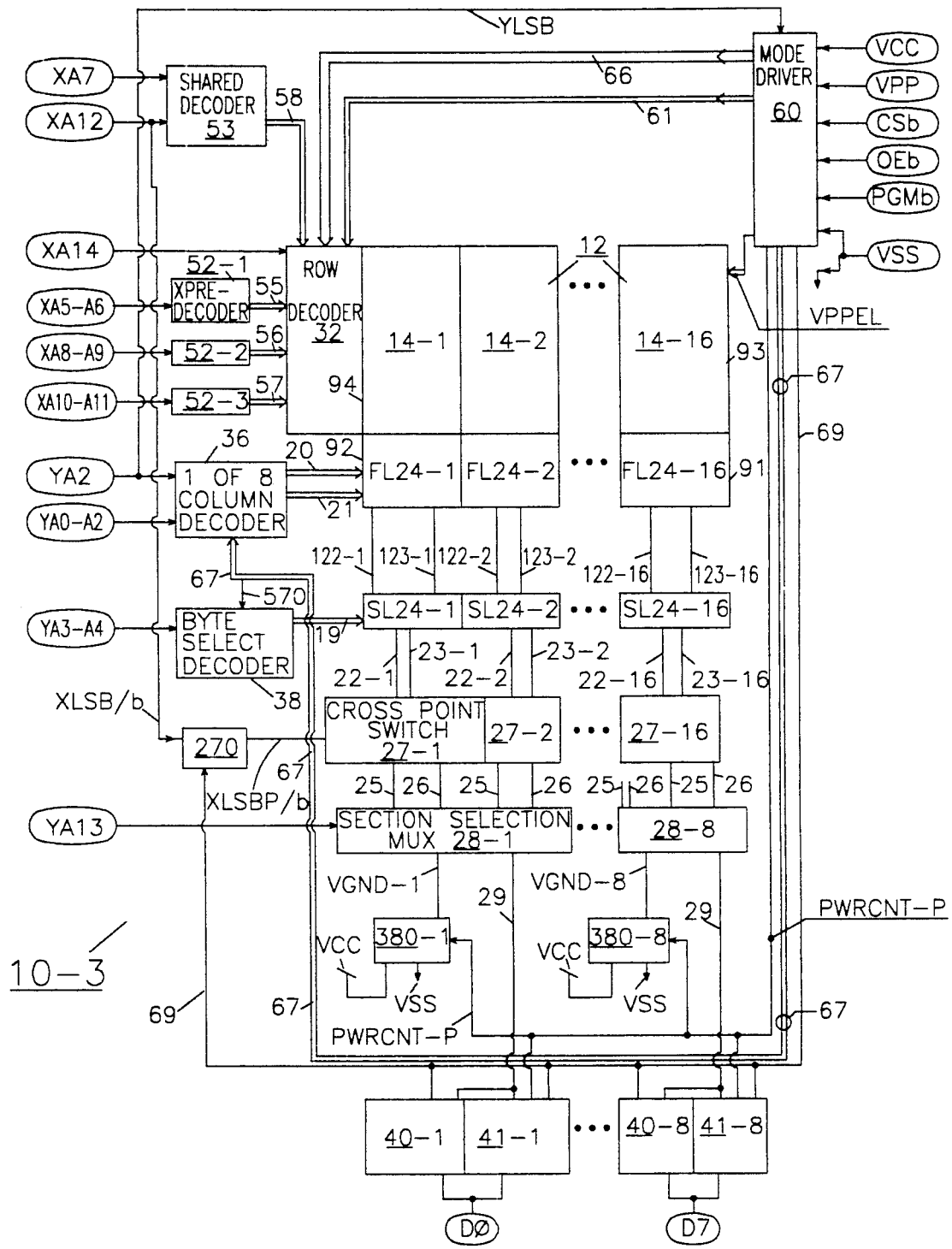
FIG. 39 is a block diagram of the EEPROM chip according to the third embodiment that stores analog data.

The third embodiment will be discussed in reference to FIG. 39 which is a modification of FIG. 38. In FIG. 39 the EEPROM chip 10-3 is shown. The EEPROM chip 10-3 accepts digital data for address and control inputs but it accepts analog data for data input. As in FIG. 1, the only data input pads are D0-D7 and the remaining pads are used for address and control. In FIG. 39 the column latches 830 and the LTRC circuits 831 (FIG. 24) are eliminated and also bus 68 is eliminated. The signal processing means 40-i are not sense amplifiers that are used for sensing binary information, and the signal processing means data-in blocks 41-i, do not include a chain of inverters. The new circuit elements for blocks 40 and 41 will be detailed below. The drive circuits in the column decoder block 36 that connect to bus 20 and bus 21 are modified so that VPP voltage level can be supplied to the control inputs of the first level multiplexers FL24. The drive circuits in the byte-select decoder block 38 that connect to bus 19 are modified so that VPP voltage level can be supplied to the control inputs of the second level multiplexers SL24-i. The output of the CPA block 270 is modified so that VPP voltage level can be supplied to the control inputs of the cross-point-switches 27-i. Also the address buffer of address bit A13 is modified so that VPP voltage level can be supplied to the control inputs of section selection muxes 28-i. In addition line 570 in byte-select decoder block 38 (FIG. 13) is disconnected from bus 67 and instead it is connected to the VCC line permanently so as to enable the NAND gates 562, 563, 564, and 565 for this third embodiment.

Figure 40:
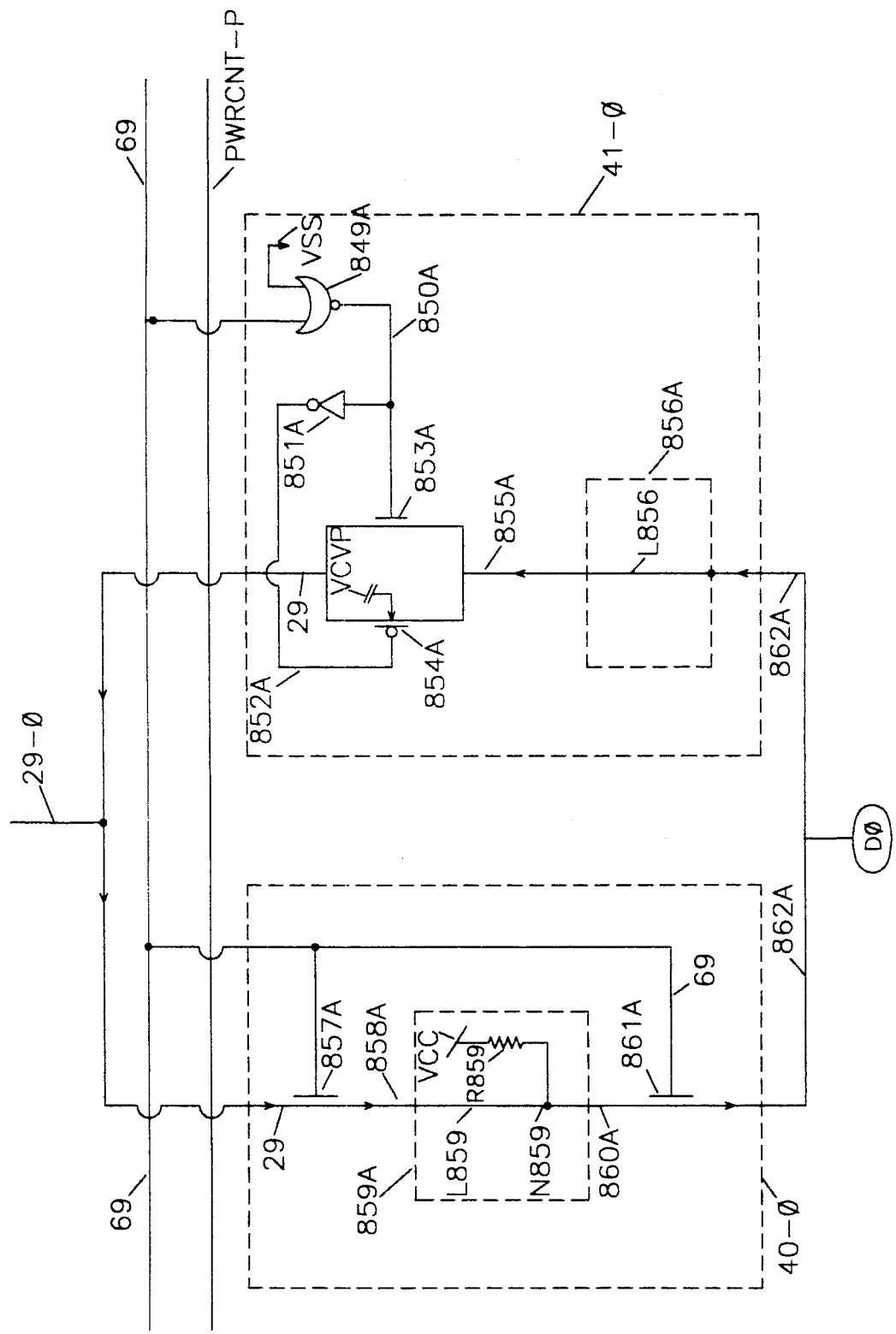
FIG. 40 is illustrates the input-output signal processing means according to the third embodiment.

The circuits for the signal processing mean 40 and 41 are shown in FIG. 40. In block 41 one input of NOR gate 849A was disconnected from the PWRCNT-P line and now it is connected to the VSS line to provide a "0" logical state. Also the substrate of PMOS transistor 854A is connected now to the VCVP line.

As shown the circuit element that formes the data input circuit 856A is a conductive lead L856 that connects between line 862A and the line 855A. It is preferred that lead L856 will be formed of a metal layer such as Aluminum in order that its resistance will not significantly attenuate the analog signal that will be applied to input-output pad D0. As is known all materials that are use in the semiconductor manufacturing to form conductors cause attenuation. The circuit that formes the data-out circuit 859A includes the lead L859 and the resistor R859. The resistor R859 connect on one end to the lead L859 at node N859 and on the other end to the VCC supply line. Resistor 859 can be made of polysilicon. Lead L859 connects between line 858A and the line 860A.

In order to store analog information on the floating gate 101 of memory cell during the fixed programming period Tpg, the value of the charge that is stored on the floating gate has to changed in small amounts so as to change the current conduction of the memory cell transistor 100 in small but measurable amounts. In the embodiments of the present invention the transistor 100 is an N-channel and therefor excess charge of electrons on the floating gate increases the effective threshold voltage of the transistor 100 and thereby reduces its drain to source and source to drain current. The different charge values may be quantified so as to represent binary logical information. For example in order to store a byte of 8 bits in one memory cell 100, one of 256 charge levels must be stored in the memory cell 100 and then read out and converted to digital information by an 8 bits Analog to Digital converter. On the other hand it is possible to store analog information that does not represent digital data, but some other waveform such as sound. In the case of sound recording the tolerance of the accuracy can be more relaxed than that of recording of multi-bit digital information in a single cell 100. However in both cases it is desired that the maximum allowable voltage across the memory transistors 100 drain to source or source to drain, which is basically the voltage across the two selected bit lines of a selected column, be as large as possible in order to make it easy for an Analog to Digital converter or other signal processing means to differentiate between the voltages across the selected bit lines that represent consecutive charge values in a given scale of measurement. For this reason it is important that the present invention allows the application of more that 4 volts Vds on a memory cell 100 during read operations. For example if 8 bits are stored in memory cell 100 and the cell 100 is routed to the signal processing means 40 so that its drain 103 is routed to line 29 and its source 104 to VSS (as in FIG. 9), and if only about 1 volt of maximum Vds is applied between the bit lines in order to avoid the soft-write reliability problem, the voltage difference between two of the 256 consecutive states is only 1/256 volts. However if the routing scheme of FIG. 37, which is preferred for the third embodiment, is used then 4 volts Vsd can be applied between the source 104 and the drain 103 and the drain 103 is routed to the VSS line and the source 104 is routed to the signal processing means 40 then 4/256 volts will be the voltage difference between two consecutive states. It is clear that it is much easier to sense or convert with reduced errors a signal with magnitude of 4/256 volts than 1/256 volts.

The programming operation of the EEPROM chip 10-3 of FIG. 39 of the third embodiment will now be described in reference to FIGS. 32 and 40. Since there are no latches 830 employed in chip 10-3 the data is provided to the memory array 12 directly from the input-output pads D0-D7. During the period LLT the address is selected so that one memory cell 100 in each array section 14 is connected with its drain to its associated line 29 and the data on pads D0-D7 is held at 0 volts. Thereafter, during the Tpg period the correct voltage between 6 and 9 volts is applied to the pad Di in order to achieve the desired charge value. The lower programming voltage of 6 volts is the voltage that if connected to the drain of the selected transistor 100 will caused drain to source current that is sufficient for programming. This is because the threshold voltage of the memory cell 100 is about 1 volt and is added to the source voltage of VCC-Vtn which is about 4 volts to arrive at 5 volts. The higher voltage of 9 volts is determined by subtracting the Vtn of the transistors in the muxes 24 from the VPP voltage of 12 volts.

The voltage of pads Di is disconnected from the pads Di at the end of the Tpg period and connected again at the beginning of the LLT period. In order to read the data according to the third embodiment, the source 104 of the memory cell 100 is routed to line 29 and the voltage that develops on node N859 is read out on pad Di as the stored state in the memory cell 100. A fully conducting cell 100 will pull node N859 low to about 0 volts but a fully programmed cell 100 (non-conducting) will cause resistor R859 to pull node N859 to the VCC voltage of 5 volts. Since line 69 is "high" during read mode, pad Di will sense between VCC-Vtn and 0 volts.

By addressing one memory cell 100 after the other in sequence a complete waveform can be retrieved from each array section 14 to the corresponding pads Di.

In the case where 256 charge states are stored in each cell an Analog to Digital converter outside the EEPROM chip 10-3 can be connected to each pad Di and the stored analog information can be converted to 8 digital bits thereby multiplying the storage capacity by eight folds.

The page and flash erase modes are performed as in the first embodiment.

A FOURTH EMBODIMENT OF THE INVENTION

The forth embodiment is used to store analog data in the memory array 12 and also to read digital data from the memory array 12. This is accomplished by taking advantage of the ability of the architecture of the second embodiment during the read mode of operation to apply the full power supply voltage of 5 volts to the source of a selected transistor and 0 volts to its drain while avoiding the soft-write parasitic programming as was discussed above.

The signal processing means 41 of this embodiment is also a conducting lead L859, as was used in the third embodiment.

Figure 41:
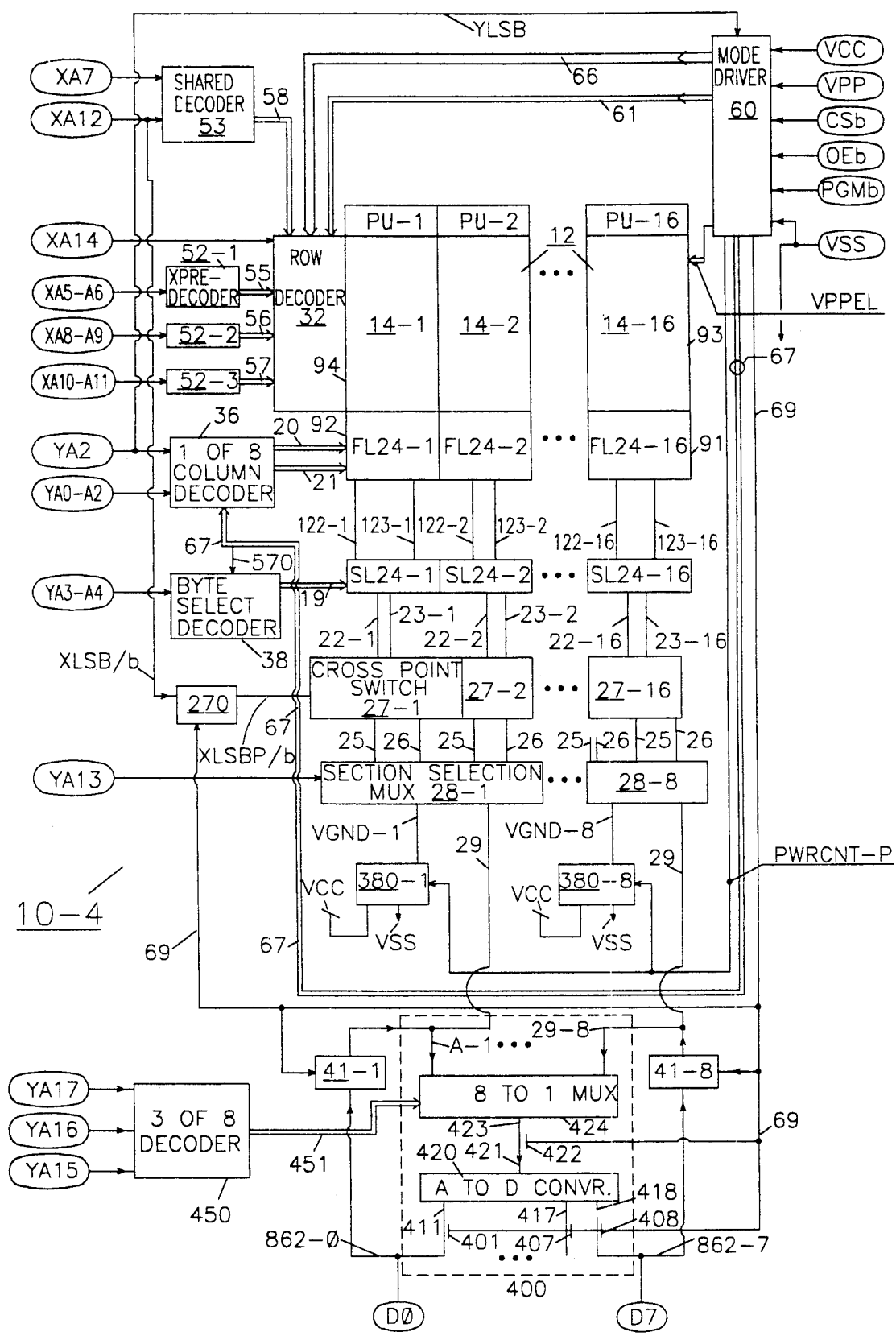
FIG. 41 is a block diagram of the EEPROM chip according to the fourth embodiment that stores analog data.

FIG. 41 illustrates the EEPROM chip 10-4 of the fourth embodiment which intends to bring into the EEPROM chip 10-3 of the third embodiment the ability to convert the analog data that is stored in the cells 100 into digital data and present it at the output pads D0–D7. In effect this increases the memory density eight times, while increasing the chip physical area by a negligible amount in comparison to the chip size of a memory that stores only binary data in its memory cells 100.

As can be seen in FIG. 41 the signal processing means 40 that were dedicated to each input-output pad were removed and instead a signal processing block 400 which is common to all of the input-output pads is used. Also three column address bits YA15, YA16 and YA17 and their pads, and a 3-to-8 decoder 450 are added to the chip 10-4 so that all the memory capacity can be address digitally. Also were added here are column pullup blocks PU-1 to PU-16 that include the column pullups NMOS transistors 801 and 802 with their gates and drains connected to the VCC line and with each their sources connected to a dedicated bit line.

Signal processing block 400 includes an 8-to-1 analog multiplexer (mux) 424, which is formed of NMOS transistors as was done for the first-level mux FL24. Mux 424 receives its control inputs from the decoder 450 through eight bit bus 451. The data inputs of mux 424 come from lines 29-1 to 29-8 of eight bit bus 29 and its output connect to line 423.

Signal processing block 400 also includes an eight-bits Analog-to-Digital (A/D) converter 420 connects to line 412 and whose eight outputs connect to lines 411 to 418 (not all shown). The A/D converter 420 must be able to function with only one power supply voltage of 5 volts in order to make the chip 10-4 operable during the read mode of operation with other commonly used chips that are manufactured in the semiconductor industry. It is also preferred that the A/D converter 420 will be compatible with a CMOS process that is used in the other circuits of the present embodiment in order to reduce manufacturing cost.

One such circuit is disclosed in a paper titled "An 8-bits Two-Step Flash A/D Converter for Video Applications", by A. Cremonesi, et al., published in the proceeding of IEEE, 1989 Custom Integrated Circuits Conference and is incorporated herein by reference.

The other element in block 400 is NMOS transistor 422 that has its drain connected to the output of mux 424 on line 423 and its source connected to the input of the A/D converter 420 on line 421. The gate on transistor 422 connects to line 69 which is held "low" during programming as was described in reference to the first embodiment. When line 69 is "low" transistor 69 is turned off thereby preventing any high voltage that arrives from data-in block 41-i during programming from reaching the inputs of the A/D converter 420.

The programming operation of the forth embodiment is conducted as was described above in reference to the third embodiment. The page and flash erase are performed as was described above in reference to the first embodiment.

During the read operation the NMOS column pullup transistors 801 and 802, that are located in pullup blocks PU-1 to PU-16, together with the selected memory cell bias the bit line that connects to the source of the transistor 100 at a voltage that represent one of 256 voltage levels. The data of eight cells 100 reach bus 29 and the input of mux 424, however bus 451 select only the analog data of one cell 100 to pass to the A/D converter 420 which converts it to digital data that drives lines 411 to 417 and from there the eight output pads D0–D7.

A FIFTH EMBODIMENT OF THE INVENTION

The fifth embodiment is used to store quantified digital input-pad data as an analog data in the memory array 12 and also to read analog data from the memory array 12 and present digital data at the output-pads. As was shown in the fourth embodiment the input and output pads are common.

Figure 42:
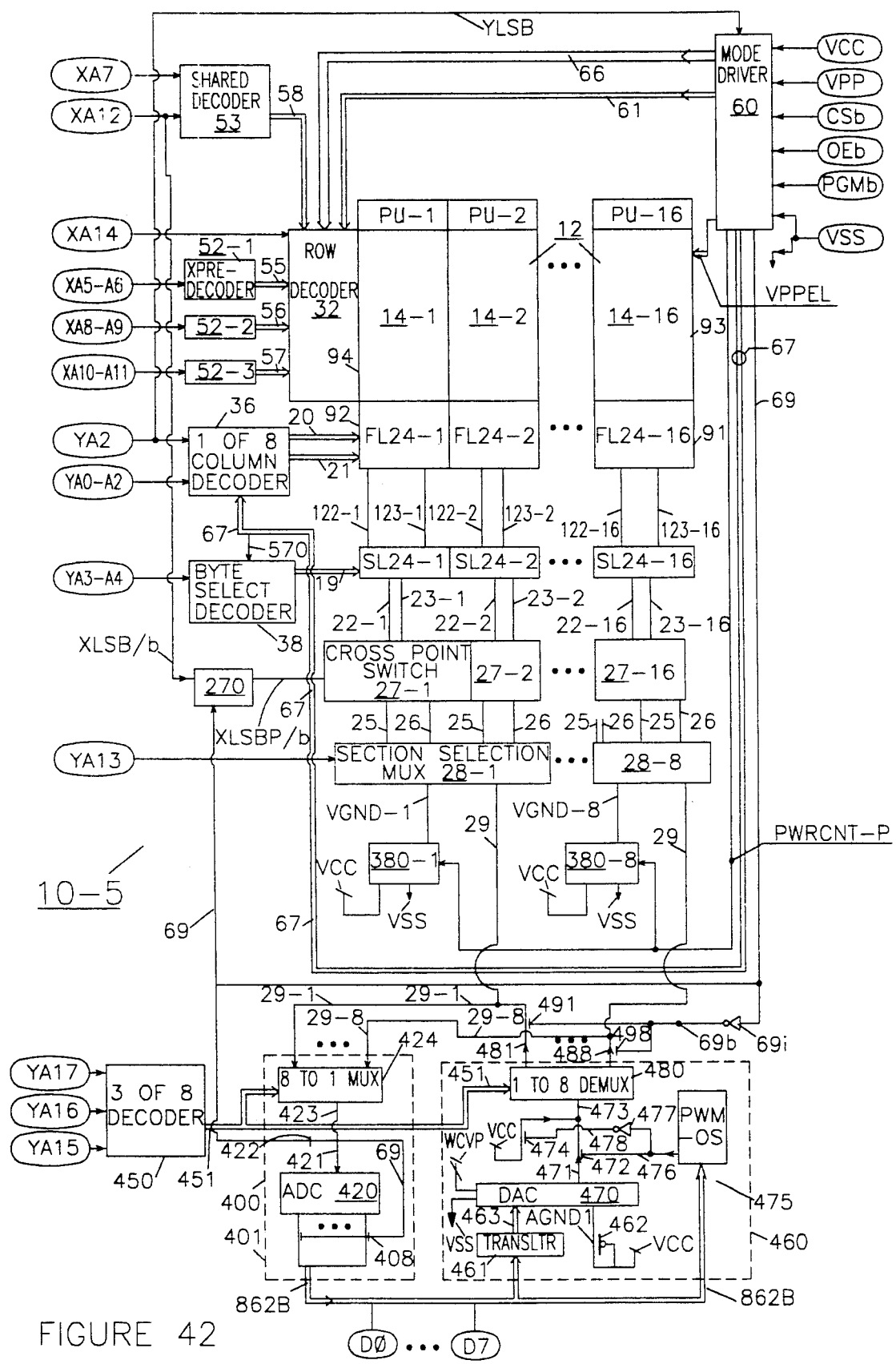
FIG. 42 is a block diagram of the EEPROM chip according to the fifth embodiment that stores analog data but performs digital read and write operations.

This is accomplished by using a digital-to-analog (DAC) converter in the input path and an analog-to-digital (ADC) converter in the output path as shown in reference to the EEPROM chip 10-5 of this fifth embodiment that is illustrated in FIG. 42.

As shown in FIG. 42 the eight data-in signal processing means 41-0 41-8 are removed and instead a common input signal processing means 460 is used to convert the digital signal at the input pads to an analog signal that represents one of 256 voltage levels that cause the memory cell 100 to store one of 256 charge levels on it floating gate 101. The output signal processing means of this fifth embodiment is the same A/D converter 420 that was used in the fourth embodiment.

In FIG. 42 the data-input signal processing means 460 includes the digital-to-analog converter (ADC) 470 that receives the digital data-input on bus 463 that comes from a voltage level translator 461. The translator 461 receives the data-input of the chip 10-5 from the input-output pads D0-D7 through input-output bus 862B. The ADC 470 has three power supply lines, a ground line that is the VSS line of the chip 10-5, a positive supply line VCVP that is receiving the VPP voltage of 12 volts during programming and a middle voltage supply line AGND1 that connects to the source of PMOS 462. PMOS transistor 462 is connected in a diode configuration and its gate and drain are connected to the VCC line of the chip 10-5. The output of DAC 470 is connected to line 471.

Signal processing means 460 also includes a 1-to-8 demultiplexer (de-mux) 480 that has one data input 473 and eight data outputs 481-488. The de-mux 480 also has eight control inputs that connect to bus 451. As described above in reference to the fourth embodiment, bus 451 comes from the address decoder 450. NMOS transistor 472 has its drain connected to the output of DAC 470 and its source connected to the input 473 of de-mux 480. The gate of transistor 472 connect to high voltage line 476 which is the output of pulse-width-modulated-one-shot (PWM-OS) circuit 475. The output signal of the PWM-OS circuit 475 is inverted by high voltage CMOS inverter 477, which has the same circuit of inverter 560 of FIG. 12 and whose output on line 478 connects to the gate of NMOS transistor 474. The drain of transistor 474 connects to line 473 and its source connects to the VCC line of the chip 10-5. PWM-OS circuit 475 received its input from the data input-output bus 862B.

The circuit of the de-mux 480 is similar to that of the FL24 muxes described in reference to the first embodiment, that is an analog mux formed of NMOS pass transistors.

The circuit for the voltage level translator 470 is the same for each one of the eight data-in lines of bus 862B. Each line of bus 862B drives a chain of CMOS inverters that drive one high voltage CMOS inverter whose output connects to one line of bus 463. The circuit for the one high voltage inverter is the same as inverter 560 of FIG. 12. This is done while the bit position of the data-input from pads D0-D7 is retained in both busses 682B and 463. For example pad D0 connects to line 862B-0 which connects to a chain of CMOS inverters that drive one high voltage inverter whose output connect to line 463-0 of bus 463, and similarly pad D7 connects to line 862B-7 which connects to a chain of CMOS inverters that drive one high voltage inverter whose output connect to line 463-7 of bus 463. The level of the signals on bus 862B is typically between 0 volts and 5 volts, but the level of the signals on bus 463 is between 0 volts and 12 volts since the last inverter in the chain has its positive power supply line is connected to the VCVP line which receives 12 volts during programming.

The circuits for the DAC 470 are similar to those of the DAC described in the paper "A Complete single Supply CMOS 12 Bits DAC", by Shinichi Hisano, et al., that was published in the proceeding of the IEEE 1989 Custom Integrates Circuits Conference and is incorporated herein by reference. It is to be understood that the DAC of the Hisano reference is scaled down for this embodiment to process only eight bits. Also instead of receiving supply voltages between 0 and 5 volts it will receive voltages between 6 and 12 volts in the following manner. The AVDD line of all the circuits of the Hisano reference will be connected to the VCVP line of the EEPROM chip 10-5. The AGND line of FIG. 3 of the Hisano reference will be connected to the VSS line of the chip 10-5. The ground line that connects to the collector of the PNP transistors Q1 and Q2 of FIG. 3 in the Hisano reference will be connected to the VSS line of the EEPROM chip 10-5. The AGND lines of all the other circuits of the Hisano reference will be connected to the AGND1 line of the chip 10-5 which is connected to the source of PMOS transistor 462. In FIG. 1 of the Hisano reference the TTL/CMOS blocks are removed, and also the CE line, the DB0-11 lines and the Latches block are removed. Instead the output of the translator 461 on bus 463 will drive the Control Logic block of FIG. 1 of the Hisano reference directly. The Control Logic of the Hisano reference is simply an address decoder as shown in FIG. 2 of the Hisano reference. The output of DAC 470 will swing between the voltage of line AGND1 of about 6 volts and about 8.6 volts and the voltage difference between the 256 analog states will be about 10 millivolts.

The function of the PWM-OS block 475 is to produce during programming one pulse on line 476, per analog level on line 471, that has a time duration that will cause the selected memory cell 100 to be programmed to a voltage threshold value that is on a linear curve that includes 256 threshold voltages corresponding to the 256 digital states at the data-input bus 862B. This linear curve must be a curve that is particularly fitted to the characteristics of the ADC 420, because ADC 420 will convert each of these 256 states into a corresponding one of 256 digital bytes to be output on bus 862B during the read operation.

In some embodiment there may be a need for the PWM-OS block 475 to prodce several pulses of fixed or varying widths in order to achieve a desired programmed Vt value in the selected memory cell 100.

Figure 43:
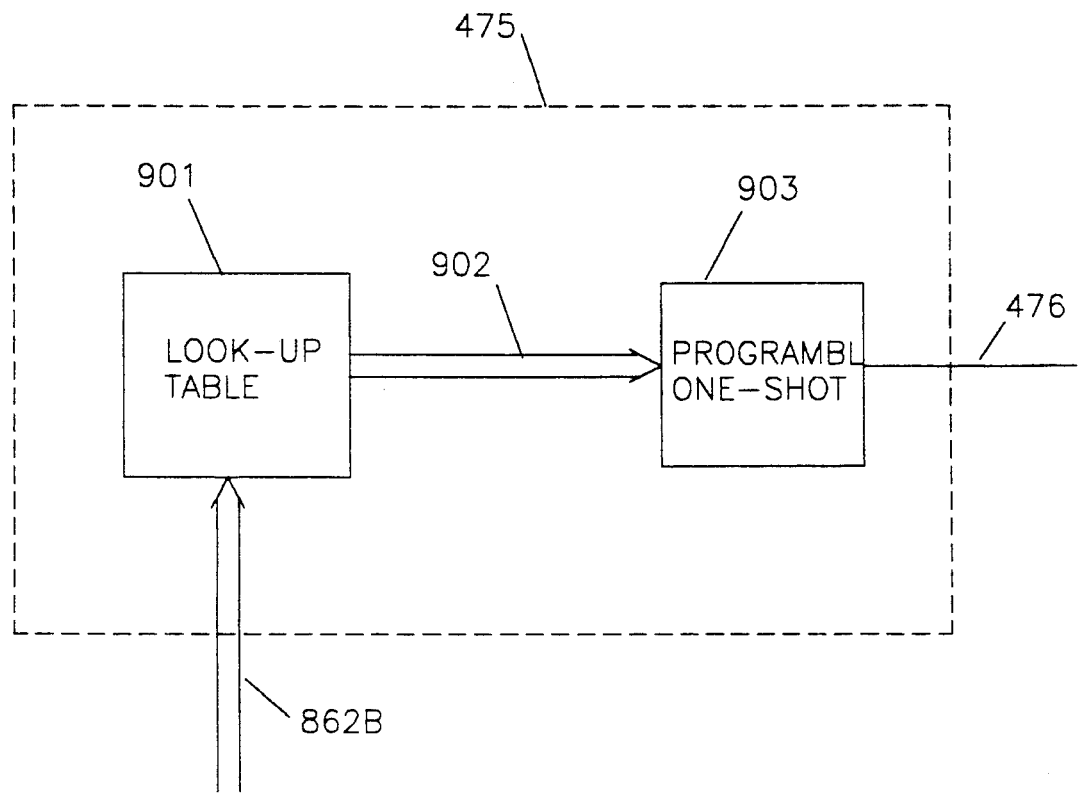
FIG. 43 is a block diagram of the pulse width modulated one shot that is used within the data-input signal processing means of the fifth embodiment.

The block diagram of the pulse-width-modulated one-shot (PWM-OS) block 475 is illustrated in FIG. 43. It includes a look-up table (LUT) circuit block 901 and a programmable one-shot circuit block 903. The inputs of the LUT block 901 connect to bus 862b and its output connect to bus 902 that drives the inputs of one-shot block 903. The output of one shot block 903 connect to line 476 and it produces signal levels from 0 volts to 12 volts.

The LUT 901 may be a Read-Only-Memory that stores binary information in its memory cells, and that receives its address bus from the data-input bus 862B and whose data output bus connects to bus 902. The LUT 901 stores parametric data that is specific to the electrical characteristics of the memory cells 100 of the array 12 of the particular chip 10-5. For example memory cell 100 that programs by hot electrons typically display exponential dependence of the threshold voltage as a function of the high voltage pulse duration on the drain. In other words for a given drain high voltage (assuming the control gate is at VPP) a relatively high threshold voltage is reached within a short time and there after additional increase in threshold voltage unit requires longer time. Therefor for a particular analog voltage level on line 471 the LUT 901 will produce a specific instruction, code or signal level on bus 902 that causes the programmable one-shot block 903 to produce a fitting pulse to the gate of transistor 472 that enables that voltage on line 471 to reach the memory transistor 100 of the array 12 only for the period of the fitting pulse.

The programmable one-shot block 903 may be formed of a programmable digital counter whose control inputs connect to bus 902 and whose clock input connects to a on-chip generated clock that is formed of resistor-capacitor oscillator as is known in the art. The driver of line 476 must be a high voltage inverter similar to inverter 560 of FIG. 12 in order to be able to turn off transistor 472.

Other circuit elements that are specific to this fifth embodiment are the NMOS transistors 491–498 that control the path between the eight outputs lines 481–488 od the de-mux 480 and bus 29. The drain of transistor 491 connects to line 481, its source connects to line 29-1 and its gate connects to line 69b. In a similar manner transistors 492–498 (not all shown) have their gates connected to line 69b. Line 69b is the output of high voltage inverter 69i that has the same circuit of inverter 560 of FIG. 12, and is the inverted signal of line 69 that is generated by the mode driver 60. During the programming operation the transistors 491–498 are turned on and during the read and erase operations they are turned off.

The programming sequence will be described in reference to the timing diagram of FIG. 32. The LLT period is eliminated and the entire period between Gt1 and Gt3 and the period between Gt4 and Gt6 is defined as the Tpg period in which high voltage is applied to the selected memory cell 100. Therefor the column and row addresses must be fixed during Gt1–Gt3 and Gt4–Gt6. Only one memory cell 100 can be programmed during a Tpg period according to the fifth embodiment.

At the end of the Tpg period and between the Tpg periods the output line 476 of the PWM-OS block 475 will be at 0 volts and therefor line 478 will be at VCC voltage of 5 volts. This causes line 473 to receive VCC-Vtn voltage which is routed to the drain of the selected memory transistor 100 which has its source already biased at VCC-Vtn through LV mux 380 and therefor prevents large voltage fluctuations on the bit lines and the output of the DAC 470 and contributes to a fast settling time of the output of DAC 470.

The page and flash erase operations are performed as in the first embodiment however each memory cell 100 stores one eight bits wide byte and erasure of a page constitute the erasure of 512 bytes which is 4096 logical bits.

There has been illustrated and described a nonvolatile memory chip that fulfills the objects and advantages set forth above; it should be understood that many changes, modifications, variations and other uses and applications will become apparent to those skilled in the art after considering the disclosure and the accompanying drawings For example although the Complementary MOS technology was used to form the peripheral circuits, other technologies alone or together can accomplish the functions of the circuit and logic blocks to make the EEPROM chip workable. Such technologies are NMOS circuits, Bi-CMOS circuits (which is a mix of Bipolar and CMOS transistors) and complementary Bipolar circuits.

Also the polysilicon word and erase lines may be coated with a deposited silicide such as TiN2 in order to reduce the sheet resistance and thereby reduce read access time.

In addition the line Vref1 that connects to the gate of the column pullup transistors 801-i and 802-i can be driven by an OR gate that receive as its inputs the outputs address transition detector (ATD) circuits that are assigned one to every address input pad. The OR gate of the ATD scheme will generate a short pulse that will cause the column pullups to charge the bit lines to a predetermined voltage and prepare the array for data sensing. This is a concept that is known in the art and may use an ATD circuit similar to the ATD circuit of FIG. 30.

Furthermore, the embodiments disclose above relate to a memory array that has plurality of array section where each section has a dedicated sense amplifier 40 and a cross-point-switch 27. It is also the purpose of the present invention that the array 12 may be formed of only one section 14, therefor the EEPROM chip 10 will include only one sense amplifier 40, only one data-in buffer 41, only one cross-point-switch 27 and only one data pad.

Therefor, any and all such changes, modifications, variations and other uses and applications that do not depart from the spirit and the scope of the invention are deemed to be covered by the invention, which is limited only by the following claims.

What is claimed is:

1. A memory array comprising:
   address receiving means;
   a signal processing means;
   a plurality of array sections each comprising a plurality of data storing memory cells arranged in a plurality of rows and adjacent columns;
   each of said columns having a first bit line and a second bit line, said at least one cell programmable to couple or to decouple said first bit line to said second bit line;
   column address circuitry operable to randomly address any selected one of said columns in each of said sections;
   row address circuitry operable to randomly address any selected one of said rows in each of said sections;
   for each of said sections a cross-point switch operable to route said first bit line to said signal processing means and to route said second bit line to a reference voltage when a given memory cell is randomly addressed; and
   said cross-point switch also operable to route said second bit line to said signal processing means and to route said first bit line to said reference voltage when said given memory cell is randomly addressed.

2. The memory array of claim 1 wherein said first bit line of said selected column functions as said second bit line of the adjacent column to its right side and said second bit line of said selected column functions as said first bit line of the adjacent column to its left side.

3. The memory array of claim 1 where each of said columns in said memory array is comprised of at least one memory cell displaying an asymmetry between the memory cell current that flows from said first bit line to said second bit line and the current that flows from said second bit line to said first bit line.

4. The memory array of claim 1 where each of said columns in said memory array is comprised of at least one split-gate memory transistor displaying an asymmetry between the drain to source current and the source to drain currents; and said transistor having its drain coupled to said first bit line and its source coupled to said second bit line.

5. The memory array of claim 1 operable so that plurality of bit lines that connect to the sources of said memory transistors along a selected row simultaneously coupled to a reference voltage thereby enabling the simultaneous programming of a plurality of memory cells.

6. The memory array of claim 1 operable so that;

plurality of first bit lines that connect to the drains of said memory transistors along a selected row couple to corresponding plurality of storage means; and plurality of second bit lines that connect to the sources of said memory transistors along said selected row simultaneously coupled to a reference voltage thereby enabling the simultaneous programming of a plurality of memory cells.

7. The memory array of claim 1 wherein said columns forming a plurality of memory cells arranged in a plurality of pairs of adjacent odd numbered column and an even numbered column and further comprising:

a storage means adjacent said rows and assigned to said each pair of columns; with said storage means operable to be coupled to only one bit line of one column of said pair at the time.

8. The memory array of claim 7 wherein said storage means is assigned by the control of the least-significant-bit of the column address.

9. The memory array of claim 7 wherein said storage means is assigned by the control of the least-significant-bit of the column address and by the control of least-significant-bit of the row address.

10. A non-volatile memory array comprising:

address receiving means;

a signal processing means;

a plurality of array sections each comprising a plurality of split gate memory cells each including a floating gate and having asymmetry between their drain to source current and source to drain current arranged in a plurality of rows and adjacent columns;

each column having a first bit line and a second bit line, said memory cells of even numbered rows connected with their drains to said first bit line and with their sources to said second bit line, and said memory cells of odd numbered rows connected with their drains to said second bit line and with their sources to said first bit line, said memory cells are operable to couple or to decouple said bit lines;

column address circuitry operable to randomly address a selected one of said columns in each of said sections;

row address circuitry operable to randomly address a selected one of said rows in each of said sections;

for each of said sections a cross-point switch operable to route said first bit line to said signal processing means and to route said second bit line to a first reference voltage when an even numbered row is selected for read operation;

said cross-point switch also operable to route said first bit line to a programming reference voltage and to route said second bit line to a second reference voltage when an even numbered row is selected for programming operation;

said cross-point switch also operable to route said second bit line to said signal processing means and to route said first bit line to said first reference voltage when an odd numbered row is selected for read operation; and said cross-point switch also operable to route said second bit line to said programming reference voltage and to route said first bit line to said second reference voltage when an odd numbered row is selected for programming operation.

11. The memory array of claim 10 further including control lines disposed over section of said floating gates, and each of said control lines shared between a pair of adjacent even numbered row and odd numbered row.

12. The memory array of claim 10 wherein said columns forming a plurality of memory cells arranged in a plurality of pairs of adjacent odd numbered column and an even numbered column and further comprising:

a storage means adjacent said rows and assigned to said each pair of columns; with said storage means operable to be coupled to only one bit line of one column of said pair at the time.

13. A non-volatile memory array comprising:

address receiving means;

a signal processing means;

a plurality of array sections each comprising a plurality of split gate memory cells each including a floating gate and having asymmetry between their drain to source current and source to drain current arranged in a plurality of rows and columns;

each of said column having a first bit line and a second bit line, said memory cells of even numbered rows connected with their drains to said first bit line and with their sources to said second bit line, and said memory cells of odd numbered rows connected with their drains to said second bit line and with their sources to said first bit line, said memory cells are operable to couple or to decouple said bit lines;

column address circuitry;

row address circuitry operable to randomly address a selected one of said rows in each of said sections;

for each of said sections a cross-point switch operable to route said second bit line to said signal processing means and to route said first bit line to a first reference voltage when an even numbered row is selected for read operation;

said cross-point switch also operable to route said first bit line to a programming reference voltage and to route said second bit line to a second reference voltage when an even numbered row is selected for programming operation;

said cross-point switch also operable to route said first bit line to said signal processing means to route said second bit line to said first reference voltage when an odd numbered row is selected for read operation; and said cross-point switch also operable to route said second bit line to said programming reference voltage and to route said first bit line to said second reference voltage when an odd numbered row is selected for programming operation.

14. The memory array of claim 13 further including erase lines disposed over erase section of said floating gates;
   said memory array operable to simultaneously erase data from plurality of adjacent memory cells that are associated with a selected row; and
   said memory array also operable to simultaneously erase data from plurality of rows of said memory array.

15. The memory array of claim 13 wherein said columns forming a plurality of memory cells arranged in a plurality of pairs of adjacent odd numbered column and an even numbered column and further comprising:
   a storage means adjacent said rows and assigned to said each pair of columns; with
   said storage means operable to be coupled to only one bit line of one column of said pair at the time.

16. The memory array of claim 1, 10 or 13 operable to read and write analog data.

17. A memory array comprising:
   a plurality of array sections each comprising a plurality of memory cells arranged in a plurality of rows and columns and plurality of columns forming a plurality of pairs of adjacent odd numbered column and even numbered column;
   each column having a first bit line and a second bit line, said at least one memory cell programmable to couple or to decouple said first bit line to said second bit line;
   a latch circuit exclusively associated with each one of said pair of columns;
   whereby said latch is operable to be coupled either to said first bit line of said even numbered column or to said first bit line of said odd numbered column within said associated pair, and said latch is operable in a manner that prevents exchange of data between said latch and pairs of said columns that are not associated with said latch.

18. A data storage means comprising;
   an input FET transistor coupled with its drain to an input line and its source to a storage node;
   a first inverter connected with its input to said storage node and its output to an output line;
   a second inverter including: (a) a first transistor with a first conductivity type channel, and (b) a second and a third transistors each with a second conductivity type channel;
   said first transistor and said third transistor having their gates connected to said output line;
   a clock input line connected to the gates of said input FET and said second transistor;
   said first transistor connected with its source to a first reference voltage and its drain to said storage node;
   said second transistor connected with its drain to said storage node and its source to a second node; and
   said third transistor connected with its drain to said second node and its source to a second reference voltage.

19. A power switch includes in a programmable non-volatile memory chip including:
   a VCC receiving means;
   a VPP receiving means;
   a VSS receiving means;
   a current mirror having a reference branch, a first output branch and a second output branch;
   a first FET transistor connecting said VCC means and said first output branch;
   a second FET transistor connecting said VCC means and said second output branch;
   said reference branch, said first FET and said second FET having a common control input;
   said power switch operable to supply VCC voltage to said first and second outputs during read operations of said memory chip; and
   said power switch operable to supply VPP voltage to said first and second outputs during write operations of said memory chip.

20. A non-volatile memory formed on a semiconductor substrate for storing analog signals comprising:
   address receiving means;
   a signal processing means;
   a memory array comprising a plurality of physical memory cells arranged in a plurality of rows and columns;
   column address circuitry;
   row address circuitry operable to randomly address a selected one of said rows; and
   a digital to analog converter operable to receive digital data and program analog data that has at least three logical states in each one of said physical memory cells of said memory array.

21. The memory array of claim 20 further comprising means for quantifying the programmed analog data to fit a curve.

22. The memory array of claim 21 wherein said means for quantifying further includes a storage means.

23. The memory array of claim 20 wherein said memory cells are writable by charge transport from a channel region of an FET to a floating gate of said FET.

24. The memory array of claim 20 wherein each of said memory cells include a floating gate and said memory array further comprising erase lines disposed over erase section of said floating gates;
   said memory array operable to simultaneously erase data from plurality of adjacent memory cells that are associated with a selected row; and
   said memory array also operable to simultaneously erase data from plurality of rows of said memory array.

25. An address decoder circuit for decoding the row address of an EEPROM including rows and columns of memory cells comprising:
   a word line driver having an input and an output that is coupled to a memory row;
   a mode select multiplexer having a first and a second control inputs, a first and a second data input and a data output coupled to said word line driver;
   a logical gate for selection having plurality of inputs coupled to row address lines and an output coupled to the first data input of said mode select multiplexer;
   said logical gate having power supply between a first reference voltage and a second reference voltage; and
   a phase feedback inverter whose input is coupled to the output of said logical gate and whose output is coupled to said second data input of said mode select multiplexer.

26. The decoder of claim 25 wherein said word line driver couples to an N-to-one multiplexer that is driving N word lines one at the time;
   said mux comprising:
   a) N transmission gates one for each word line;
   b) N control lines carrying a predecoded row address to said N transmission gates;

c) N FET transistors the drain of each coupled to a respective word line, the gate of each of said FET transistors coupled to a respective predecoded address line and the source of all said FET transistors coupled to a third reference voltage.

27. The decoder of claim 26 wherein said third reference voltage is operable:

to have substantially the same value of said second reference voltage during the reading and the programming of memory cells along a selected row; and to have the value of a fourth reference voltage during the page erase of memory cells along a selected row.

* * * * *